(12) United States Patent
Hara et al.

(10) Patent No.: US 6,927,419 B2
(45) Date of Patent: Aug. 9, 2005

(54) SEMICONDUCTOR DEVICE

(75) Inventors: Akito Hara, Kawasaki (JP); Nobuo Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 213 days.

(21) Appl. No.: 10/419,760

(22) Filed: Apr. 22, 2003

(65) Prior Publication Data

US 2003/0190777 A1 Oct. 9, 2003

Related U.S. Application Data

(60) Division of application No. 09/650,641, filed on Aug. 30, 2000, now Pat. No. 6,582,996, which is a continuation-in-part of application No. 09/327,572, filed on Jun. 8, 1999, now Pat. No. 6,255,148.

(30) Foreign Application Priority Data

| Jul. 13, 1998 | (JP) | 10-197316 |
| Dec. 7, 1998 | (JP) | 10-346879 |
| Aug. 31, 1999 | (JP) | 11-245323 |
| Jun. 14, 2000 | (JP) | 2000-178578 |

(51) Int. Cl.$^7$ ............................................. H01L 29/04
(52) U.S. Cl. ........................................ 257/64; 257/65
(58) Field of Search ............................. 257/64, 65, 66, 257/67, 70, 72, 74

(56) References Cited

U.S. PATENT DOCUMENTS

| 4,113,531 A | * | 9/1978 | Zanio et al. .................. 438/94 |
| 5,512,494 A | | 4/1996 | Tanabe .......................... 437/21 |
| 5,567,967 A | | 10/1996 | Kusumoto ................... 257/353 |
| 5,705,413 A | | 1/1998 | Harkin et al. ......... 437/40 TFT |
| 5,731,613 A | | 3/1998 | Yamazaki et al. ........... 257/350 |
| 5,808,318 A | | 9/1998 | Masumo et al. .............. 257/66 |
| 5,811,328 A | | 9/1998 | Zang et al. .................. 438/166 |
| 5,817,550 A | | 10/1998 | Carey et al. ................. 438/166 |
| 5,930,609 A | | 7/1999 | Young ......................... 438/166 |
| 6,025,218 A | | 2/2000 | Brotherton .................. 438/166 |
| 6,169,013 B1 | | 1/2001 | Voutsas ....................... 438/485 |
| 6,246,070 B1 | | 6/2001 | Yamazaki et al. ............. 257/40 |
| 6,337,236 B2 | | 1/2002 | Yamazaki et al. .......... 438/166 |

OTHER PUBLICATIONS

Kuriyama, H. et al., "High mobility polySi TFT by a new excimer laser annealing method for large electronics", Dec. 1991, IEEE, pp. 563–566.

Ishihara, R.; "Ultra large growth of Si films on glassy subtrate", Oct. 1995; IEEE; pp. 1956–1957.

* cited by examiner

*Primary Examiner*—David Nelms
*Assistant Examiner*—Thinh T Nguyen
(74) *Attorney, Agent, or Firm*—Armstrong, Kratz, Quintos, Hanson & Brooks, LLP

(57) ABSTRACT

A polycrystal thin film forming method comprising the step of forming a semiconductor thin film on a substrate 14, and the step of flowing a heated gas to the semiconductor thin film while an energy beam 38 is being applied to the semiconductor thin film at a region to which the gas is being applied to thereby melt the semiconductor film, and crystallizing the semiconductor thin film in its solidification. The energy beam is applied while the high-temperature gas is being flowed, whereby the melted semiconductor thin film can have low solidification rate, whereby the polycrystal thin film can have large crystal grain diameters and can have good quality of little defects in crystal grains and little twins.

3 Claims, 68 Drawing Sheets

FIG. 3A
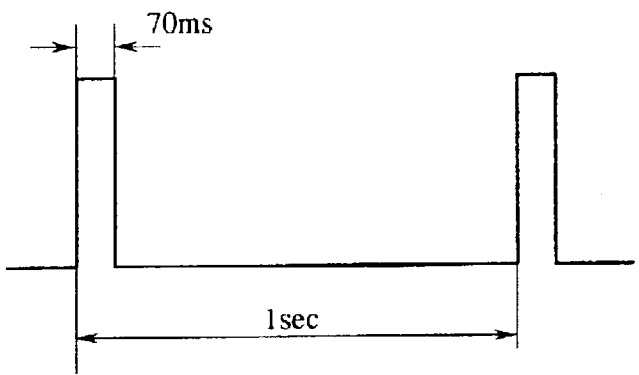
FIG. 3B
FIG. 3C
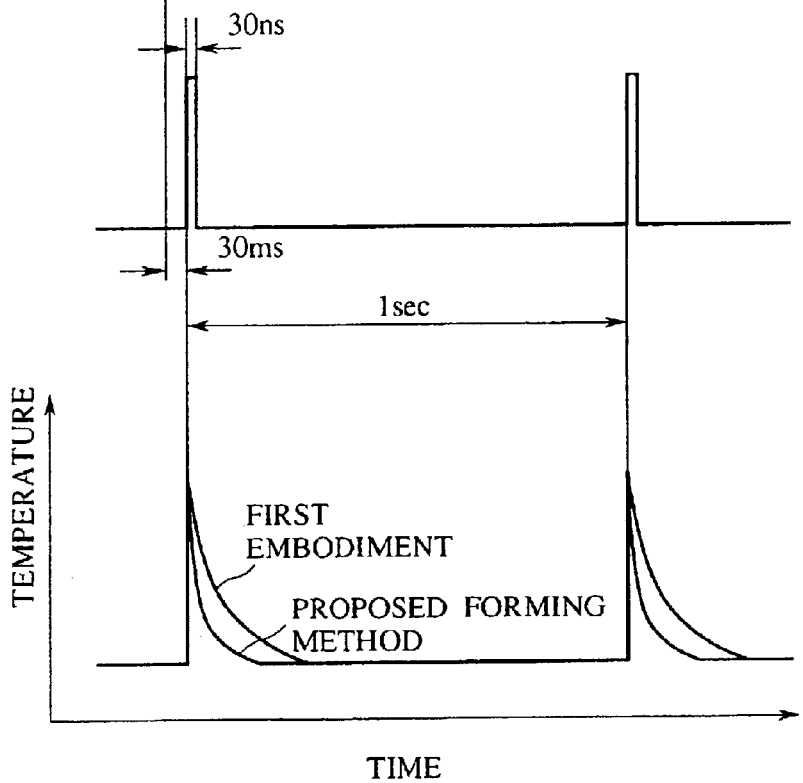

100nm

100nm

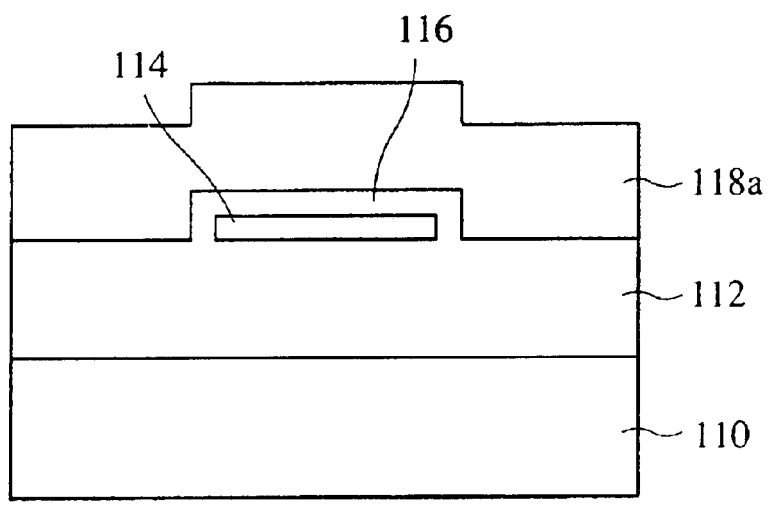
FIG. 14A
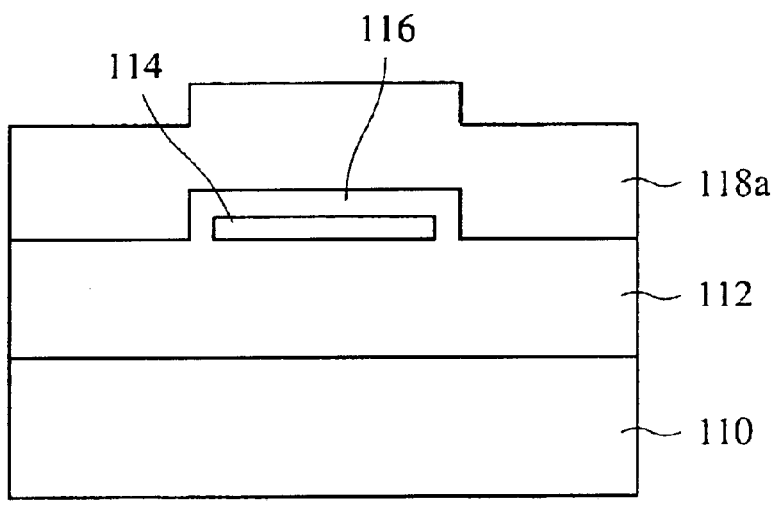
FIG. 14B
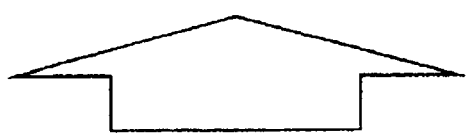

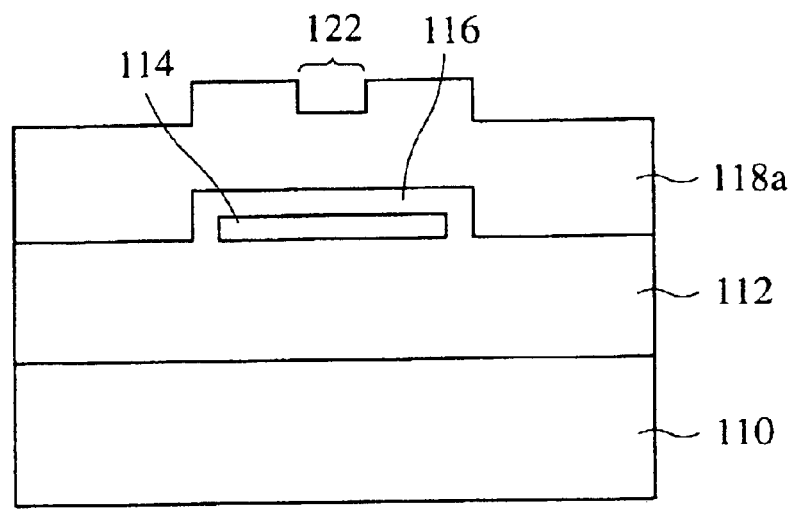
FIG. 19A
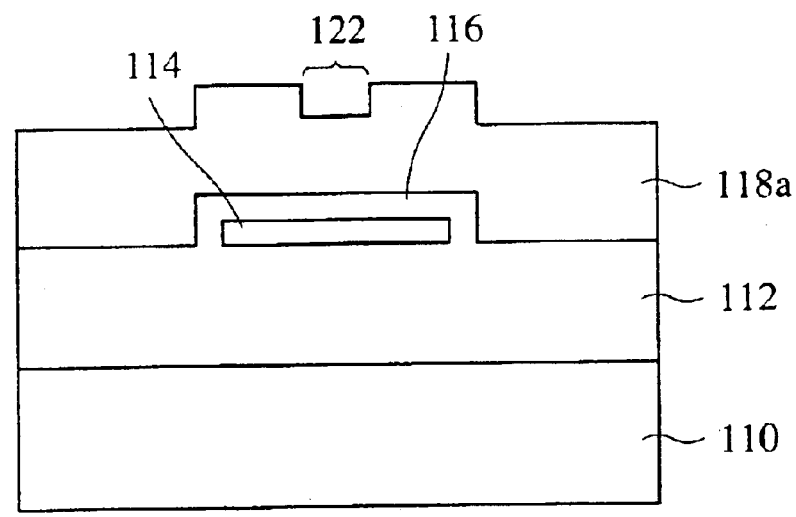
FIG. 19B

CIRCULAR LARGE GRAIN DIAMETER SILICON FORMING REGION

CIRCULAR LARGE GRAIN DIAMETER CRYSTAL SILICON

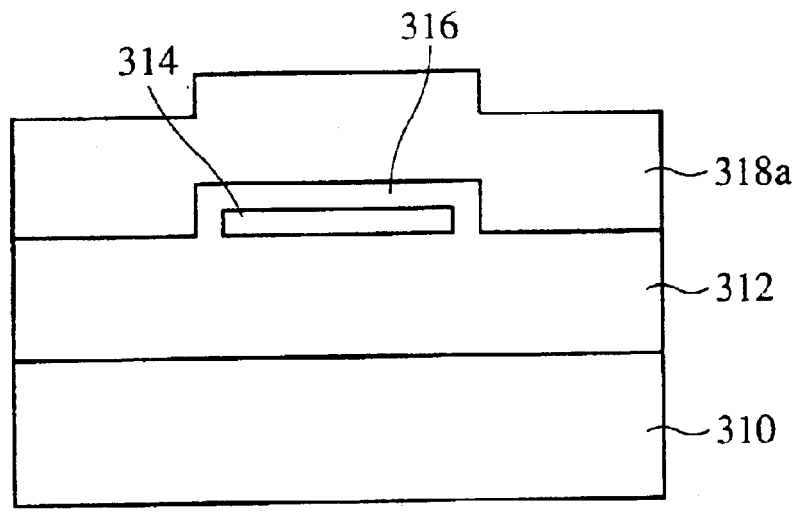
FIG. 49A
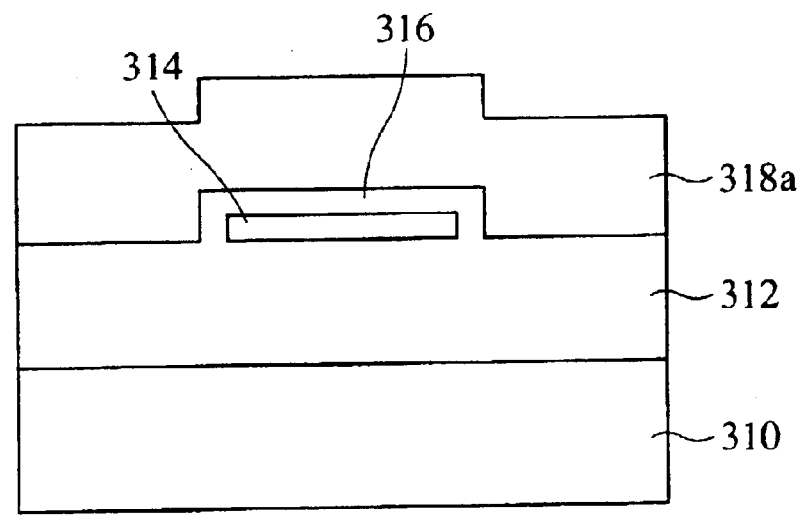
FIG. 49B

SEMICONDUCTOR DEVICE

CROSS REFERENCE TO RELATED APPLICATION

This application is a division of Ser. No. 09/650,641, filed Aug. 30, 2000 now U.S. Pat. No. 6,582,996, which is a continuation-in-part of Ser. No. 09/327,572, filed on Jun. 8, 1999 now U.S. Pat. No. 6,255,148.

BACKGROUND OF THE INVENTION

The present invention relates to a polycrystal thin film forming method and forming system, more specifically a polycrystal thin film forming method and forming system for forming at low temperature polycrystal thin film on a substrate of low heat resistance temperature.

Furthermore, the present invention relates to a semiconductor thin film forming method, a thin film transistor fabrication method and a liquid crystal display device fabrication method, more specifically a semiconductor thin film forming method which can form semiconductor thin film having good crystallization on a substrate having low heat resistance temperature, a thin film transistor fabrication method for fabricating a thin film transistor using the semiconductor thin film, and a liquid crystal display device for fabricating a liquid crystal display device using the thin film transistor.

Recently, liquid crystal displays (LCDs) using thin film transistors (TFTs) as switch devices for the picture elements because of electric power saving, space saving, high response speed, beautiful display, etc.

Such liquid crystal displays generally use glass substrates, and the thin film transistors are formed on the glass substrate. The channel layers of the thin film transistors are formed of, in many cases, polycrystal silicon thin film.

As a method for forming polycrystal silicon thin film on a glass substrate has been conventionally known a method in which amorphous silicon thin film is formed on a glass substrate and then is subjected to a heat treatment at 600° C. for 50 hours to crystallize the amorphous silicon thin film, and polycrystal silicon thin film is formed. In this method nuclei of crystals are grown at the initial stage of the heat treatment, and the nuclei are grown to form polycrystal silicon thin film.

However, in this polycrystal silicon thin film forming method the heat treatment performed at 600° C. for about 50 hours deforms the glass substrate. Furthermore, crystal grain of the thus-formed polycrystal silicon thin film have many defects and twins. Thus this method has found it difficult to form high-quality polycrystal silicon thin film having high electron mobility.

It was considered to form polycrystal silicon thin film on a glass substrate at an above 600° C. high temperature by CVD (Chemical Vapor Deposition), but the glass substrate was deformed by the high temperature of above 600° C., and the thus-formed polycrystal silicon thin film could not have sufficient crystallization.

Then is proposed a method in which amorphous silicon thin film is formed on a glass substrate, and laser beams are applied to the amorphous silicon thin film to form polycrystal silicon thin film. In this method polycrystal silicon thin film is formed in the process of the silicon melted by the laser beams solidifying. The amorphous silicon thin film is melted by the laser beams for a short period of time without heating the glass substrate to a high temperature. Accordingly polycrystal silicon thin film can be formed without deforming the glass substrate.

However, in this proposed polycrystal silicon thin film forming method because silicon solidifies at high speed, polycrystal silicon thin film having large crystal grain diameters cannot be formed. Thin film transistors using the thus-formed polycrystal silicon thin film as the channel layers have electron mobilities so low as about 150 $cm^2/Vs$.

SUMMARY OF THE INVENTION

An object of the present invention is to provide a method for forming a semiconductor thin film which can provide high electron mobility even when the film is formed at low temperature, a thin film transistor using the semiconductor thin film, and a liquid crystal display device using the thin film transistor.

The above-described object is achieved by a polycrystal silicon thin film forming method comprising the steps of: forming a silicon layer on a substrate; forming a heat reservoir layer on an upper surface of the silicon layer and side surfaces of the silicon layer; and applying the short pulsed laser beams to the silicon layer to crystallize the silicon layer. Because of the heat insulation layer covering the silicon layer, the silicon layer after subjected to laser beam application can have low cooling speed, whereby a polycrystal silicon thin film having large grain diameters can be formed. Accordingly, a polycrystal silicon thin film having high electron mobility can be formed.

The above-described object is achieved by a semiconductor device including an active semiconductor film formed on an insulating substrate, at least a channel region of the active semiconductor film having a quasi-monocrystal state, which is a crystal state containing only grain boundaries having inclination angles of not more than 90 to a current direction.

The above-described object is achieved by a semiconductor device including an active semiconductor film formed on an insulating substrate, at least a channel region of the active semiconductor film having a polycrystal state which is formed of circular large-diameter crystal grain, a radius L of the circular large-diameter crystal grain being larger than 250 nm, and the radius L being larger than W/4 when a width of the channel is represented by W.

The above-described object is achieved by a method for fabricating a semiconductor device including an active semiconductor film formed on an insulating substrate, comprising the steps of: forming a semiconductor film in the shape of an island on one surface of the insulating substrate; covering the semiconductor film with an isolation film, covering a side of the semiconductor film with a heat retaining film through the isolation film; and crystallizing the semiconductor film by applying energy beams to the semiconductor film from said one surface of the insulating substrate to form the active semiconductor film.

The above-described object is achieved by a method for fabricating a semiconductor device including an active semiconductor film formed on an insulating substrate, comprising the steps of: forming a semiconductor film in the shape of an island on one surface of the insulating substrate; covering the semiconductor film with an isolation film, covering the entire surface of the semiconductor film with the heat retaining film through the isolation film; and crystallizing the semiconductor film by applying energy beams to the semiconductor film from the other surface of the insulating substrate to form the active semiconductor film.

The above-described object is achieved by a method for forming a silicon thin film, comprising the steps of: forming a silicon layer on one surface of an insulating substrate; forming a heat retaining layer on at least a side of the silicon layer; and applying continuous-wave energy beams to the silicon layer to crystallize the silicon layer.

BRIEF DESCRIPTION OF THE DRAWINGS

FIGS. 3A to 3C are timing chart of flow of a high-temperature gas, applying a laser beam and temperature changes of the surface of the semiconductor thin film.

FIGS. 14A and 14B are sectional views of the polycrystal silicon thin film in the steps of the polycrystal silicon thin film forming method according to the third embodiment of the present invention, which show the process (Part 2).

FIGS. 19A and 19B are sectional views of a polycrystal silicon thin film in the steps of the polycrystal silicon thin film forming method according to a sixth embodiment of the present invention, which show the process (Part 1).

FIGS. 49A and 49B are sectional views of the silicon thin film according to a eleventh embodiment of the present invention in the steps of the method for forming the same, which explain the method (Part 3).

DETAILED DESCRIPTION OF THE INVENTION

[A First Embodiment]

Figure 1:
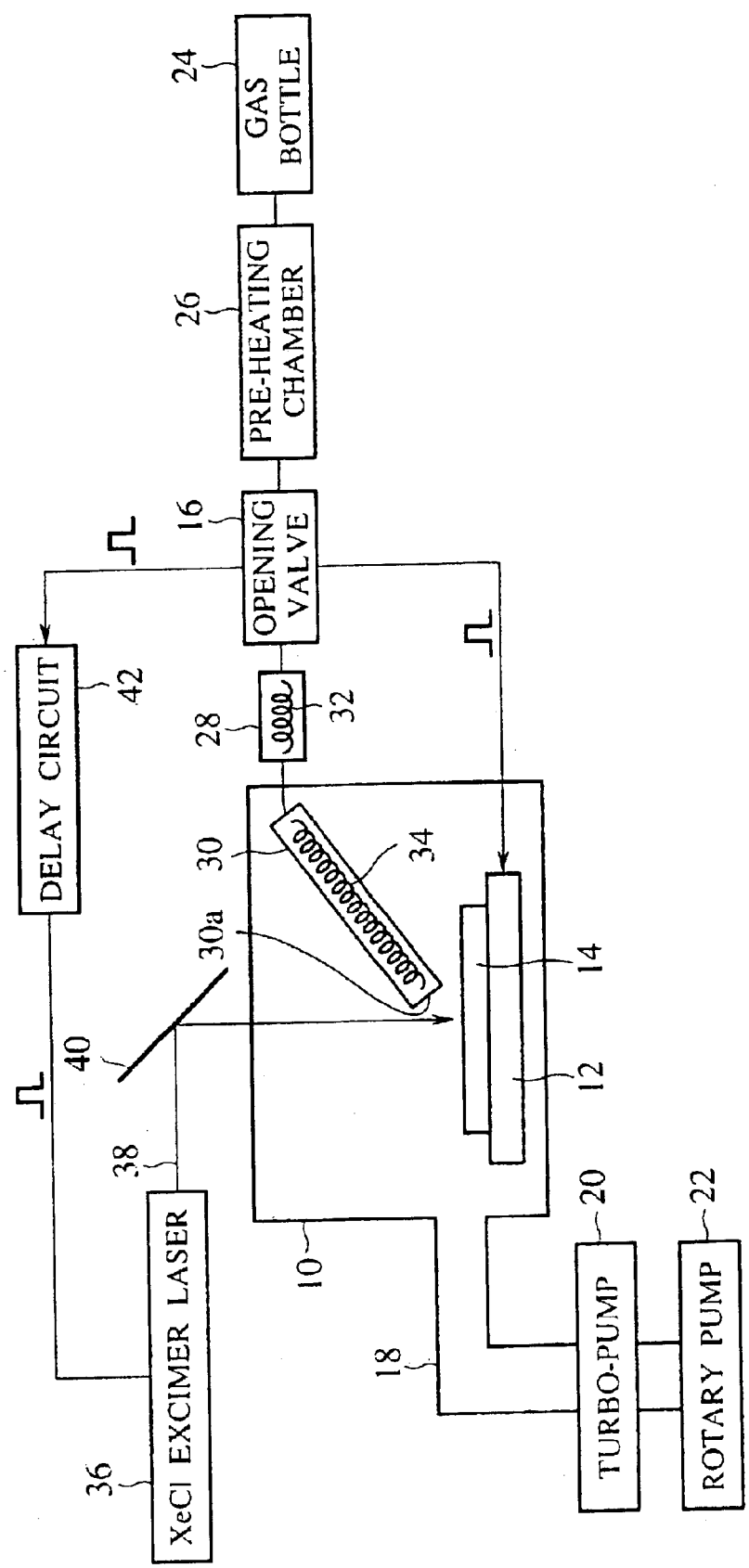
FIG. 1 is a conceptual view of the polycrystal thin film forming system according to a first embodiment of the present invention, which shows a general structure thereof.
Figure 2:
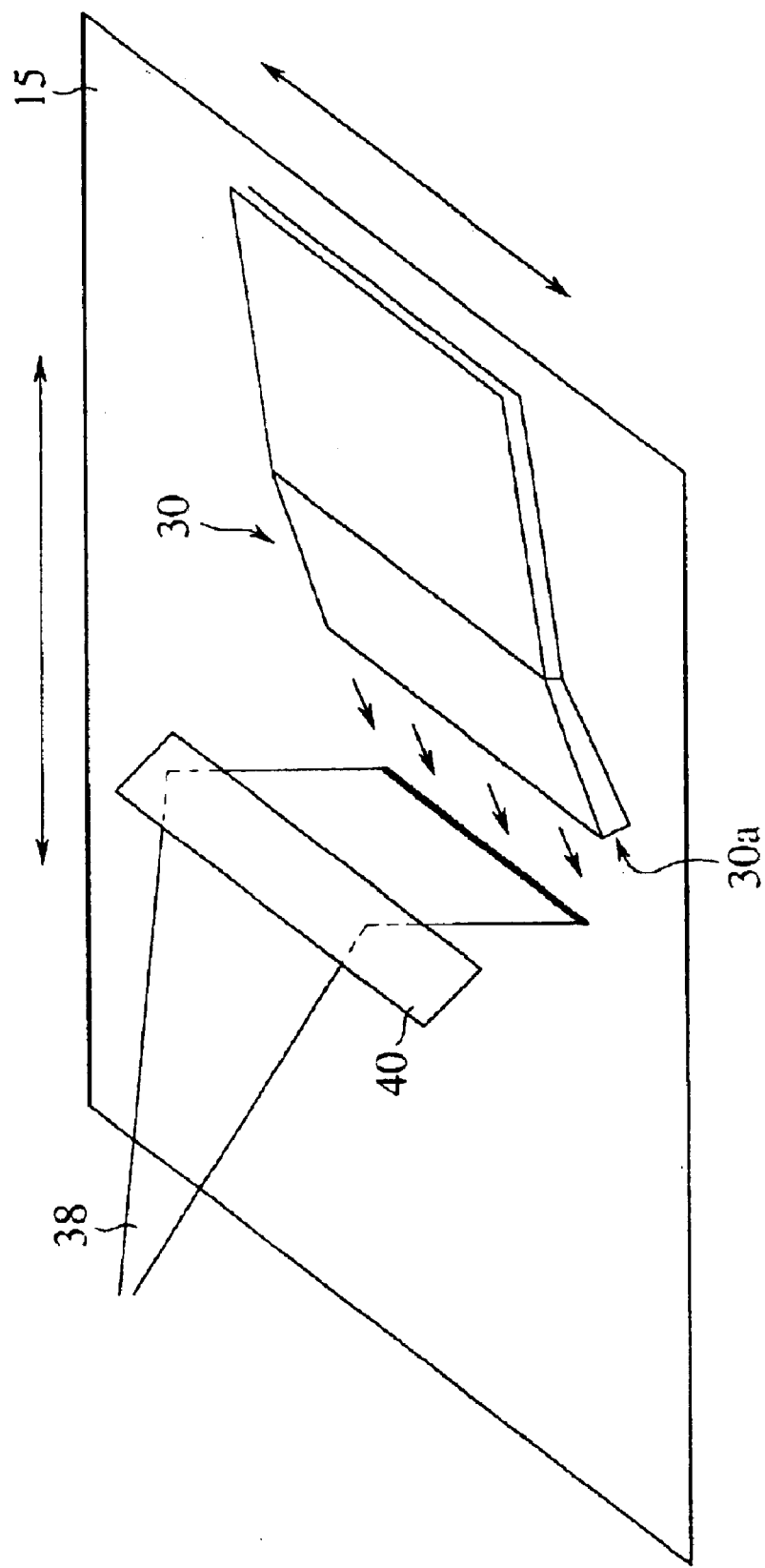
FIG. 2 is a conceptual view of a part of the polycrystal thin film forming system according to the first embodiment of the present invention.

The polycrystal thin film forming method and forming system according to a first embodiment of the present invention will be explained with reference to FIGS. 1 to 3C. FIG. 1 is a conceptual view of a general structure of the polycrystal thin film forming system according to the present embodiment. FIG. 2 is a conceptual view of a part of the polycrystal thin film forming system according to the present embodiment. FIGS. 3A to 3C are timing charts of timing of flowing a high-temperature gas, applying a laser beam, and temperature changes of the surface of the semiconductor thin film.

(Polycrystal Thin Film Forming System)

First, the polycrystal thin film forming system according to the present embodiment will be explained with reference to FIGS. 1 and 2.

As shown in FIG. 1, an X-Y stage 12 is disposed in a chamber 10, and a substrate 14 with a semiconductor thin film 15 (see FIG. 2) formed on the surface is mounted on the X-Y stage 12. A pulse signal is inputted to the X-Y stage 12 by an opening valve 16 in accordance with opening and closing thereof. The X-Y stage 12 is moved by, e.g., 0.05 mm/pulse, based on the pulse signal from the opening valve 16. The X-Y stage 12 includes a heater (not shown) for heating the substrate 14 as required.

An exhaust pump 18 of the chamber 10 is connected to a turbo-pump 20. Air in the chamber 10 is exhausted through the turbo-pump 20 and a rotary pump 22.

An inert gas of high temperature is flowed in pulses, as will be described below, to the semiconductor film 15 formed on the substrate 14.

That is, as shown in FIG. 1, the inert gas in a gas bottle 24 flows into a pre-heating chamber 26 to be heated therein up to a prescribed temperature, e.g., 100° C. The inert gas can be, e.g., argon gas or others. The inert gas which has been heated in the pre-heating chamber 26 up to the prescribed temperature is flowed in pulses through a heating chamber 28 and an flow nozzle 30 to the surface of the semiconductor film 15 as shown in FIG. 2 by the opening valve 16 which is opened periodically in the shape of a pulse.

Heaters 32, 34 are provided respectively in the heating chamber 28 and a flow nozzle 30. The inert gas is heated up to, e.g., 600° C. by the heaters 32, 34. The port 30a of the flow nozzle 30 is large enough to flow the high temperature-inert gas over a larger region than a region on the semiconductor thin film 15 on the substrate 14 for a laser beam to be applied to.

On the other hand, a laser beam 38 is emitted in pulses from an XeCl excimer laser 36 at a timing corresponding to that of flowing the high temperature-inert gas. The laser beam 38 is homogenized by a homogenizer 40 and applied to the semiconductor film 15 on the substrate 14.

That is, a pulse signal is inputted to a delay circuit 42 in accordance with opening and closing of the opening valve 16, and the signal delayed by the delay circuit 42 is inputted to the XeCl excimer laser 36. The XeCl excimer laser 36 emits a laser beam for a prescribed period of time, based on the inputted signal. The laser beam emitted by the XeCl excimer laser 36 is homogenized by the homogenizer 40 as shown in FIG. 2, and applied to the semiconductor thin film 15.

Thus, while the high-temperature inert gas is being flowed in pulses to the surface of the semiconductor thin film 15 formed on the substrate 14, the laser beam 38 is applied in pulses. The substrate 14 is moved by the X-Y stage 12 suitably in the arrowed direction in FIG. 2, whereby a polycrystal thin film is formed on the entire surface.

(Polycrystal Thin Film Forming Method)

Then, the polycrystal thin film forming method according to the present embodiment will be explained by means of an example of forming a polycrystal silicon thin film and with reference to FIGS. 1 to 3C. FIG. 3A shows a timing of flowing the high-temperature gas. FIG. 3B is a timing of applying a laser beam. FIGS. 3A to 3C are time charts of surface temperature changes of the semiconductor thin film.

First, a semiconductor thin film 15 of, e.g, a 70 nm-film thickness silicon thin film is formed on a substrate 14. The substrate 14 can be provided by, e.g., a glass substrate. The silicon thin film can be provided by, e.g., an amorphous silicon thin film.

Next, the substrate 14 with the semiconductor thin film 15 formed on is mounted on the X-Y stage 12 in the chamber 10.

Next, air in the chamber 10 is exhausted to reduce a pressure in the chamber 10 to, e.g., $1 \times 10^{-2}$ Pa.

Then, a laser beam 38 is applied in pulses while a high-temperature inert gas is being flowed in pulses to the semiconductor thin film 15 on the substrate 14. A timing of flowing the high-temperature inert gas is set as exemplified in FIG. 3A. A timing of applying the laser beam is set as exemplified in FIG. 3B.

That is, as shown in FIG. 3A, a pulse width for flowing the high-temperature inert gas is, e.g., 70 ms, and a frequency of the pulse is, e.g, 1 Hz (cycle: 1 second). It is not necessary to pressurize the inert gas. The inert gas can be flowed, without being pressurized, to the semiconductor thin film 15 owing to an atmospheric pressure difference between the chamber 10 and the pre-heating chamber 26, because a pressure inside the chamber 10 is lower than that in the pre-heating chamber 26. The inert gas flows into the chamber 10, and a pressure in the chamber 10 temporarily rises to, e.g., about 100 torr. Under a pressure of such level the inert gas can be flowed to the semiconductor thin film 15 without any trouble.

On the other hand, a timing of beginning to apply the laser beam 38 from the XeCl excimer laser 36 is delayed by, e.g., 30 ms as shown in FIG. 3B, so that the laser beam 38 can be applied to the semiconductor thin film 15 when the semiconductor thin film 15 and its vicinity are kept at a high temperature. A delay time of the delay circuit 42 is 30 ms, whereby the laser beam 38 can be applied at this timing. A period of time, i.e., a pulse width of the laser beam 38 from the XeCl excimer laser 36 is preferably set suitably to melt the semiconductor thin film 15 and can be set at 30 ns as exemplified in FIG. 3B.

It is preferable that the high-temperature inert gas is kept on being flowed to the semiconductor thin film 15 still after the application of the laser beam 38 is finished. Because the high-temperature inert gas is flowed to the semiconductor thin film 15 still after the application of the laser beam 38 is finished, it can take a long period of time as shown in FIG. 3C until the semiconductor thin film 15 is cooled, whereby the semiconductor thin film 15 melted by the laser beam 38 can have a low solidification rate, and accordingly polycrystal thin film of good quality can be formed.

Thus, the laser beam 38 of a 30 ns-pulse width and a 1 Hz-pulse frequency is applied to the semiconductor thin film 15 on the substrate 14, delayed by 30 ms from the start of flowing of the high-temperature inert gas. The laser beam 38 emitted by the XeCl excimer laser 36 is preferably shaped by the homogenizer 40 suitably into, e.g., a 100 mm×1 mm.

A signal outputted by the opening valve 16 is inputted to the X-Y stage 14, and the X-Y stage 14 is moved by 0.05 mm/pulse. Thus, finally polycrystal thin film of good quality can be formed on the substrate 14.

(Crystal Structure)

Figure 4A:
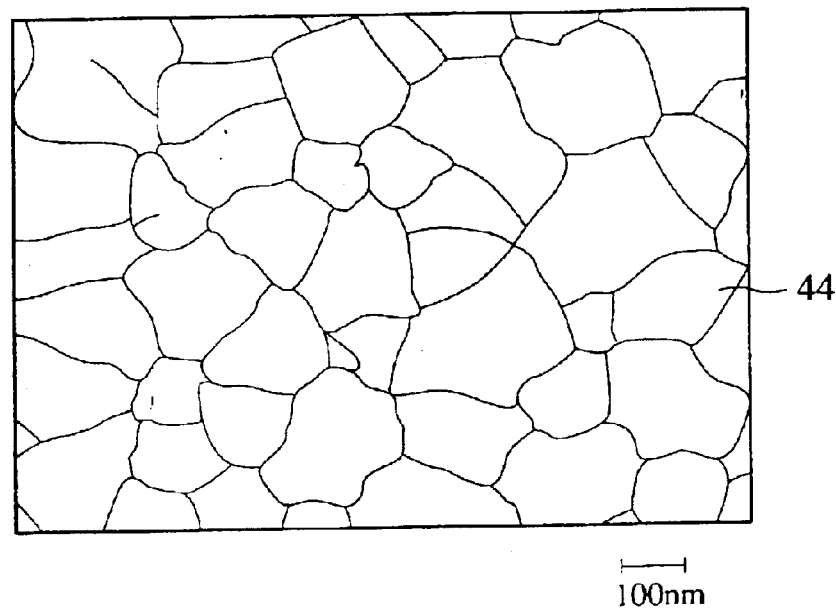
FIGS. 4A and 4B are schematic views of crystal structures of polycrystal silicon thin films.
Figure 4B:
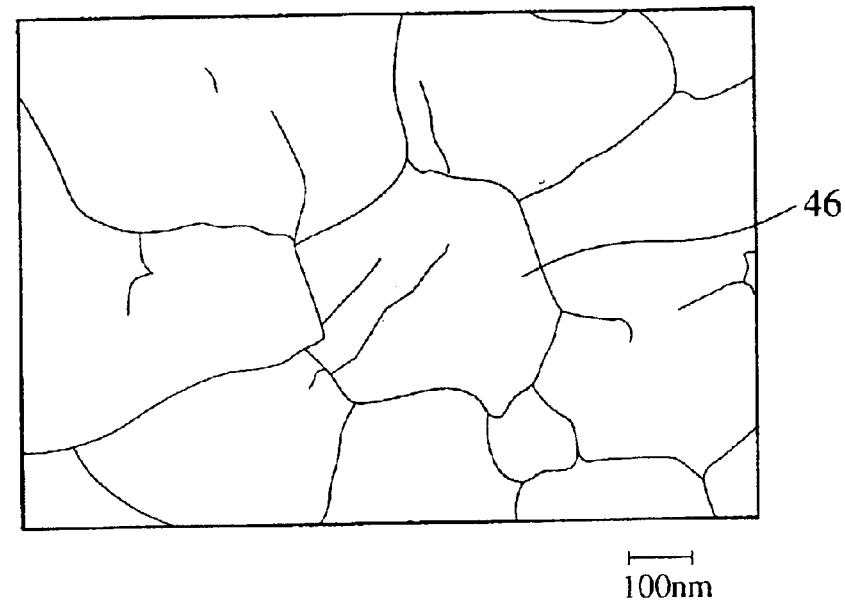

With reference to FIGS. 4A and 4B a crystal structure of a polycrystal thin film formed by the proposed method, i.e., with a laser beam applied without flowing the high-temperature inert gas, and a crystal structure of a polycrystal thin film formed by the method according to the present embodiment, i.e., with a laser beam applied in pulses while the high-temperature inert gas is being flowed will be explained. Here, the polycrystal thin film is exemplified by polycrystal silicon film.

FIG. 4A is a schematic view of a crystal structure of a polycrystal silicon film formed by the proposed method. The polycrystal silicon film was formed and etched with Secco etching, and was observed by a scanning electron microscope. A semiconductor thin film formed in advance on a glass substrate was amorphous silicon thin film, and an applied laser beam had 350 mJ/cm² energy.

On the other hand, FIG. 4B is a schematic view of a crystal structure of a polycrystal silicon thin film formed by the method according to the present embodiment. As in the case shown in FIG. 4A, the polycrystal silicon thin film was formed and Secco-etched, and was observed by a scanning electron microscope. A silicon thin film formed in advance on a glass substrate was amorphous silicon thin film, and the applied laser beam had 300 mJ/cm² energy.

As shown in FIG. 4A, the crystal structure of the polycrystal silicon thin film formed by the proposed method had crystal grains 44 of about 100 nm–about 200 nm grain diameters.

In contrast to this, as shown in FIG. 4B, the crystal structure of the polycrystal silicon thin film formed by the present embodiment had crystal grains of about 300 nm–about 600 nm grain diameters. That is, the method according to the present embodiment can make grain diameters as large as about three times in comparison with the proposed method.

Thus, the present embodiment can form polycrystal thin film having large crystal grain diameters.

(Electric Characteristics)

Figure 5A:
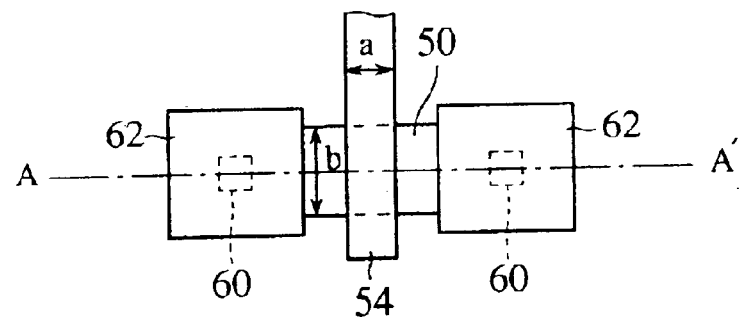
FIGS. 5A and 5B are sectional view and a plan view of a thin film transistor used for evaluation of electric characteristics of the polycrystal thin films.
Figure 5B:
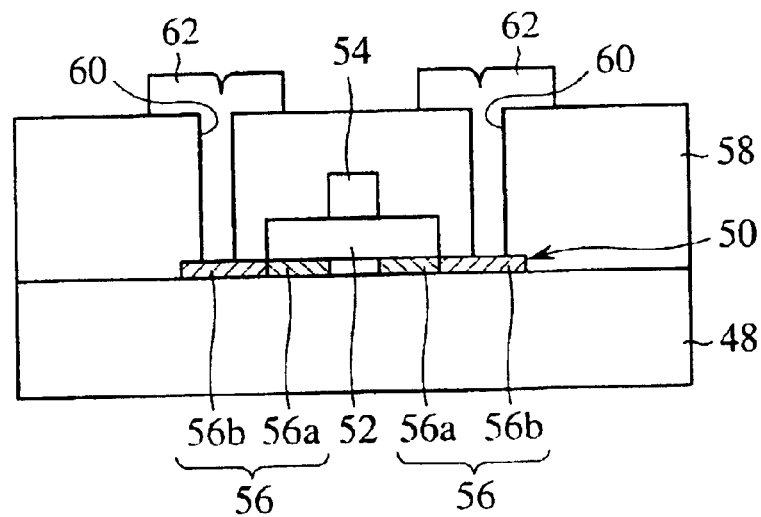
Figure 6A:
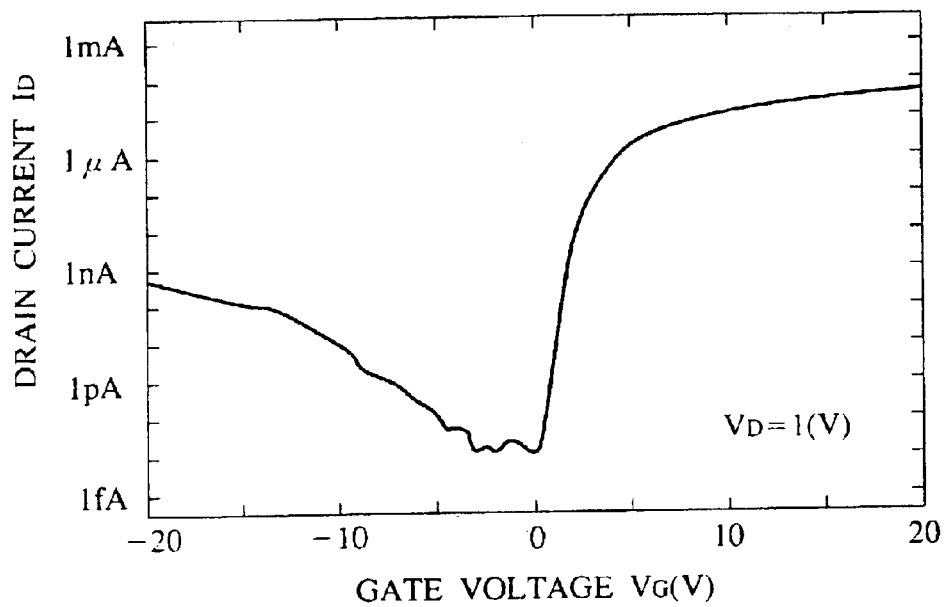
FIGS. 6A and 6B are graphs of $I_D$-$V_G$ characteristics of the thin film transistor.
Figure 6B:
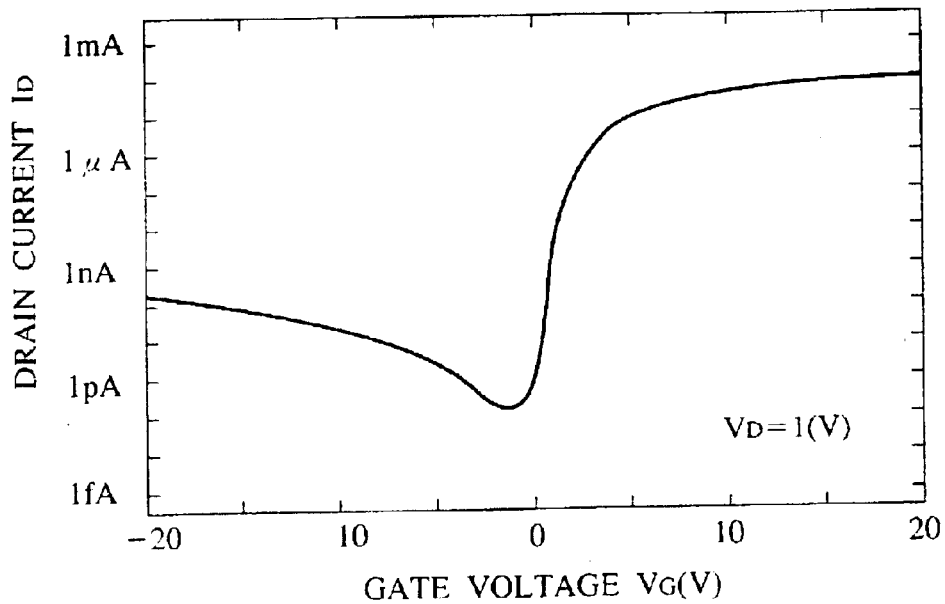
Figure 7A:
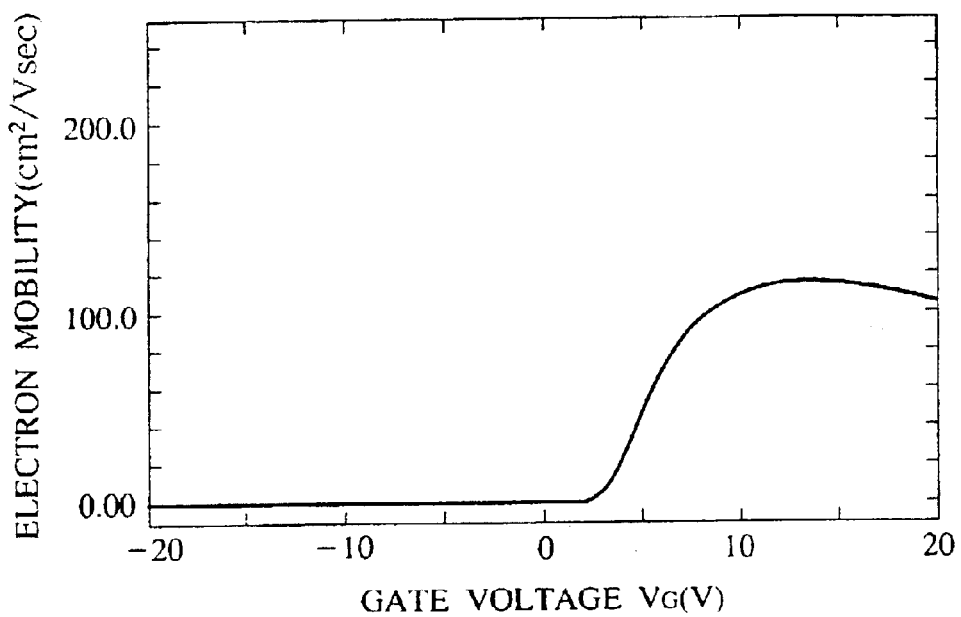
FIGS. 7A and 7B are graphs of electron mobility of the thin film transistor.
Figure 7B:
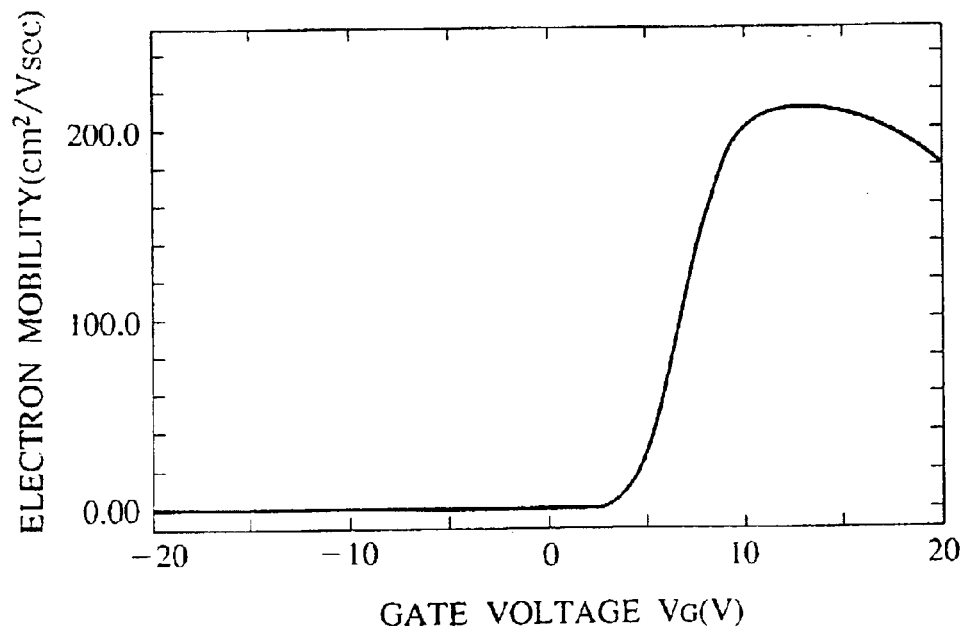

Then, electric characteristics of the polycrystal thin film formed by the present embodiment will be explained by means of an example of a thin film transistor with reference to FIGS. 5A to 7B. FIGS. 5A and 5B are sectional view and a plan view of the thin film transistor used in evaluating electric characteristics of the polycrystal thin film. FIG. 5A is a plan view of the thin film transistor, and FIG. 5B is a sectional view of the thin film transistor along the line A–A' in FIG. 5A. FIGS. 6A and 6B are graphs of $I_D$-$V_G$ ($I_D$: a drain current, $V_G$: a gate voltage) characteristics of the thin film transistor. FIGS. 7A and 7B are graphs of electron mobility characteristics of the thin film transistor.

As shown in FIG. 5B, a polycrystal thin film 50 of a 70 nm-film thickness polycrystal silicon thin film formed as described above is formed on a glass substrate 48. For comparison of electric characteristics of the polycrystal thin film formed by the present embodiment with those of the polycrystal thin film formed by the proposed method, thin film transistors were fabricated by using the respective polycrystal thin films.

A 120 nm-thickness gate insulation film 52 was formed on the polycrystal thin film 50. A gate electrode 54 of an aluminum film was formed on the gate insulation film 52. The gate electrode 54 had a gate length a of 10 μm (see FIG. 5A, and the polycrystal thin film 50 had a width b of 30 μm.

In the polycrystal thin film 50, a lightly-doped diffused layer 56a was formed by self-alignment with the gate electrode 54 and was lightly doped with phosphorus. A heavily doped diffused layer 56b is formed in the polycrystal thin film 50. The lightly doped diffused layer 56a and the heavily doped diffused layer 56b constituted a source/drain diffused layer 56.

Furthermore, an inter-layer insulation film 58 was formed on the entire surface. A contact hole 60 was formed in the inter-layer insulation film 58 from the surface thereof to the heavily doped diffused layer 56b. On the heavily doped diffused layer 56b a source/drain diffused electrode 62 was formed through the contact hole 60.

$I_D$-$V_G$ characteristics of the thin film transistor of such structure will be explained with reference to FIGS. 6A and 6B.

FIG. 6A is a graph of $I_D$-$V_G$ characteristics of the thin film transistor using the polycrystal thin film formed by the proposed method. FIG. 6B is a graph of $I_D$-$V_G$ characteristics of the thin film transistor using the polycrystal thin film formed by the present embodiment. In both FIGS. 6A and 6B, gate voltages $V_G$ are taken on the horizontal axis, and drain currents $I_D$ are taken on the vertical axis. In both FIGS. 6A and 6B the $I_D$-$V_G$ characteristics are for $V_D$=1V ($V_D$: a drain voltage).

As shown in FIG. 6B, the thin film transistor using the polycrystal thin film formed by the present embodiment had better $I_D$-$V_G$ characteristics than the thin film transistor using the polycrystal thin film formed by the proposed method, whose $I_D$-$V_G$ characteristics are shown in FIG. 6A.

Next, electron mobility characteristics of the above-described thin film transistors will be explained with reference to FIGS. 7A and 7B.

FIG. 7A is a graph of electron mobility characteristics of the thin film transistor using the polycrystal silicon thin film formed by the proposed method. On the other hand, FIG. 7B is a graph of electron mobility characteristics of the thin film transistor using the polycrystal thin film formed by the present embodiment. In both FIGS. 7A and 7B, gate voltages $V_G$ are taken on the horizontal axis, and electron mobilities are taken on the vertical axis. Both in FIGS. 7A and 7B, the electron mobilities are for $V_D$=1V ($V_D$: a drain voltage), i.e., electron mobilities in a linear region of the thin film transistor.

A maximum electron mobility value of the thin film transistor using the polycrystal thin film formed by the proposed method was 100 cm²/Vsec as shown in FIG. 7A, while a maximum electron mobility value of the thin film transistor using the polycrystal thin film formed by the present embodiment was 200 cm²/Vsec. Thus, the thin film transistor using the polycrystal thin film formed by the present embodiment had electron mobility which was twice that of the thin film transistor using the polycrystal thin film formed by the proposed method.

As described above, according to the present embodiment, a laser beam is applied in pulses while the high-temperature inert gas is flowed in pulses, whereby the melted semiconductor thin film can have a low solidification rate. Resultantly the polycrystal thin film having large grain diameters and having little defects in the crystal particles and little twins. Because the high-temperature inert gas is flowed in pulses, it never occurs that a temperature of the substrate is increased, deforming the substrate. Even in a case that the polycrystal thin film is formed on a substrate having a low heat-resistance temperature, the polycrystal thin film can have good quality. Even in a case that the polycrystal thin film is formed at a low temperature, the polycrystal thin film can have large crystal grains, and the polycrystal thin film can have high electron mobility.

[A Second Embodiment]

The polycrystal silicon thin film forming method according to a first embodiment of the present invention will be explained with reference to FIGS. 8A to 12D. FIGS. 8A to 10B are sectional views of the polycrystal silicon thin film in the step of the polycrystal silicon thin film forming method according to the present embodiment. FIG. 11 is a graph of temperature changes of respective parts after laser beam application. FIGS. 12A to 12D are conceptual views of the polycrystal silicon thin film, which show crystal states.

A buffer layer 112 of a 200 nm-thickness silicon oxide film is formed on a glass substrate 110 by PECVD (Plasma-Enhanced Chemical Vapor Deposition).

Next, a silicon layer 114 of a 50 nm-thickness amorphous silicon layer is formed on the buffer layer 112 by PECVD.

Figure 8A:
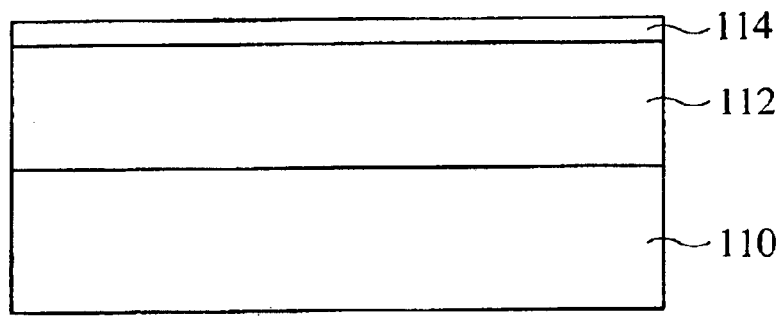
FIGS. 8A to 8C are sectional views of a polycrystal silicon thin film in the steps of the polycrystal silicon thin film forming method according to a second embodiment of the present invention, which show the process (Part 1).

Then, a heat treatment is performed at 450° C. for 2 hours to thereby remove hydrogen from the silicon layer 114 (see FIG. 8A).

Figure 8B:
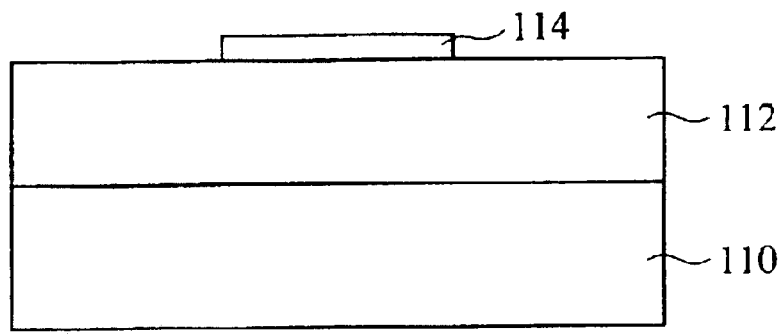

Next, the silicon layer 114 is patterned by photolithography into a 8 μm×8 μm shape (see FIG. 8B).

Figure 8C:
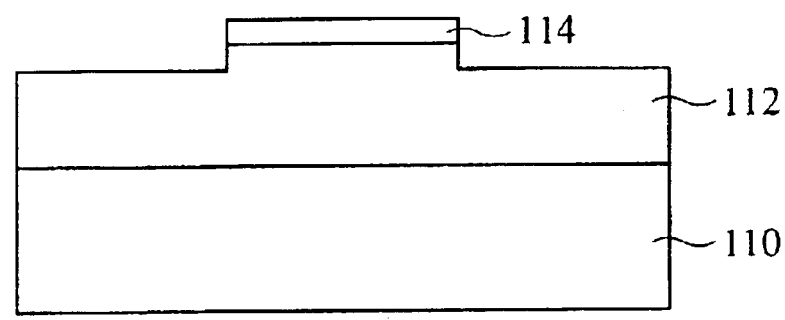

Then, the surface of the buffer 112 is etched with an HF-based etchant and with the silicon layer 114 as a mask to thereby form a step in the buffer layer 112 (see FIG. 8C).

Figure 9A:
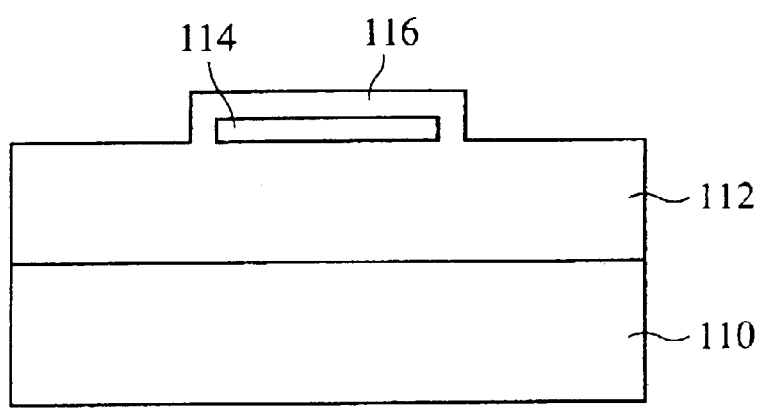
FIGS. 9A and 9B are sectional views of the polycrystal silicon thin film in the steps of the polycrystal silicon thin film forming method according to the second embodiment of the present invention, which show the process (Part 2).

Then, an isolation film 116 of a 30 nm-thickness silicon oxide film is formed on the entire surface by PECVD (see FIG. 9A). The isolation film 116 is preferably formed of a material having a higher melting point than the silicon layer 114. This is because if the isolation film 116 is melted when the silicon layer 114 is crystallized, the silicon layer 114 and a heat reservoir layer 118 (see FIG. 9B) are integrated with each other. The isolation film 116 preferably functions as an etching stopper when the heat reservoir layer 118 is etched.

Figure 9B:
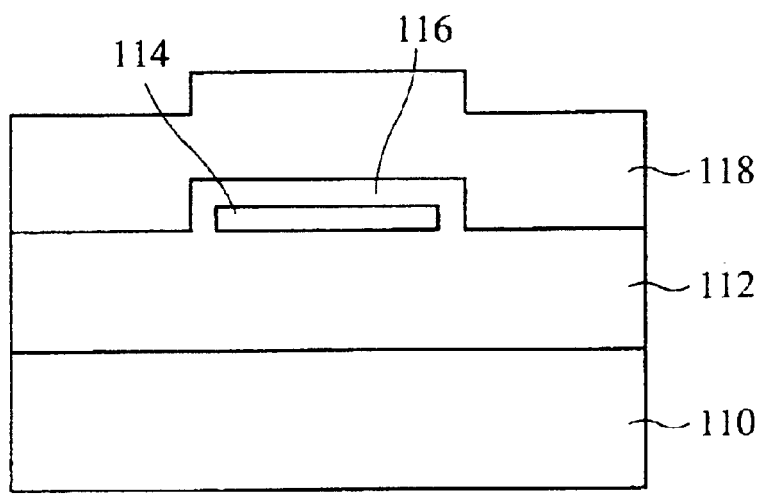

Then the heat reservoir film 118 is formed of an 300 nm-thickness polycrystal silicon film on the entire surface by PECVD (see FIG. 9B). The film forming conditions can be, e.g., a low rate ratio of 2:98 between $SiH_4$ gas and $H_2$ gas and a temperature of 550° C. inside the film deposition chamber.

Figure 10A:
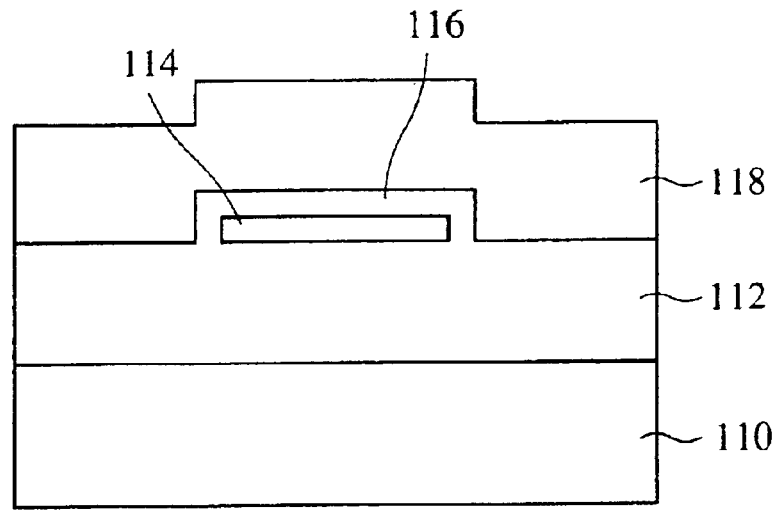
FIGS. 10A and 10B are sectional views of the polycrystal silicon thin film in the steps of the polycrystal silicon thin film forming method according to the second embodiment of the present invention, which show the process (Part 3).
Figure 11:
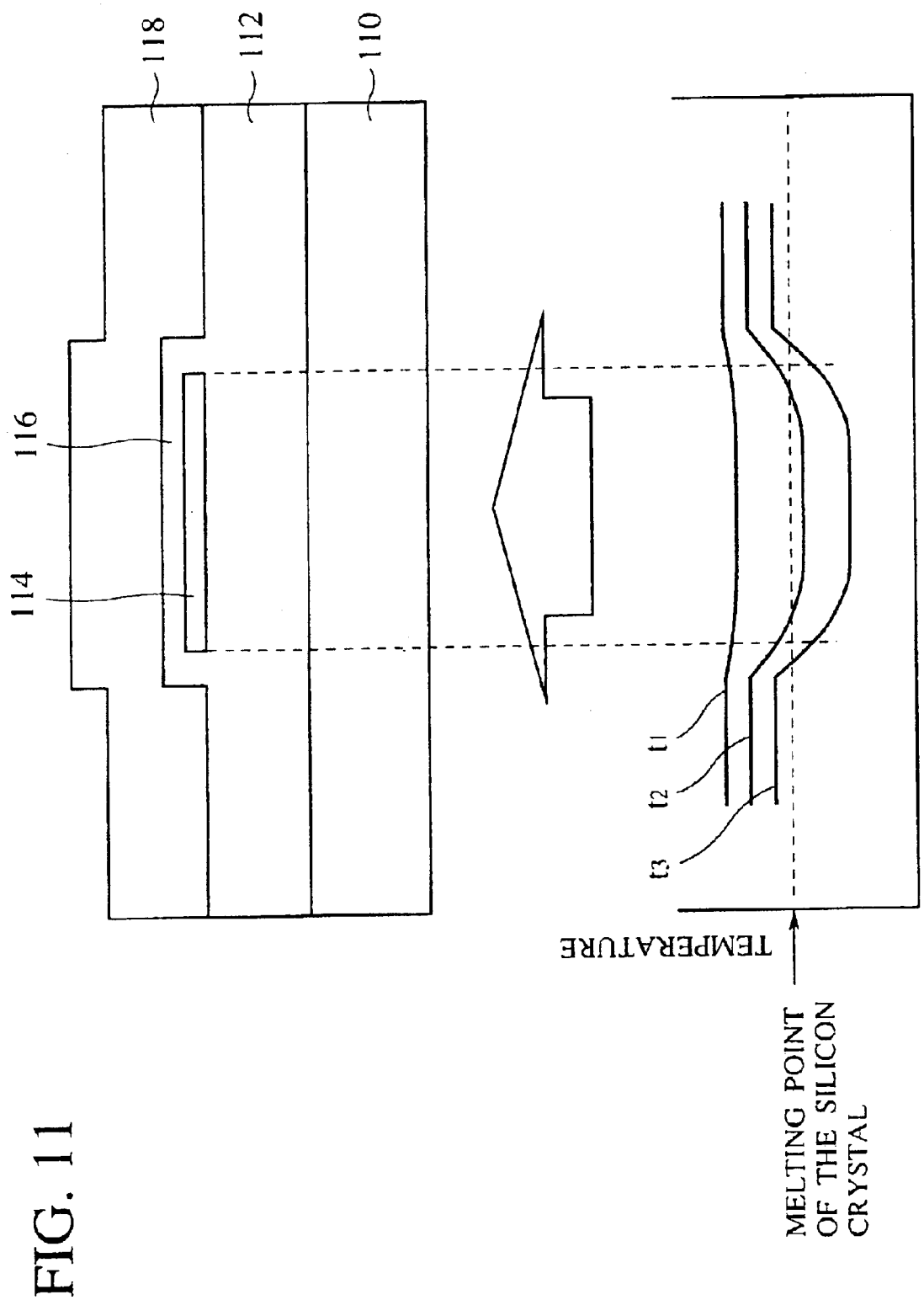
FIG. 11 is a graph of temperatures changes of respective parts after the laser beam application.

Next, short pulsed laser beams are applied to the silicon layer 114 at the room temperature on the side of the underside of the glass substrate 110, i.e., where the buffer layer 112 is not formed, to crystallize the silicon layer 114 (FIG. 10A). Short pulsed laser beams mean laser beams of a pulse of a short period of time. For the short pulsed laser beams, an excimer laser, for example, can be used. A pulse width can be, e.g., 30 ns, and a pulse number can be 20 times/second. An irradiation method for the short pulsed laser beams can be, e.g., overlapping scan irradiation method.

As shown in FIG. 10A, in the present embodiment the silicon layer 114 is covered by the heat reservoir film 118. Because of the heat reservoir layer 118 covering the silicon layer 114 a cooling speed of the silicon layer 114 is low after laser pulses have been applied to the silicon layer 114.

Temperatures of respective parts after the laser beam application will be explained with reference to FIG. 11. In FIG. 11, $t_1$, $t_2$ and $t_3$ represent times after the laser beam application is finished. In FIG. 11, $t_1$ indicates temperatures of the respective parts after a period of time $t_1$ from the finish of the pulsed laser beam application, $t_2$ indicates temperatures of the respective parts after a period of time $t_2$ from the finish of the pulsed laser beam application, and $t_3$ indicates temperatures of the respective parts after a period of time $t_3$ from the finish of pulsed laser beam application. A period of time $t_1$ occurs before a time $t_2$, and the time $t_2$ occurs before a time $t_3$.

The silicon layer 114 is covered by the heat reservoir layer 118, and vicinities of the ends of the silicon layer 114 have a lower cooling speed. In comparing temperatures of the respective parts after a period of time $t_2$ from the finish of the laser beam application, the central part of the silicon layer 114 has a temperature which has lowered below the melting point of the silicon crystal, but the vicinities of the ends of the silicon layer 114 retain a temperature higher than the melting point of the silicon crystal. Thus, the silicon layer 114, which is covered by the heat reservoir layer 118, has a lower cooling speed in the vicinities of the ends of the silicon layer 114. In other words, because it takes a longer time for the vicinities of the ends of the silicon layer 114 to have a temperature lower than the melting point of the silicon crystal, nuclei are generated inside the silicon layer 114, and crystals grow laterally, with a result that large crystal grains can be formed.

The silicon layer 114 is thus crystallized, and a polycrystal silicon thin film 114a is generated.

Then, the heat reservoir layer 118 is etched by RIE (Reactive Ion Etching) with the isolation film 116 as an etching stopper.

Figure 10B:
Figure 10B:
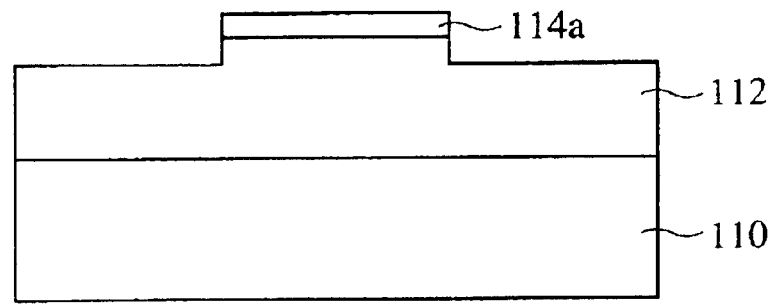

Next, the isolation film 116 is etched by an HF-based wet etching (see FIG. 10B).

Thus, the polycrystal silicon thin film 114a is formed by the present embodiment.

(Evaluation Result)

Figure 12A:
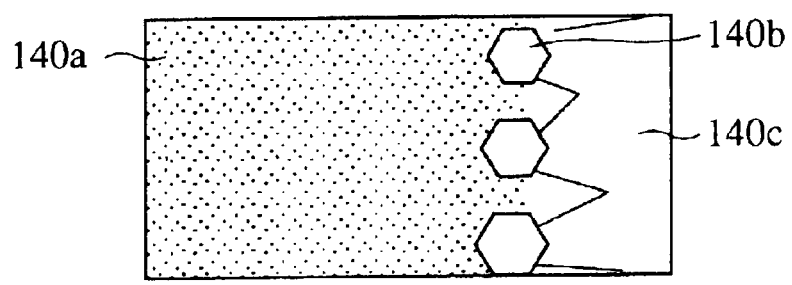
FIGS. 12A to 12D are conceptual views of crystal states of the polycrystal silicon thin film.

Next, crystal states of the thus-formed polycrystal silicon thin film will be explained with reference to FIG. 12A. FIG. 12A is a conceptual view of a crystal states of the polycrystal silicon film formed by the present embodiment. FIG. 12A enlarges the vicinities of the ends of thee silicon layer. Crystal states of the polycrystal silicon film can be observed by, e.g., TEM (Transmission Electron Microscopy).

The side of the polycrystal silicon thin film 114a nearer to the center thereof is shown on the left side of the drawing of FIG. 12A. The side of the polycrystal silicon thin film 114a nearer to the end thereof is shown on the right side of the drawing of FIG. 12A. On the left side of the drawing, i.e., the side of the polycrystal silicon thin film 114a nearer the central part thereof, the polycrystal silicon thin film 114a has small crystal grain diameters and has a tiny grain diameter-polycrystal silicon region 140a. On the right side of the drawing, i.e., in a region spaced by a certain distance from the end of the polycrystal silicon thin film 114a, large-diameter silicon crystals 140b are formed. On the side of the drawing, i.e., in the vicinity of the end of the polycrystal silicon thin film 114a, large-grain diameter silicon crystals 140c which have laterally grown are formed. The nuclei are formed by the large-grain diameter silicon crystals 140b and laterally grow to be the silicon crystals 140c.

As described above, according to the present embodiment, because the silicon layer is covered by the heat reservoir layer, the silicon layer subjected to the laser beam application can have lower cooling speed, whereby polycrystal silicon thin film having large grain diameters can be formed.

[A Third Embodiment]

The polycrystal silicon thin film forming method according to a third embodiment of the present invention will be explained with reference to FIGS. 13A to 15. FIGS. 13A to 15 are sectional views of a polycrystal silicon thin film in the steps of the polycrystal silicon thin film forming method according to the present embodiment, which show the process. The same members of the present embodiment are represented by the same reference numbers as those of the polycrystal silicon thin film forming method according to the second embodiment shown in FIGS. 8A to 12D not to repeat or to simplify their explanation.

The steps of the polycrystal silicon thin film forming method according to the second embodiment up to the step of forming a step in a buffer layer 112 are the same as those of the polycrystal silicon thin film forming method according to the second embodiment as shown in FIGS. 8A to 8C. The steps are not explained here.

Figure 13A:
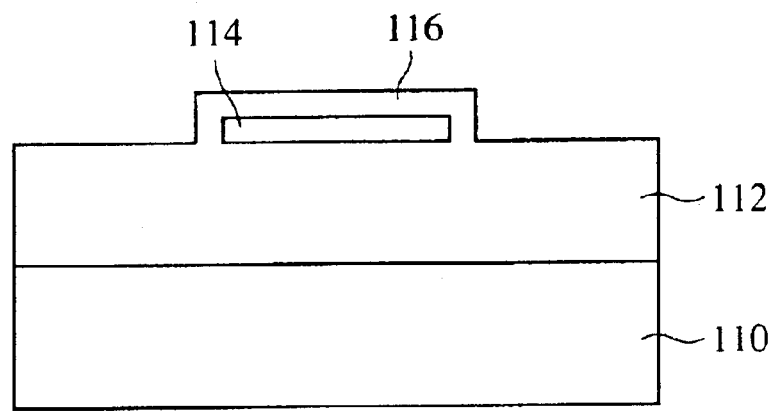
FIGS. 13A and 13B are sectional views of a polycrystal silicon thin film in the steps of the polycrystal silicon thin film forming method according to a third embodiment of the present invention, which show the process (Part 1).

Then, an isolation film 116 of a 30 nm-thickness silicon oxide film is formed on the entire surface by PECVD (see FIG. 13A).

Next, a heat reservoir film 118 of a 300 nm-thickness amorphous silicon film is formed on the entire surface by PECVD.

Figure 13B:
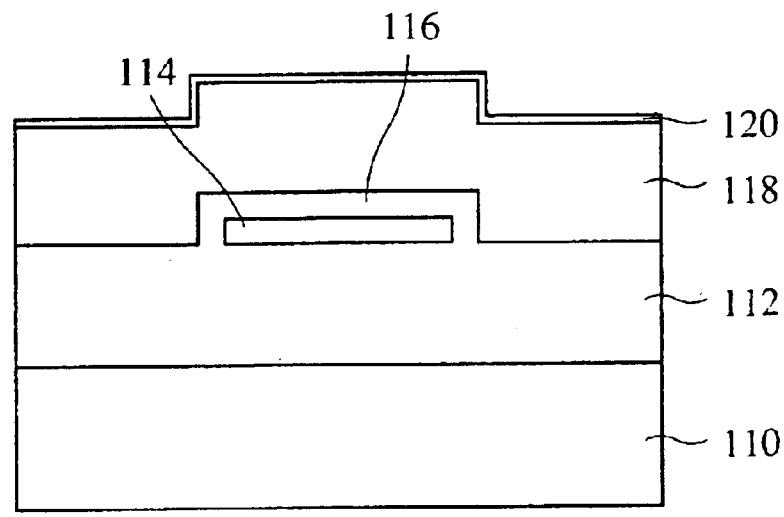

Subsequently, a doped layer 120 of an 3 nm-thickness Ni film is formed on the entire surface by sputtering (see FIG. 13B).

Next, thermal processing is performed at 550° C. for 8 hours to solid-phase diffuse the Ni in the doped layer 120 in the heat reservoir layer 118, so that the solid-phase growth of amorphous silicon using Ni forms a heat reservoir film 118a of a polycrystal silicon layer (see FIG. 14A).

Next, short pulsed laser beams are applied to the silicon layer 114 on the side of the underside of a glass substrate 110 to crystallize the silicon layer 114 (see FIG. 14B). For the short pulsed laser beams, an excimer laser, for example, can be used as in the second embodiment. The same pulse width, pulse number, etc. as in the second embodiment can be used.

Because of the silicon layer 114 covered by the heat reservoir film 118a, the silicon layer 114 after subjected to the laser beam application has lower cooling speed. Vicinities of the ends of the silicon layer take a longer period of time to lower a temperature below the melting point of the silicon crystal, whereby nuclei are formed inside the silicon layer, and crystals laterally grow. Thus lateral crystal growth can be realized. Crystals thus laterally grow, with a result that large crystal grains can be formed.

Thus, the silicon layer 114 is crystallized, and the polycrystal silicon thin film 114b is formed.

Next, the heat reservoir film 118a is etched by RIE with the isolation film 116 as an etching stopper.

Figure 15:
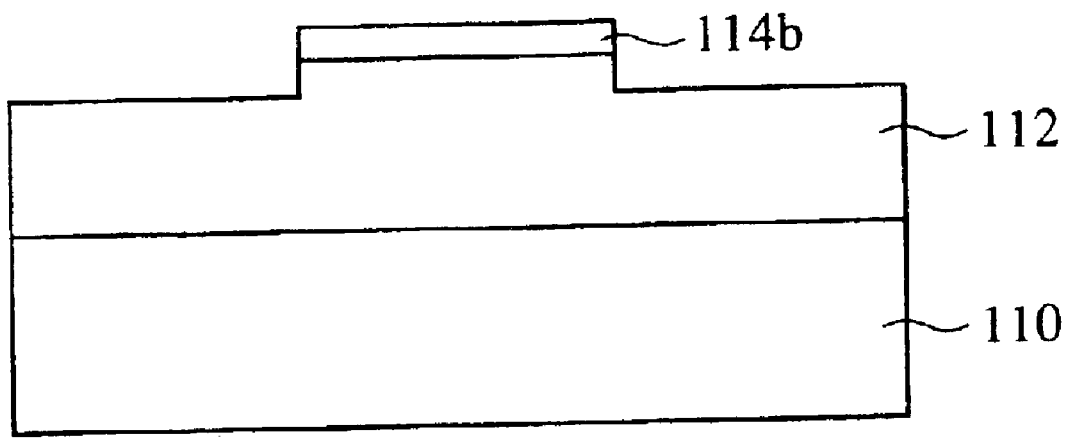
FIG. 15 is sectional view of the polycrystal silicon thin film in the steps of the polycrystal silicon thin film forming method according to the third embodiment of the present invention, which show the process (Part 3).

Then, the isolation film 116 is etched by HF-based wet etching (see FIG. 15).

Thus, a polycrystal silicon thin film is formed by the present embodiment.

(Evaluation Result)

Next, crystal states of the polycrystal silicon thin film formed as described above will be explained.

A polycrystal silicon thin film 114b formed by the present embodiment has the same crystal state as shown in FIG. 12A.

As described above, according to the present embodiment, because the silicon layer is covered by the heat reservoir film, the vicinities of the ends of the silicon layer after subjected to the laser beam application can have lower cooling speed. Due to lower cooling speed in the vicinities of the ends of the silicon layer nuclei are formed inside the silicon layer, and crystals laterally grow. A polycrystal silicon thin film having large grain diameters can be formed.

Crystal states of the silicon layer as subjected to the short pulse laser beam application on the side of the upper surface of the glass substrate 110, i.e., the upper surface of the heat reservoir layer 118a was evaluated as a control.

As a result of the evaluation it was found that the silicon layer had small crystal grain diameters and was polycrystal silicon of micro-grain diameters. This is considered to be because excimer laser beams required for the crystallization of the silicon layer 114 are absorbed by the heat reservoir layer 118a, and sufficient heat required for the crystallization of the silicon layer 114 is not conducted to the silicon layer 114.

[A Fourth Embodiment]

Figure 16A:
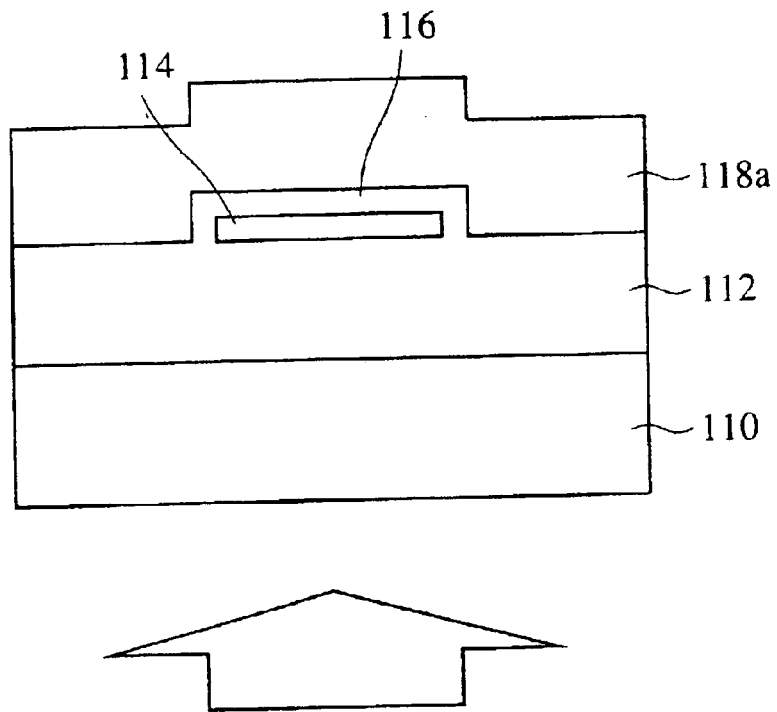
FIGS. 16A and 16B are sectional views of a polycrystal silicon thin film in the steps of the polycrystal silicon thin film forming method according to a fourth embodiment of the present invention.
Figure 16B:
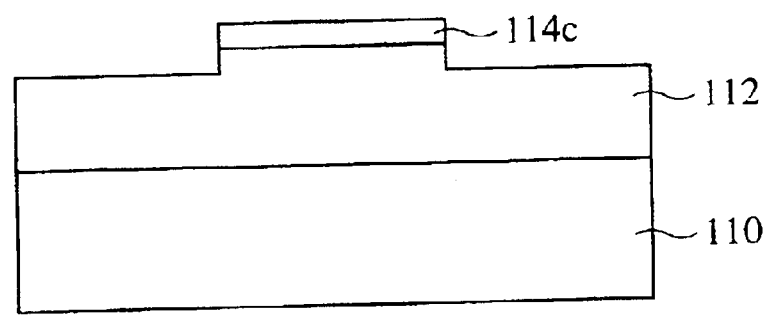
Figure 17:
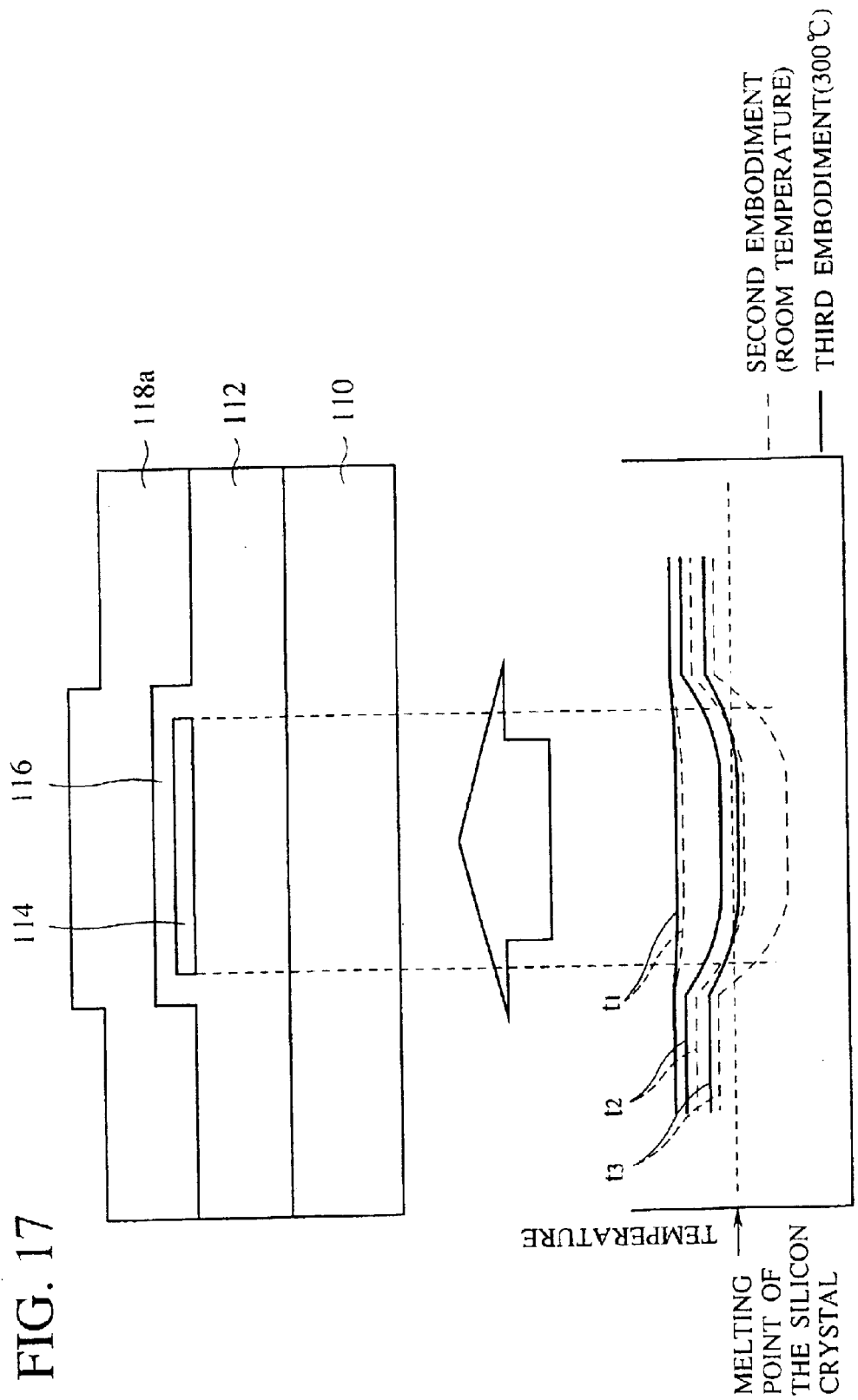
FIG. 17 is a graph of temperatures changes of respective parts after the laser beam application.

The polycrystal silicon thin film forming method according to a fourth embodiment of the present invention will be explained with reference to FIGS. 16A to 17. FIGS. 16A and 16B are sectional views of the polycrystal silicon thin film in the step of the polycrystal silicon thin film forming method according to the present embodiment, which show the process. FIG. 17 is a graph of temperature changes of respective parts after laser beam application. The same members of the present embodiment as those of the polycrystal silicon thin film forming method according to the second or the third embodiment shown in FIGS. 8A to 15 are represented by the same reference numbers not to repeat or to simplify their explanation.

The polycrystal silicon thin film forming method according to the present embodiment is the same as that according to the third embodiment up to the steps of forming the heat reservoir film 118a, and the steps are not explained here.

Then, a glass substrate 110 is heated to 300° C., and short pulsed laser beams are applied to a silicon layer 114 on the side of the underside of the glass substrate 110 to crystallize the silicon layer 114 (see FIG. 16A). Deformation of the glass takes place at a temperature above about 600° C.–700° C., and the glass substrate 110, which has been heated to 300° C., is never deformed.

Temperatures of respective parts after the laser beam application will be explained with reference to FIG. 17. In the graph shown FIG. 17, the broken lines indicate temperatures of the respective parts in the case that glass substrate 110 is set at the room temperature, i.e., in the case of the third embodiment, and the solid lines indicate temperatures of the respective parts in the case that the glass substrate 110 is set at 300° C., i.e., in the case of the present embodiment.

In the present embodiment, the glass substrate 110 is heated to 300° C., and the respective parts of the silicon layer 114 have low cooling speeds. In comparing temperatures of the respective parts of the silicon layer 114 after a period of time $t_2$, in the second embodiment the central part of the silicon layer 114 has a temperature which is lower than the melting point of the silicon crystal, but in the present embodiment the entire silicon layer 114 retains a temperatures higher than the melting point of the silicon crystal. As described above, in the present embodiment the glass substrate 110 is heated to 300° C., and the silicon layer 114 has a low cooling speed. In other words, in the present embodiment the silicon layer 114 takes a longer period of time than in the second and the third embodiment to have a temperature below the melting point of the silicon crystal, and crystals laterally grow in a wide range. Silicon crystals of large grain diameters can be formed.

The silicon layer 114 is thus crystallized, and a polycrystal silicon thin film 114c is formed.

Then, the heat reservoir layer 118a is etched by RIE with the isolation film 116 as an etching stopper.

Next, the isolation film 116 is etched by HF-based wet etching (see FIG. 16B).

Thus a polycrystal silicon thin film is formed by the present embodiment.

(Evaluation Result)

Figure 12B:
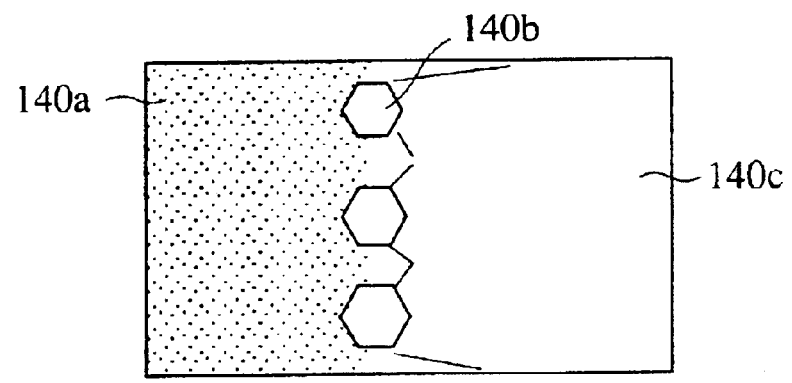

Then, crystal states of the thus-formed polycrystal silicon thin film will be explained with reference to FIG. 12B. FIG. 12B is conceptual views of crystal states of the polycrystal silicon thin film formed by the present embodiment.

As shown in FIG. 12B, in the present embodiment a region where the silicon polycrystals 140c which have laterally grown and have large grain diameters is wider than in the second and the third embodiments shown in FIG. 12A.

As described above, according to the present embodiment the glass substrate is heated to 300° C. and is subjected to the laser beam application, whereby the silicon layer after subjected to the short pulsed laser beam application can have lower cooling speed. As a result, nuclei are formed inside the silicon layer, and crystals laterally grown toward the ends of the silicon layer in a wide range. A polycrystal silicon thin film of polycrystal silicon having large grain diameters can be formed.

[A Fifth Embodiment]

Figure 18A:
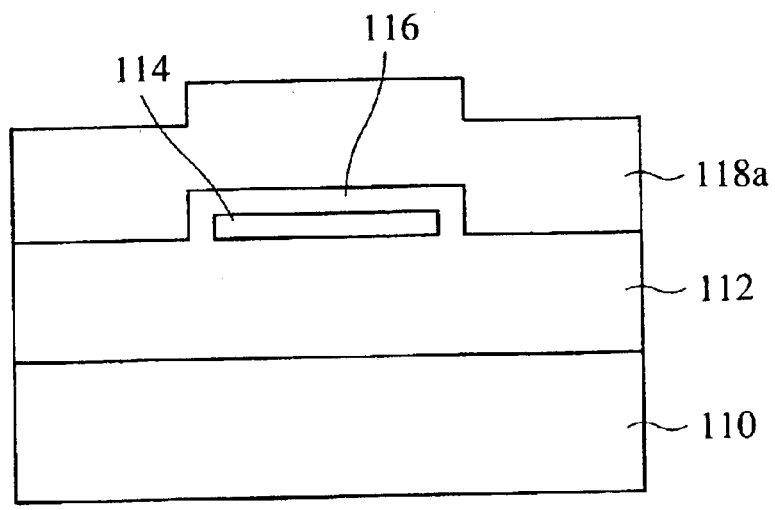
FIGS. 18A and 18B are sectional views of a polycrystal silicon thin film in the steps of the polycrystal silicon thin film forming method according to a fifth embodiment of the present invention.
Figure 18B:
Figure 18B:
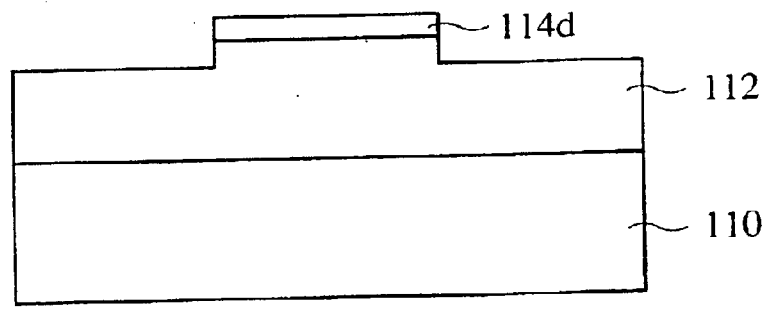

The polycrystal silicon thin film forming method according to a fifth embodiment of the present invention will be explained with reference to FIGS. 18A and 18B. FIGS. 18A and 18B are sectional views of a polycrystal silicon thin film in the steps of the polycrystal silicon thin film forming method according to the present embodiment, which show the process. The same members of the present embodiment as those of the polycrystal silicon thin film forming method according to the second to the fourth embodiments shown in FIGS. 8A to 17 are represented by the same reference numbers not to repeat or to simplify their explanation.

The polycrystal silicon thin film forming method according to the present embodiment is characterized in that a 700 nm-thickness buffer layer 112 is formed on a glass substrate 110, a 100 nm-thickness silicon layer 114 is formed on the buffer layer 112, and short pulsed laser beams are applied with the glass substrate 110 set at a temperature as high as 500° C.

First, the buffer layer 112 of a 700 nm-thickness silicon oxide film is formed on the glass substrate 110 by PECVD. The buffer layer 112 is formed thicker to be 700 nm than in the second to the fourth embodiments, and this is because the silicon layer 114 after subjected to the laser beam application has low cooling speed.

Then, the silicon layer 114 of a 100 nm-thickness amorphous silicon layer on the buffer layer 112 by PECVD. The silicon layer 114 is formed thicker to be 100 nm than in the second to the fourth embodiments, and this is because the silicon layer 114 has a large heat capacity to have low cooling speed.

The following steps of the present embodiment up to the step of forming a heat reservoir film 118a are the same as those of the third embodiment, and their explanation is omitted.

Next, the glass substrate 110 is set at 500° C., and short pulsed laser beams are applied on the side of the underside of the glass substrate 110 to crystallize the silicon layer 114 (see FIG. 18A). Deformation of glass takes place at a temperature above about 600° C.–700° C., and the glass substrate 110 is never deformed when the glass substrate 110 is heated to 500° C. The glass substrate 110, which is heated to 500° C. and is as thick as 100 nm, has low cooling speed. In other words, in the present embodiment the silicon layer 114 can take a longer period of time than in the second to the fourth embodiments to have a temperature lower than the melting point of the silicon crystal. Lateral growth can be realized in a wider range, and silicon crystals having large grain diameters can be formed.

Thus the silicon layer 114 is crystallized, and a polycrystal silicon thin film 114d is formed.

Then, the heat reservoir layer 118a is etched by RIE with the isolation film 116 as an etching stopper.

Next, the isolation film 116 is etched with an HF-based etchant (see FIG. 18B).

Thus a polycrystal silicon thin film is formed by the present embodiment.

(Evaluation Result)

Figure 12C:
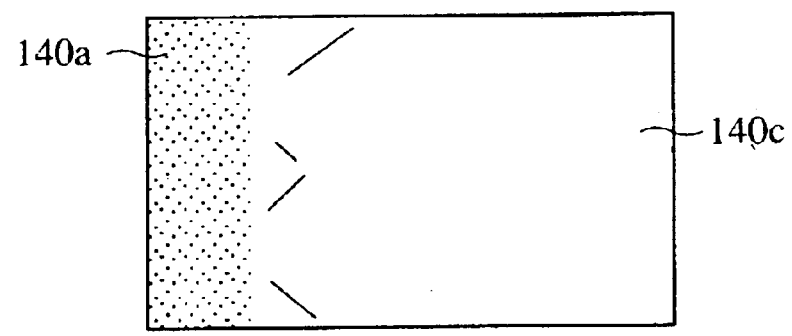

Then, crystal states of the polycrystal silicon thin film formed as described above will be explained with reference to FIG. 12C. FIG. 12C is conceptual views of crystal states of the polycrystal silicon thin film formed by the present embodiment.

As shown in FIG. 12C, in the present embodiment a region where silicon polycrystals 140c laterally grown and having large grain diameters is larger than in the second to the fourth embodiment shown in FIGS. 12A and 12B. None of the silicon polycrystals 140b of large grain diameters observed in FIGS. 12A and 12B are observed in the present embodiment.

As described above, according to the present embodiment, the silicon layer is formed thick, and the laser beams are applied with the glass substrate heated to 500° C., whereby the silicon layer after subjected to the short pulsed laser beam application can have lower cooling speed than in the third embodiment. As a result, nuclei are formed inside the silicon layer, and crystal laterally grow toward the ends of the silicon layer in a wide range. A polycrystal silicon thin film of polycrystal silicon of large grain diameters can be formed.

[A Sixth Embodiment]

Figure 20:
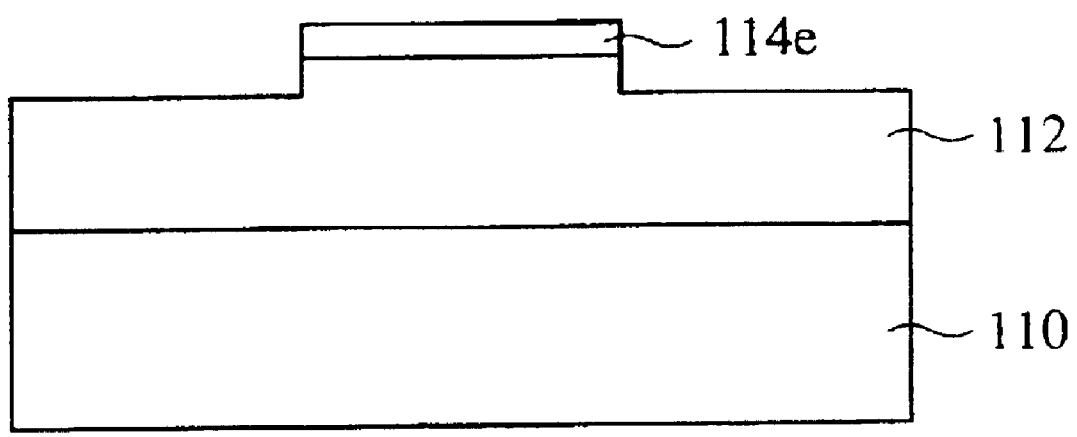
FIG. 20 is sectional view of the polycrystal silicon thin film in the steps of the polycrystal silicon thin film forming method according to the sixth embodiment of the present invention, which show the process (Part 2).

The polycrystal silicon thin film forming method according to a sixth embodiment of the present invention will be explained with reference to FIGS. 19A to 20. FIGS. 19A to 20 are sectional views of a polycrystal silicon thin film in the steps of the polycrystal silicon thin film forming method according to the present embodiment, which show the process. The same members of the present embodiment as those of the second to the fifth embodiments shown in FIGS. 8A to 18B are represented by the same reference numbers not to repeat or to simplify their explanation.

The polycrystal silicon thin film forming method according to the present embodiment is characterized mainly in that an opening 122 is formed in a heat reservoir layer 118a to thereby set cooling speeds of respective parts of a silicon layer 114 at suitable temperatures.

The steps of the present embodiment up to the step of forming the heat reservoir layer 118a are the same as those of the polycrystal silicon thin film forming method according to the fifth embodiment, and their explanation is omitted.

Next, an opening 122 is formed in the heat reservoir layer 118a from the surface thereof down to a depth of 200 nm (see FIG. 19A). A diameter of the opening 122 can be, e.g., 1 μm. A configuration and a depth of the opening 122 can be suitably set so that the respective parts of the silicon layer 114 can be cooled at required cooling speeds.

Next, a glass substrate 110 is heated to 500° C., and short pulsed laser beams are applied on the side of the underside of the glass substrate 110 to crystallize the silicon layer 114 (see FIG. 19B). Because of the opening 122 formed in the heat reservoir layer 118a on the silicon layer 114, the heat reservoir layer 118a has the heat reservoir function lowered, and the silicon layer 114 near the opening 122 has higher cooling speed. On the other hand, vicinities of the ends of the silicon layer 114, which are spaced from the opening 122, the heat reservoir layer 118a have sufficient heat reservoir function. Accordingly, the end vicinities of the silicon layer 114 have lower cooling speed, whereby silicon polycrystals laterally grown and having large grain diameters can be formed in a wider region than in the second to the fifth embodiments.

Thus the silicon layer 114 is crystallized, and a polycrystal silicon thin film 114e is formed.

Next, the heat reservoir layer 118a is etched by RIE with the isolation film 116 as an etching stopper.

Next, the isolation film 116 is etched with an HF-based etchant (see FIG. 20).

Thus the polycrystal silicon thin film is formed by the present embodiment.

(Evaluation Result)

Figure 12D:
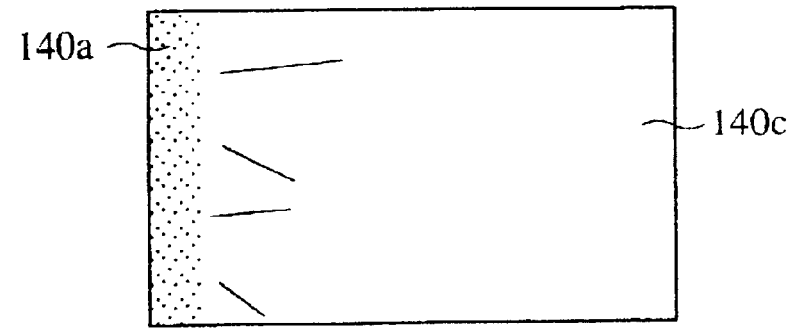

Next, crystal states of the polycrystal silicon thin film as described above will be explained with reference to FIG. 12D. FIG. 12D is conceptual views of the crystal states of the polycrystal silicon thin film formed by the present embodiment.

As shown in FIG. 12D, according to the present embodiment, the region where silicon polycrystals 140c laterally grown and having large grain diameters are formed is wider as shown in FIGS. 12A to 12C than in the first to the fourth embodiments. None of the silicon polycrystals 140b of large grain diameters observed in FIGS. 12A and 12B are observed in the present embodiment.

As described above, according to the present embodiment, because of the opening formed in the heat reservoir layer a temperature gradient takes place widely from the central part of the silicon layer to the ends thereof, whereby a polycrystal silicon thin film having silicon polycrystals of large grain diameters can be formed in a wide range.

[A Seventh Embodiment]

Figure 21:
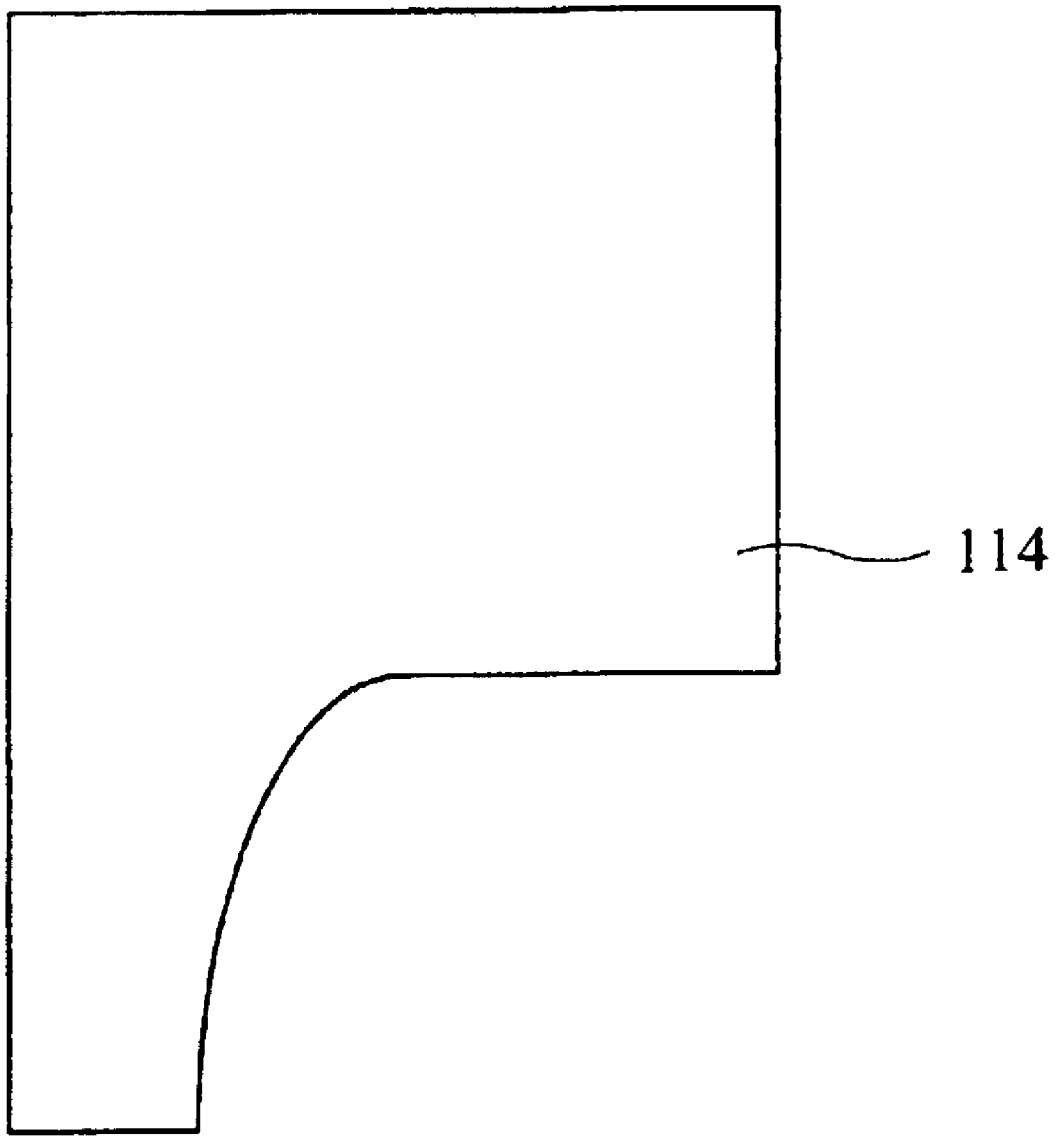
FIG. 21 is a plan view of the silicon layer, which show the polycrystal silicon thin film forming method according to a seventh embodiment of the present invention.
Figure 22:
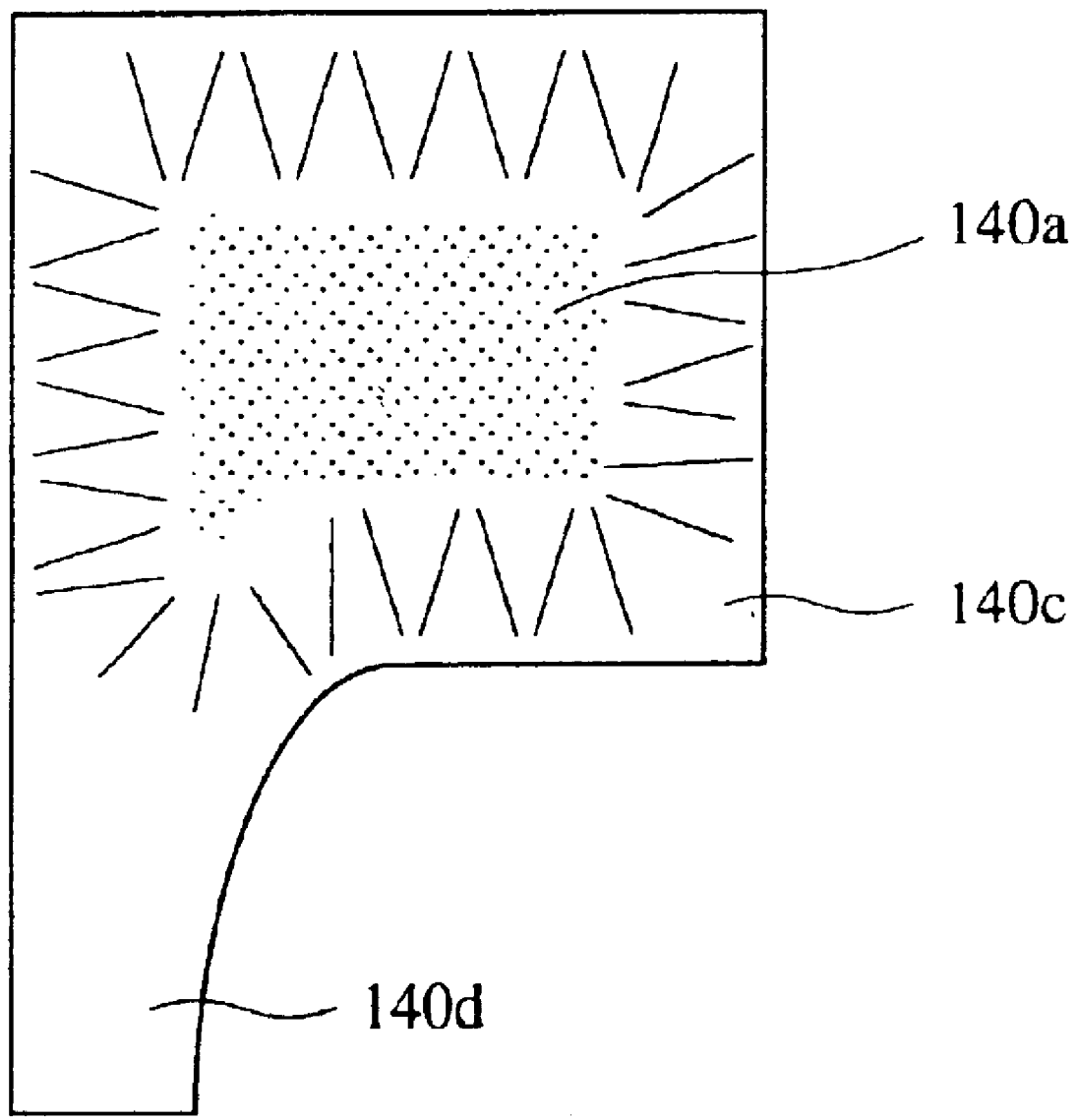
FIG. 22 is conceptual view of crystal states of the polycrystal silicon thin film.

The polycrystal silicon thin film forming method according to a seventh embodiment of the present invention will be explained with reference to FIGS. 21 and 22. FIG. 21 is a plan view of a polycrystal silicon thin film, which show the polycrystal silicon thin film forming method according to the present embodiment. FIG. 22 is a conceptual view of crystal states of the polycrystal silicon thin film formed by the present embodiment. The same members of the present embodiment as those of the polycrystal silicon thin film forming method according to the second to the sixth embodiments shown in FIGS. 8A to 20 are represented by the same reference numbers not to repeat or simplify their explanation.

The polycrystal silicon thin film forming method according to the present embodiment is characterized in that, as shown in FIG. 21, a silicon layer 114 does not have a rectangular plane shape, and is characterized by a partially reduced width.

The steps of the present embodiment up to the step of forming a heat reservoir layer 118a are the same of those of the polycrystal silicon thin film forming method according to the fifth embodiment, and their explanation is omitted. However, the polycrystal silicon thin film forming method according to the present embodiment is different from that according to the fifth embodiment in that, in the former, when the silicon layer 114 is patterned, the silicon pattern 114 is patterned in the plane shape as shown in FIG. 21. That is, in the present embodiment the silicon layer 114 has a partially reduced width. The silicon layer 114 can have, e.g., a 5 μm-width which is extended left to right as viewed in the drawing. The silicon layer 114 can have e.g., a 5 μm-length at the larger-width region, which is extended up to down as viewed in the drawing. The silicon layer 114 has a 100 nm-thickness as in the fifth embodiment.

Then, a glass substrate 110 is heated to 500° C., and short pulsed laser beams are applied on the side of the underside of the glass substrate 110, whereby the silicon layer 114 is crystallized.

Then, the heat reservoir layer 118a is etched by RIE with an isolation film 116 as an etching stopper.

Next, the isolation film 116 is etched with an HF-based etchant.

Thus, a polycrystal silicon thin film is formed by the present embodiment.

(Evaluation Result)

Then, crystal states of the polycrystal silicon thin film formed as described above will be explained with reference to FIG. 22.

As shown in FIG. 22, the central part of the silicon layer 114, which is in the larger-width region, is a tiny grain diameter-polycrystal silicon region 140a.

On the other hand, in vicinities of the ends of the silicon layer 114 in the larger width-region, silicon polycrystals 140c laterally grown and having large grain diameters are formed toward the ends in a wide range.

In a vicinity of a region between the larger-width region and the smaller-width region crystals laterally grew from one point inside the silicon layer toward the ends thereof, and the crystals are monocrystals.

In the smaller-width region the heat reservoir of the heat reservoir layer 118a is more effective, and crystals grow laterally downward as viewed in the drawing, and silicon monocrystals 140d are formed.

As described above, according to the present embodiment, the silicon layer is patterned to have a smaller width partially in a region, whereby silicon monocrystals can be formed in the smaller-width region of the silicon layer.

[An Eighth Embodiment]

The thin film transistor fabrication method according to an eighth embodiment of the present invention will be explained with reference to FIGS. 23A to 26B. FIGS. 23A to 26B are sectional views of a thin film transistor in the steps of the thin film transistor fabrication method according to the present embodiment, which show the process. The same members of the present embodiment as those of the polycrystal silicon thin film forming method according to the second to the seventh embodiments shown in FIGS. 8A to 22 are represented by the same reference numbers not to repeat or to simplify their explanation.

The thin film transistor fabrication method according to the present embodiment is characterized mainly in that the polycrystal silicon thin film formed by the second to the seventh embodiments is used as the channel layer of the thin film transistor.

First, a polycrystal silicon thin film is formed by the polycrystal silicon thin film forming method according to any one of the second to the seventh embodiments. Here, the channel layer 124 is formed of a polycrystal silicon thin film of a 3 μm-length and a 5 μm-width formed by the polycrystal silicon thin film 114e forming method according to the fifth embodiment (see FIG. 23A).

Next, a gate oxide film 126 of a 120 nm-thickness silicon oxide film is formed on the entire surface by PECVD. The gate oxide film 126 may be formed by LP (Low Pressure) CVD, sputtering or others (see FIG. 23B).

Figure 23A:
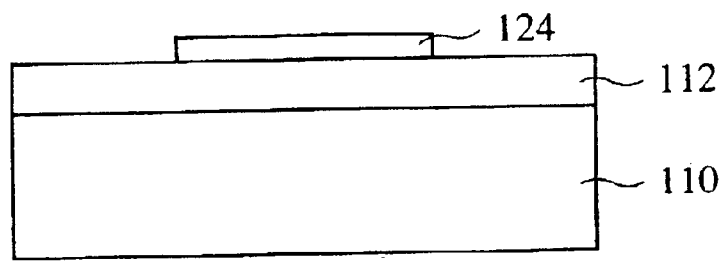
FIGS. 23A to 23C are sectional views of a thin film transistor in the steps of the thin film transistor fabrication method according to a eighth embodiment of the present invention (Part 1).
Figure 23B:
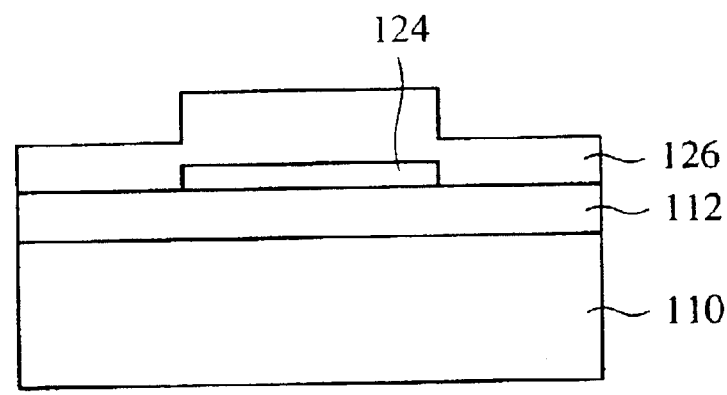
Figure 23C:
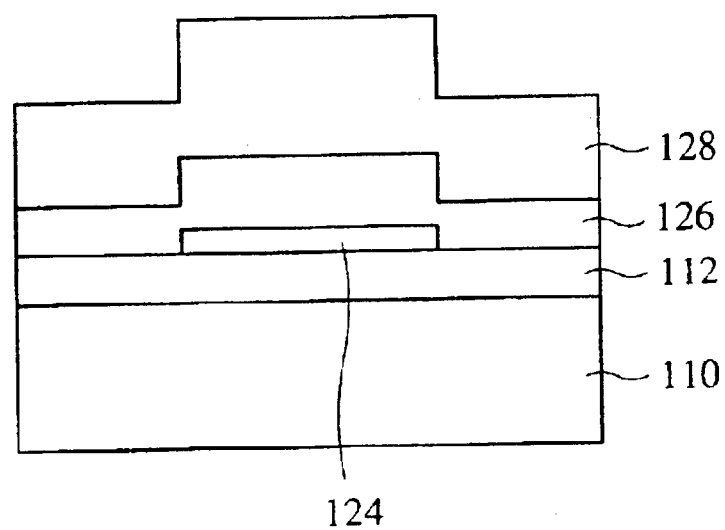

Next, a 300 nm-thickness aluminum layer 128 is formed on the entire surface by sputtering (see FIG. 23C).

Figure 24A:
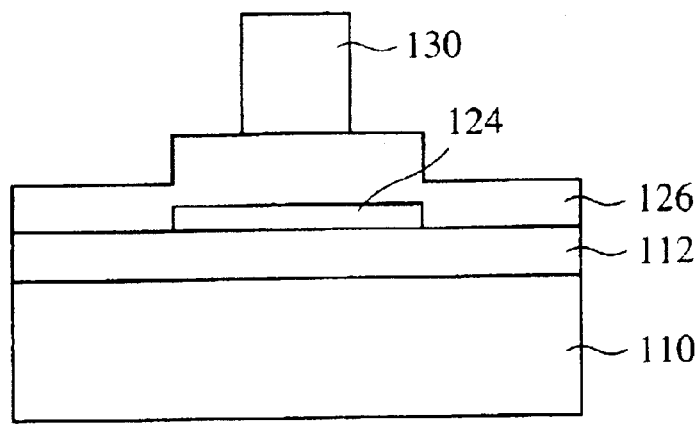
FIGS. 24A to 24C are sectional views of the thin film transistor in the steps of the thin film transistor fabrication method according to the eighth embodiment of the present invention (Part 2).

Then, the aluminum layer 128 is patterned into a configuration of a gate electrode 130 by photolithography (see FIG. 24A).

Figure 24B:
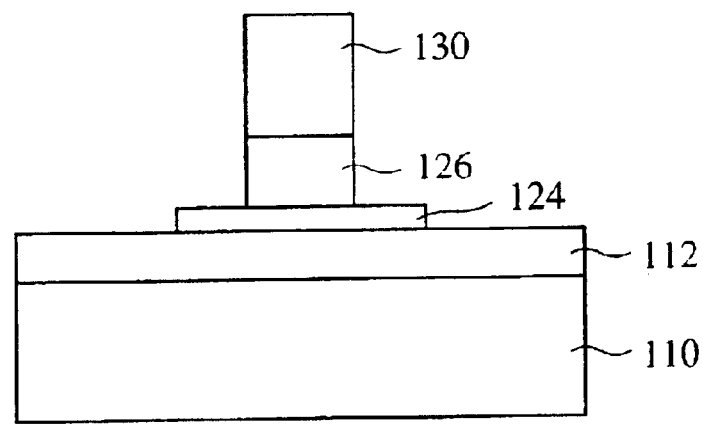
Figure 24C:
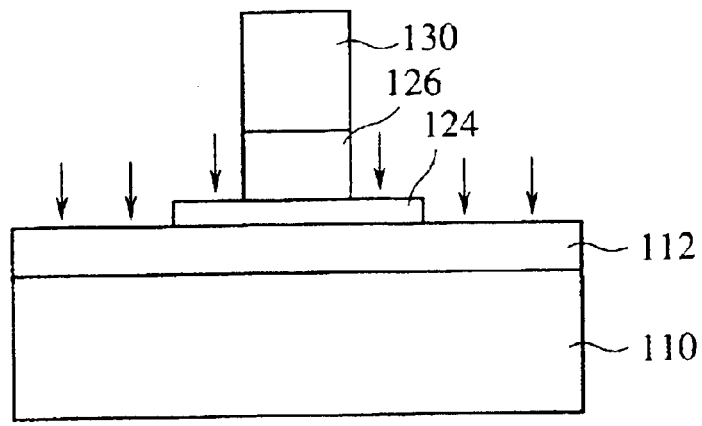

Then, the gate oxide film 126 is etched by self-alignment with the gate electrode 130 (see FIG. 24B).

Then, dopant ions are implanted in the channel layer 124 by self-alignment with the gate electrode 130. A dopant can be, e.g., phosphorus.

Figure 25A:
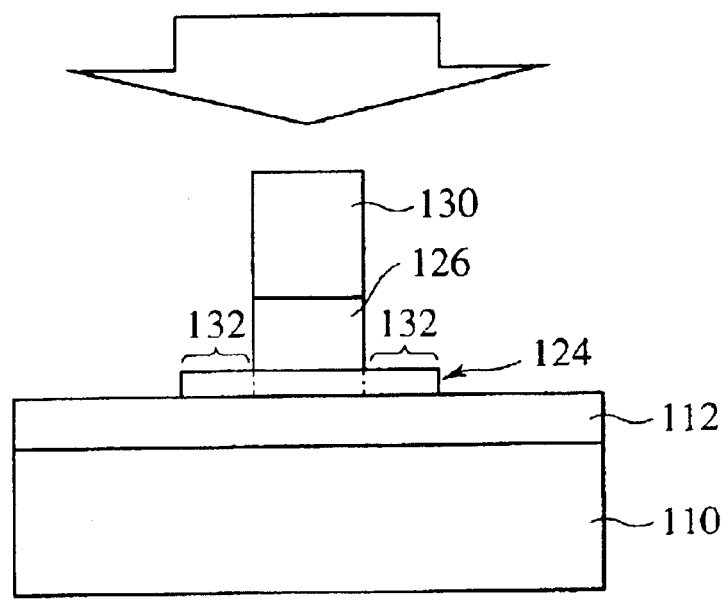
FIGS. 25A and 25B are sectional views of the thin film transistor in the steps of the thin film transistor fabrication method according to the eighth embodiment of the present invention (Part 3).
Figure 25B:
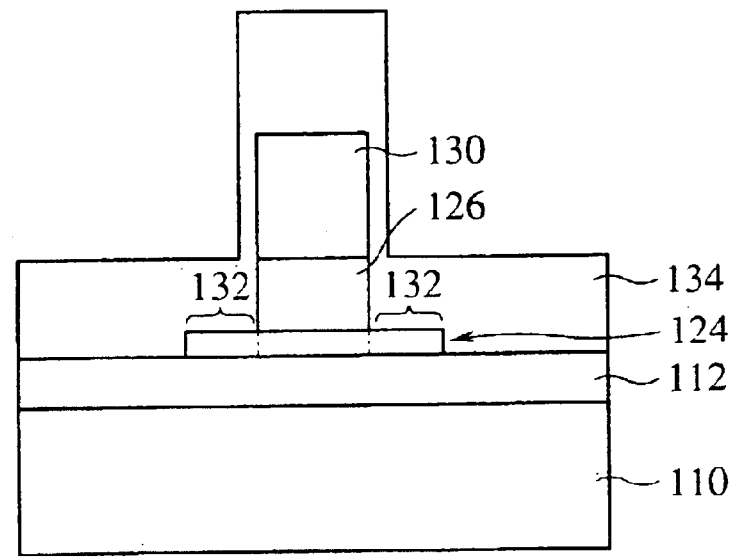
Figure 26A:
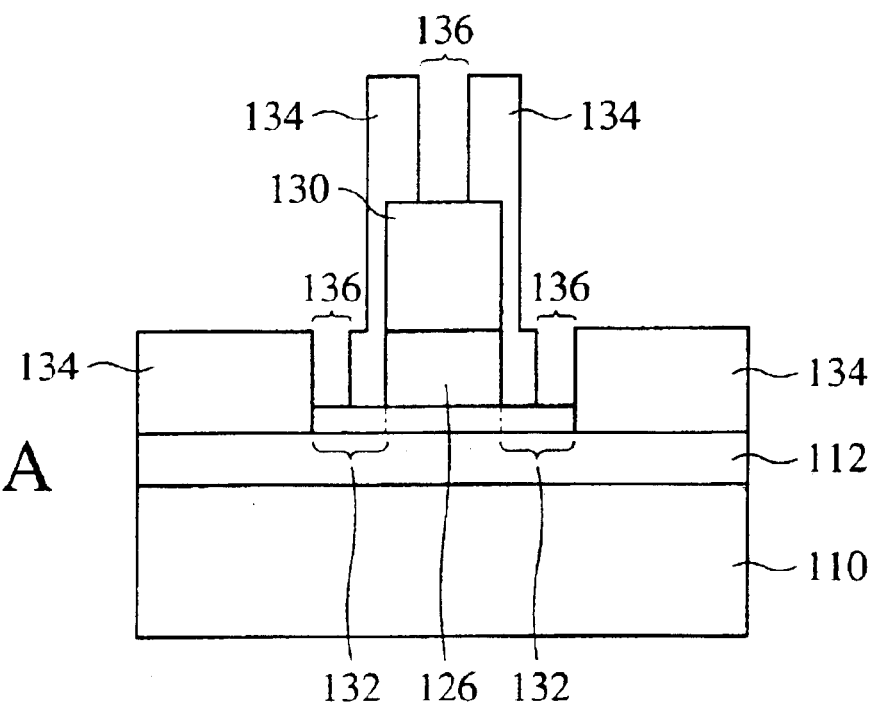
FIGS. 26A and 26B are sectional views of the thin film transistor in the steps of the thin film transistor fabrication method according to the eighth embodiment of the present invention (Part 4).
Figure 26B:
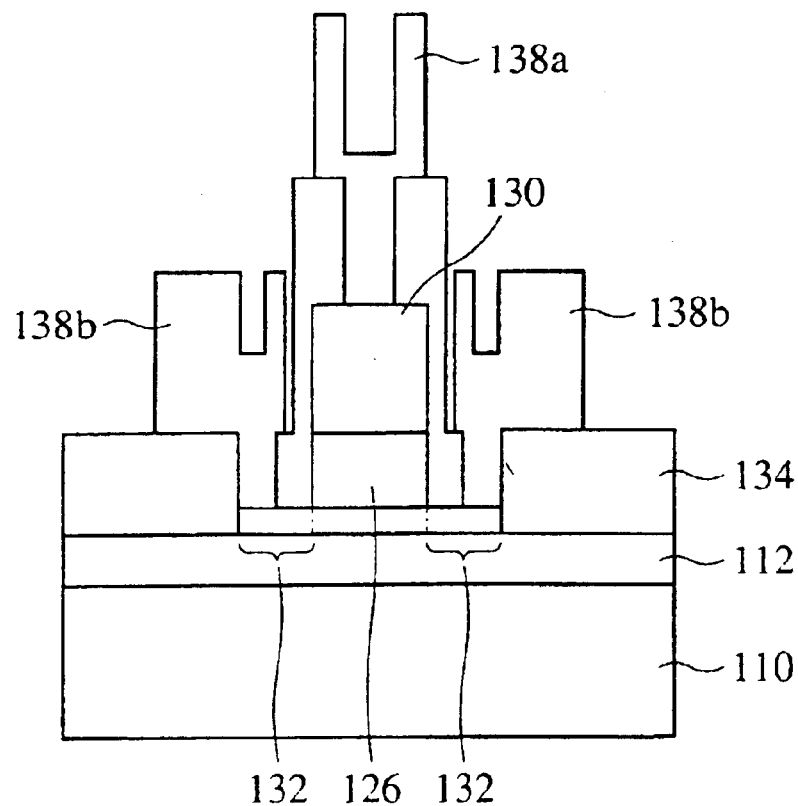

Then, excimer laser beams are applied on the side of the upper surface of the glass substrate 110 to activate the dopant implanted in the channel layer 124. Thus a source/drain diffusion layer 132 is formed by self-alignment with the gate electrode 130 (see FIG. 25A). Next, an inter-layer insulation film 134 of an 300 nm-thickness SiN film is formed on the entire surface (FIG. 25B).

Then, contact holes 136 respectively reaching the source/drain diffusion layer 132 and the gate electrode 130 are formed in the inter-layer insulation film 134.

Subsequently, a conducting layer of a 100 nm-thickness Ti film, a 200 nm-thickness Al film and a 100 nm-thickness Ti film laid on one another on the entire surface is formed.

Next, the conducting layer is patterned by photolithography, and a gate electrode 138a and a source/drain electrode 138b of the conducting layer are formed.

Thus, a thin-film transistor according to the present embodiment is fabricated.

(Evaluation Result)

Next, electron mobility of the thus-fabricated thin film transistor was measured.

As a result the electron mobility could have a high value of 300 cm$^2$/Vs.

As described above, according to the present embodiment, a polycrystal silicon thin film having large grain diameters formed as described above is used as the channel layer, whereby the thin film transistor can have high electron mobility.

[A Ninth Embodiment]

If generation of grain boundaries, which causes electron mobility decrease, can be depressed, higher electron mobilities can be obtained, and semiconductor devices can have higher achievements. To this end, an active semiconductor film is formed of large crystal grains of large grain diameters, and a monocrystal semiconductor is the most desirable one.

In the ninth embodiment of the present invention, an active semiconductor film has at least the channel region formed of large-diameter crystal grains whose growth directions are controlled. The generation of grain boundaries which are normal to a current direction is thus suppressed, whereby a substantially monocrystal semiconductor, i.e., a quasi-monocrystal semiconductor having a crystal state which contains only grain boundaries having inclinations of not more than 90° to a current direction.

In order to form large-diameter crystal grains it is necessary to make the cooling rate of a melt low by any means. As one of the means, a heat retaining film having a large heat capacity is formed, and a film to be crystallized is positioned in contact with or very near the heat retaining film, in addition thereto, so that a temperature distribution is formed over silicon islands. Thus, a cooling temperature is made low, and the temperature distribution is controlled, whereby positions where nuclei are formed, and directions of the crystal growth can be controlled. Large-diametercrystal grains can be formed. In the present embodiment, a heat retaining film which has a large heat capacity and functions as a heat bath is formed on the side surfaces of an islands structure-semiconductor film which is to be a material of an operating semiconductor film is formed, and energy beams are applied from above, whereby the melt can have a low cooling rate, and, in addition, a temperature distribution of the semiconductor film is controlled so as to control nuclei forming positions and crystal growth directions. Thus, an operating semiconductor film having large grain diameters and a substantially quasi-monocrystal state can be formed.

In the ninth embodiment of the present invention, a semiconductor device is exemplified by a thin film transistor (TFT), and a structure of the TFT and a method for fabricating the TFT will be explained. In describing the method for fabricating the TFT, first the structure of an active semiconductor film of the TFT, which characterizes the present invention and the method for forming the active semiconductor film will be explained.

FIGS. 27 and 28 are sectional views of the active semiconductor film in the steps of the method for forming the active semiconductor film, which explain the method.

Figure 27A:
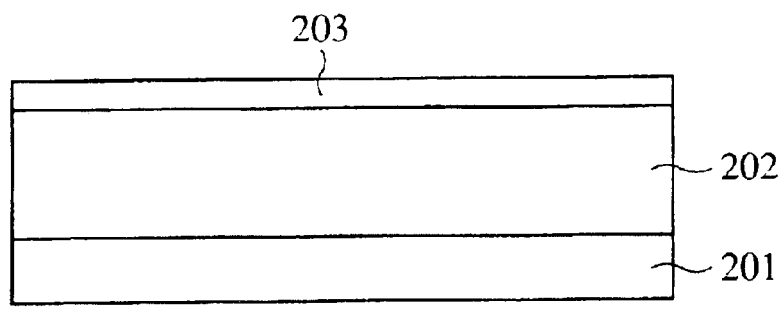
FIGS. 27A to 27D are sectional views of the active semiconductor film according to the ninth embodiment of the present invention in the steps of the method for forming the active semiconductor film, which explain the method (Part 1).

First, as shown in FIG. 27A, a silicon oxide film 202 to be a buffer layer is formed in an about 200 nm-thickness on a glass substrate 201, and then an amorphous silicon film 203 as the semiconductor film is formed in an about 80 nm-thickness by PECVD (Plasma Enhanced Chemical Vapor Deposition). It is preferable in relationship with a thickness of a heat retaining film which will be described later that the amorphous silicon film 203 has a thickness of 30–200 nm. Then, for removing hydrogen, the glass substrate 201 is heat-treated at 450° C. for 2 hours.

Figure 27B:
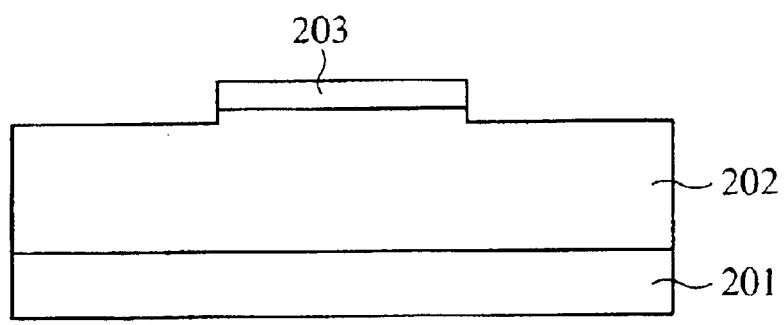

Subsequently, as shown in FIG. 27B, the amorphous silicon film 203 is processed into an island. In the present embodiment, the patterning is made by photolithograph and dry etching so that a sectional part corresponding to a channel region in the drawing has a gradually reduced width. Over-etching is performed.

Figure 27C:
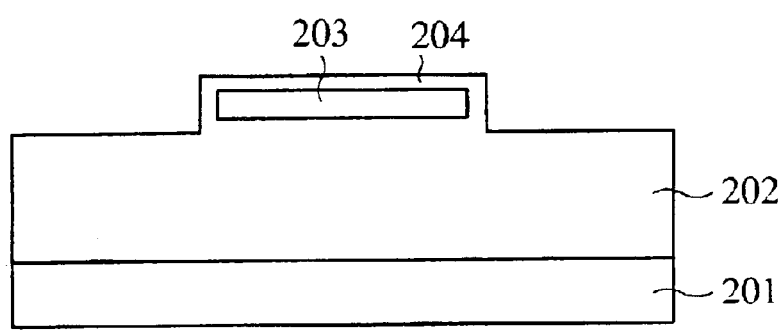

Subsequently, as shown in FIG. 27C, a silicon oxide film 204 to be an isolation film is formed in an about 30 nm-thickness by PECVD on all the surfaces (the side surfaces and the upper surface) of the amorphous silicon film 203.

Figure 27D:
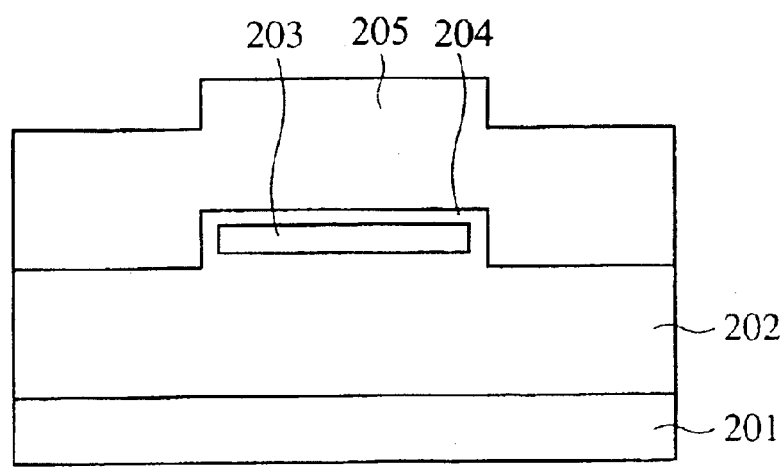

Then, as shown in FIG. 27D, an amorphous silicon film is formed in an about 300 nm-thickness by PECVD, covering the amorphous silicon film 203 through the silicon oxide film 204, and the amorphous silicon film is transformed to a polycrystal silicon film 205 by metal induced solid-phase growth using nickel (Ni). A metal impurity for inducing the solid-phase growth may be other than Ni. At this time, a solid-phase growth temperature is 570° C., and a thermal processing time is 8 hours. This processing transforms the about 300 nm-thickness amorphous silicon film to the polycrystal silicon film 205. The amorphous silicon film 203 covered with the silicon oxide film 204 which is the isolation film remains amorphous because the silicon oxide film 204 prevents the diffusion of the Ni.

It is possible that the polycrystal silicon film 205 is initially formed by chemical vapor phase growth or physical deposition.

The heat retaining film 205 is not essentially polycrystal silicon film and may remain amorphous silicon. The heat retaining film 205 may be formed of another material.

Figure 28A:
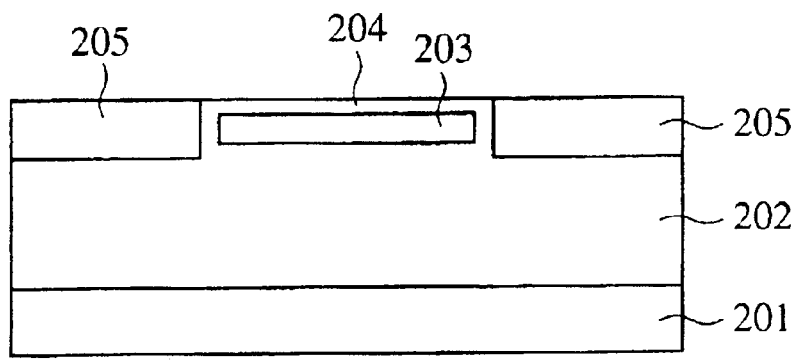
FIGS. 28A to 28D are sectional views of the active semiconductor film according to the ninth embodiment of the present invention in the steps of the method for forming the active semiconductor film, which explain the method (Part 2).

Next, as shown in FIG. 28A, the polycrystal silicon film 205 is polished by CMP (Chemical Mechanical Polishing) to planarize the surface thereof. At this time, the silicon oxide film 204 functions as a stopper of the CMP, and the CMP stops on the silicon oxide film 204, whereby the surface can be planarized.

Figure 28B:
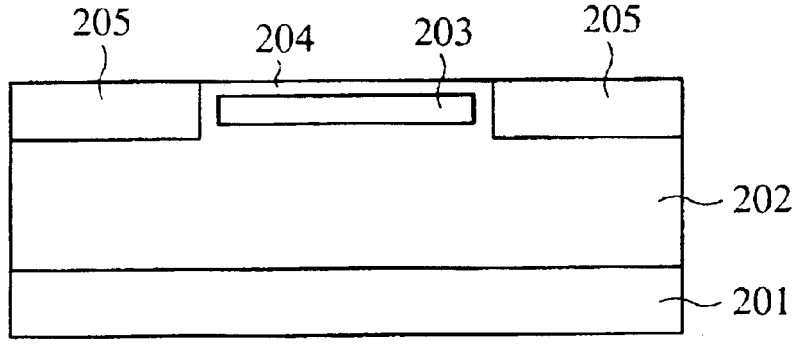

Subsequently, as shown in FIG. 28B, excimer laser beams as energy beams are applied from above to the amorphous silicon film 203 with the side surfaces surrounded by the polycrystal silicon film 205 as the heat retaining film through the silicon oxide film 204 to thereby crystallize the amorphous silicone film 203.

Figure 29:
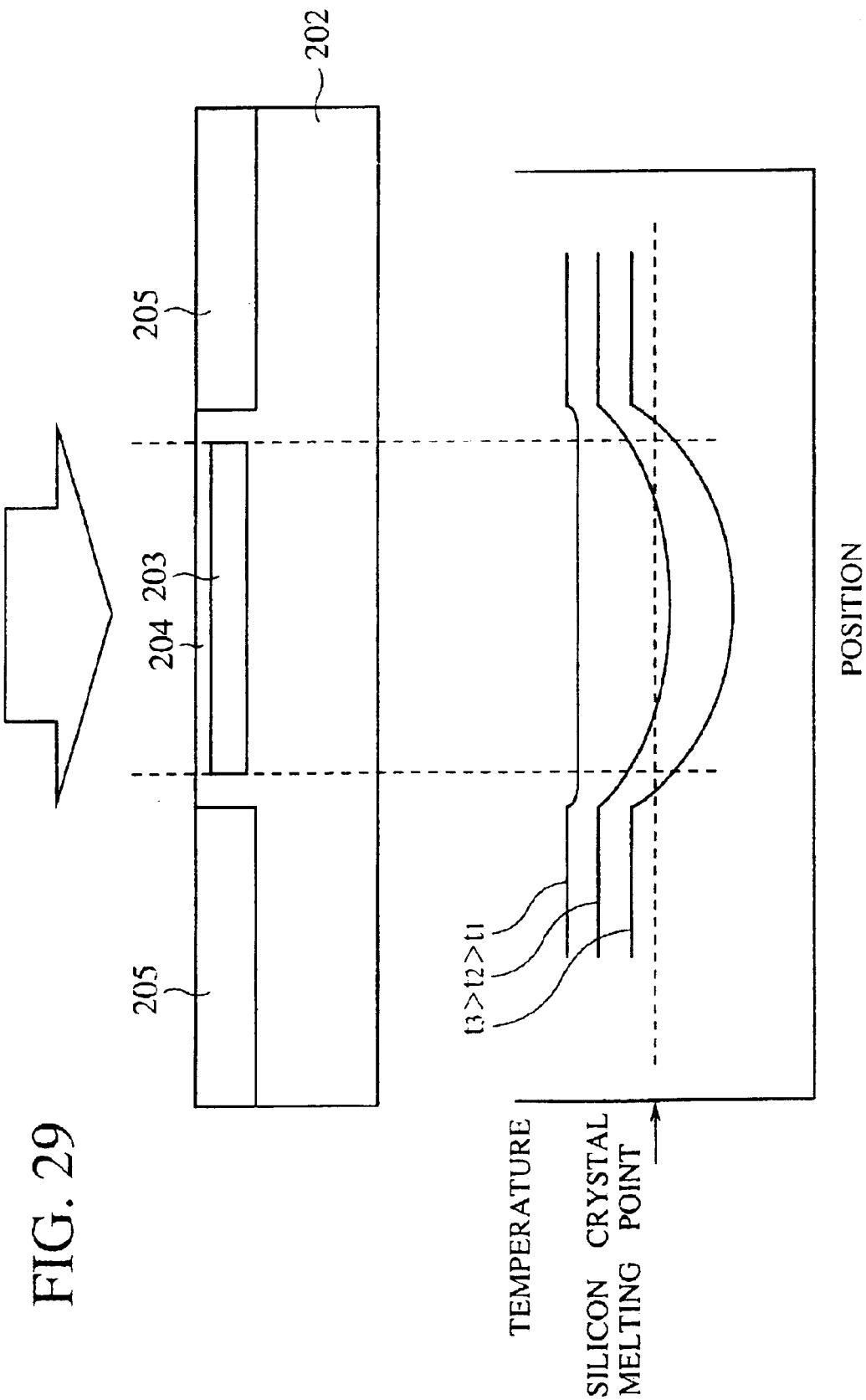
FIG. 29 is a schematic view of temperature distributions in the amorphous silicon film upon the crystallization.
Figure 30:
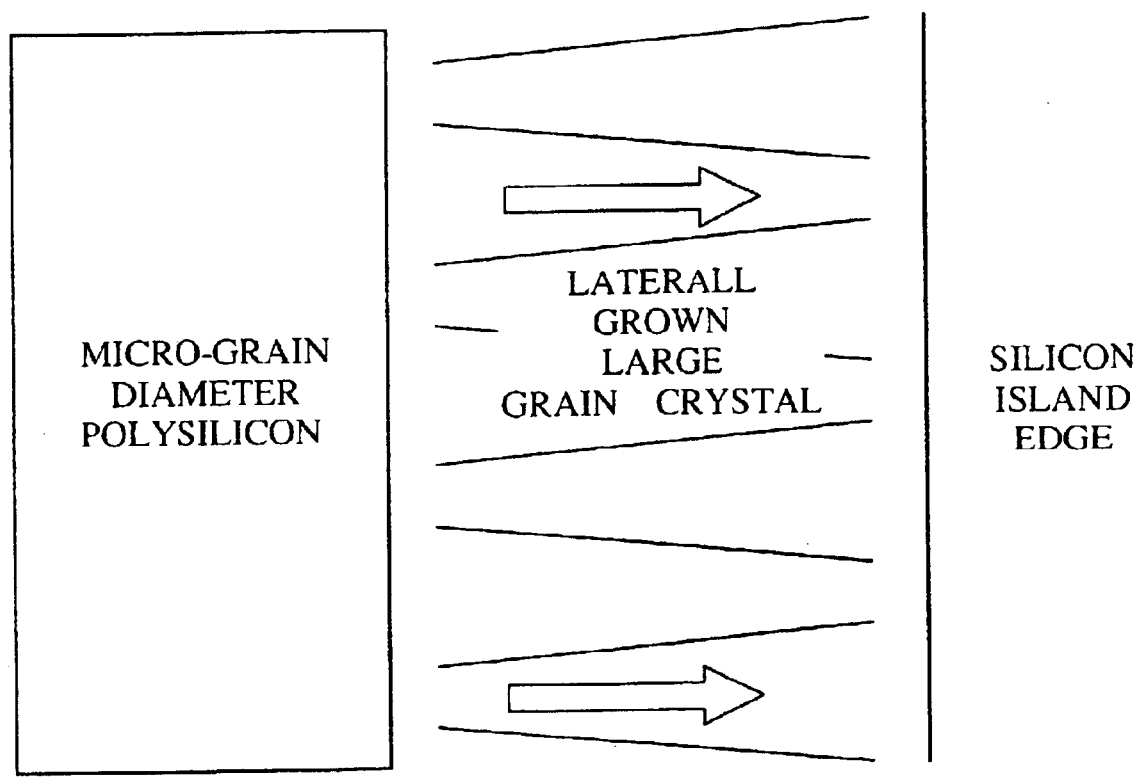
FIG. 30 is a schematic view of advance of the crystallization in the amorphous silicon film from the inside toward the edge.

A temperature distribution in the amorphous silicon film 203 at the time of the crystallization is as shown in FIG. 29. At a time $t_1$ immediately after the laser beam application a temperature difference between the amorphous silicon film 203 and the heat retaining film (polycrystal silicon film) 205 is very small. As the time passes to a time $t_2$ and to $t_3$, temperature drop rates of the amorphous silicon film 203 become remarkably larger than those of the heat retaining film 205. This is because the heat retaining film 205 is thicker than the amorphous silicon film 203, and has a larger heat capacity. Accordingly, the heat retaining film 205 has lower cooling speed in comparison with the amorphous silicon film 203, and can function as a thermal bath. Accordingly, a temperature gradient is formed in the amorphous silicon film 203 from the edges toward the inside. Specifically, a temperature distribution in which the amorphous silicon film 203 has higher-temperatures near the edges and has temperatures which are lower toward the inside. Resultantly, as shown in FIG. 30, the crystallization of the amorphous silicon film 203 is delayed at the edges and advances from the inside toward the edges.

Figure 31:
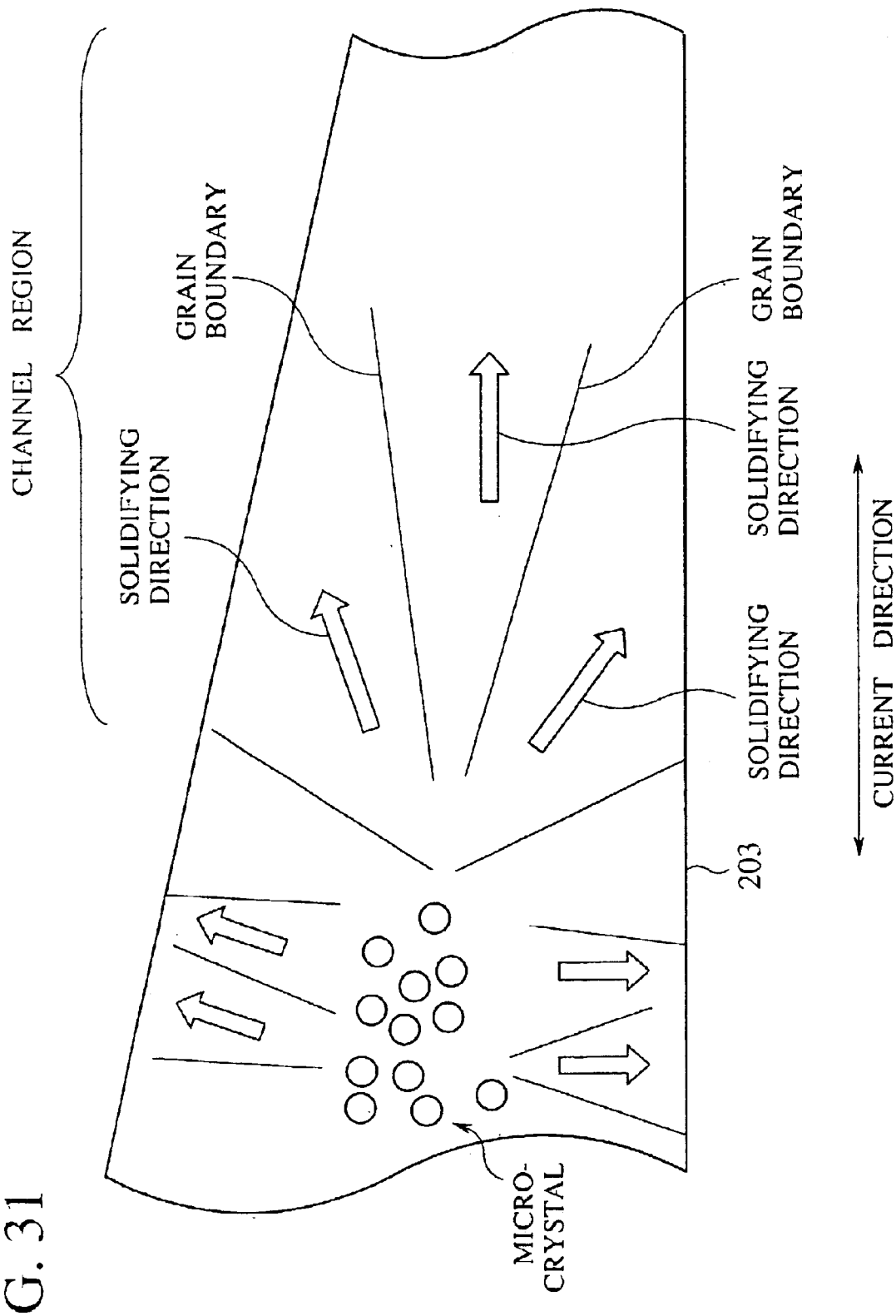
FIG. 31 is a diagrammatic plan view of a part of the amorphous silicon film, which is to be a channel region where a width of the amorphous silicon film is gradually reduced, which shows directions of generation of grain boundaries there.

At this time, as shown in FIG. 31, in the part of the amorphous silicon film 203 to be the active semiconductor film, which corresponds to the channel region of the active semiconductor film, the solidification advances along the edges (in the longitudinal direction), and large-diameter grains having the growth directions controlled are formed while grain boundaries are formed in the direction of the solidification. That is, a few grain boundaries are formed only in the direction of current flow, and few grain boundaries are formed in the direction normal to the current flow direction. The active semiconductor film 211 can be formed of quasi-monocrystal silicon, which is substantially monocrystal.

Figure 32A:
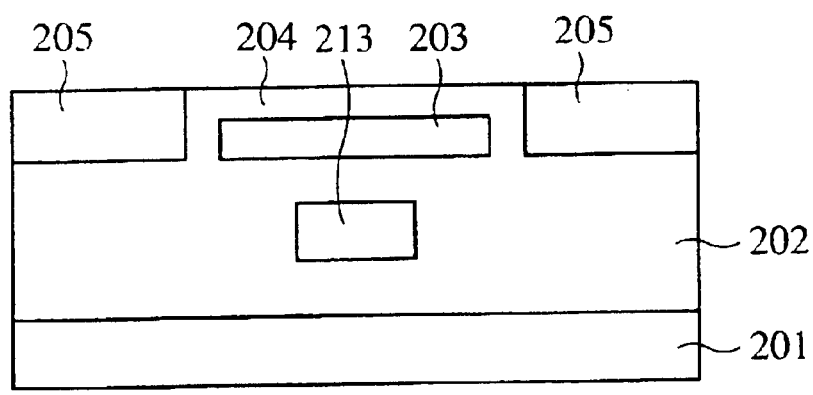
FIGS. 32A and 32B are diagrammatic plan views of an example that a heat absorbing body of an insulating material buried in a silicon oxide film for isolation.

Here, in order to control the temperature distribution of the amorphous silicon film 203, as shown in FIG. 32A, a heat absorbing body 213 formed of an insulating material may be buried in the silicon oxide film 202 below the amorphous silicon film 203. The amorphous silicon film 203 has a higher temperature decrease rate, and a large temperature distribution can be formed, and the quasi-monocrystallization can be ensured.

Figure 28C:
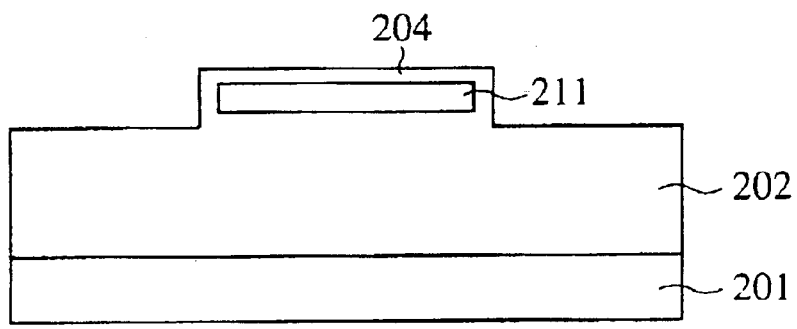
Figure 28D:
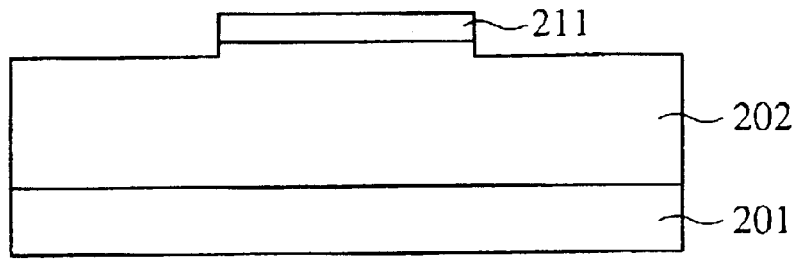

Subsequently, as shown in FIG. 28C, the heat retaining film 205 is removed by dry etching. At this time, the active semiconductor film 211 covered by the silicon oxide film 204 is not etched because of the silicon oxide film 204 functioning as the isolation film disposed between the active semiconductor film 211 and the heat retaining film 205. Then, as shown in FIG. 28D, the silicon oxide film 204 is peeled off by wet etching using HF, and the active semiconductor film 211 is completed.

[Modifications]

Here, taking into consideration good crystal growth, quasi-monocrystal silicon film having different pattern shapes will be explained.

[A First Modification]

A first modification will be explained. The method for forming the sample is the same as described above, and will not repeated here.

Figure 33A:
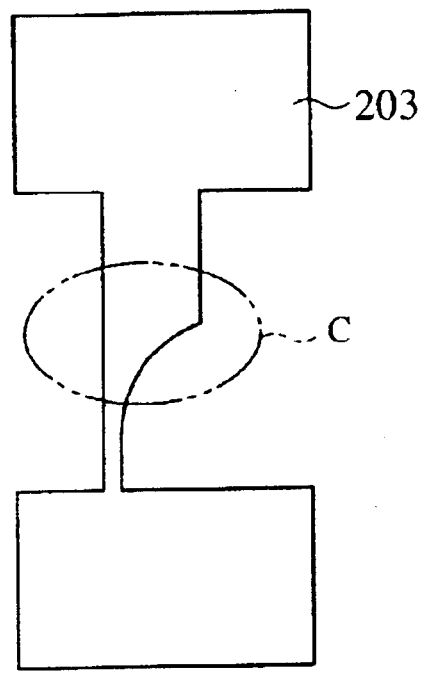
FIGS. 33A and 33B are diagrammatic plan views of the amorphous silicon film of Modification 1 of the ninth embodiment of the present invention.
Figure 33B:
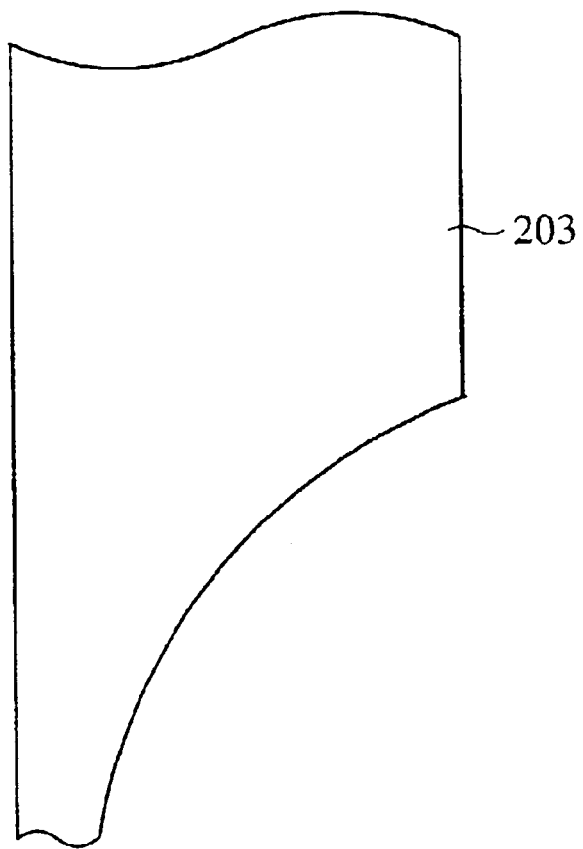

As shown in FIGS. 33A and 33B, the amorphous silicon film 203 is patterned in an island having the central part, i.e., to be the channel region which gradually decreases a width. FIG. 33B is an enlarged view of the part in the circle C in FIG. 33A.

Figure 34:
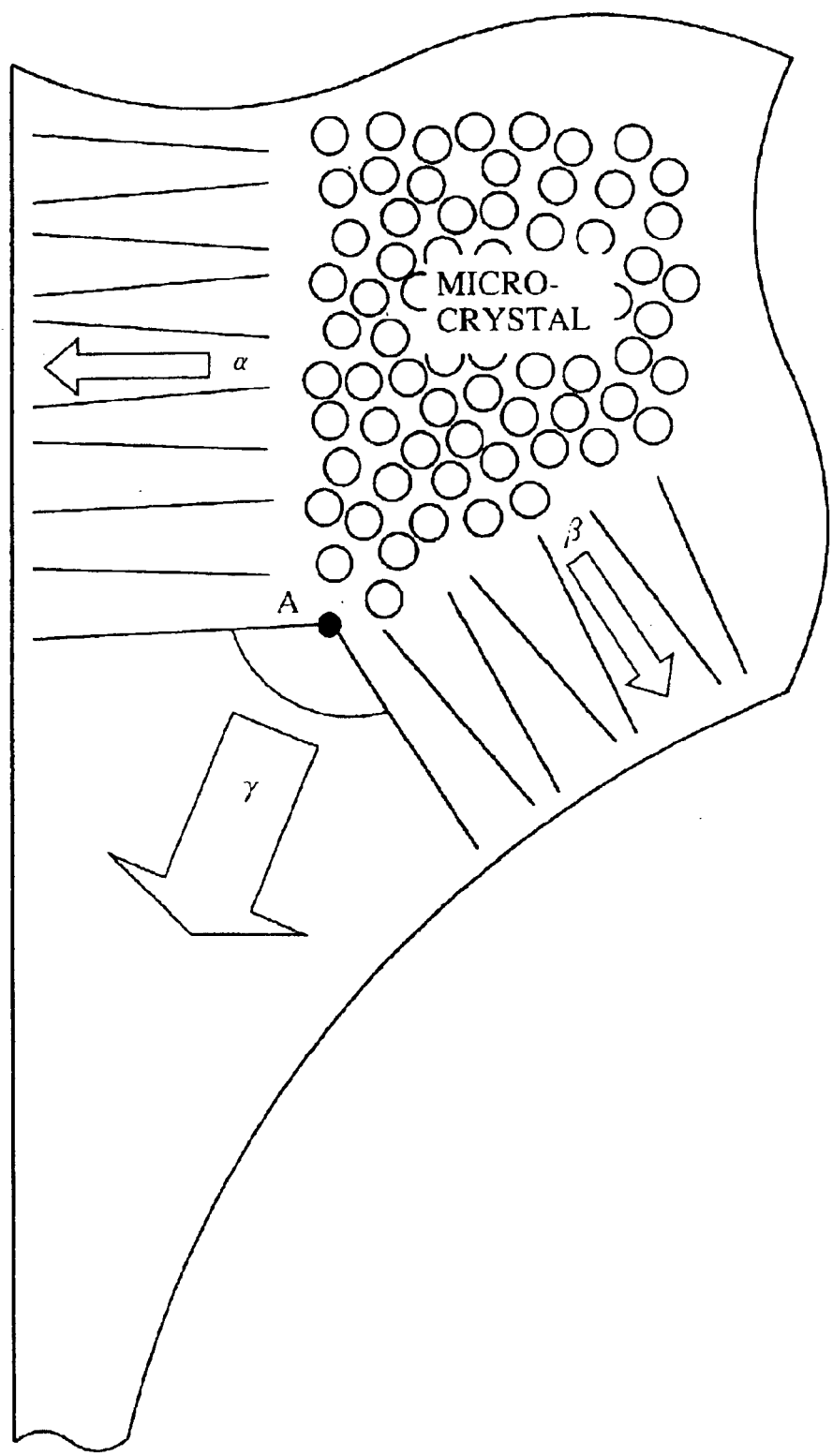
FIG. 34 is a diagrammatic plan view of the amorphous silicon film according to Modification 1 of the ninth embodiment of the present invention, which shows a mechanism of the crystal growth.

As shown in FIG. 34, a mechanism for the crystal growth at this time is lateral growth from the inside toward the edges of the amorphous silicon film 203 as described in the ninth embodiment. At the point A in FIG. 34, crystals can grow laterally toward both edges. Accordingly, one crystal nucleus is formed at the point A, and one monocrystal is formed in a region which is twice a lateral growth distance. In the region having a width further reduced, the heat retaining effect of the heat retaining film 205 at the edges is stronger, and the solidification becomes slow. The one monocrystal grain propagates to the reduced-width region, and one monocrystal grain goes on being formed in the part having the width gradually reduced. This is similar to the growth mechanism shown in FIG. 31.

[A Second Modification]

Next, a second modification will be explained. The method for forming the sample is substantially the same as described above, and the method will not be repeated here.

Figure 35:
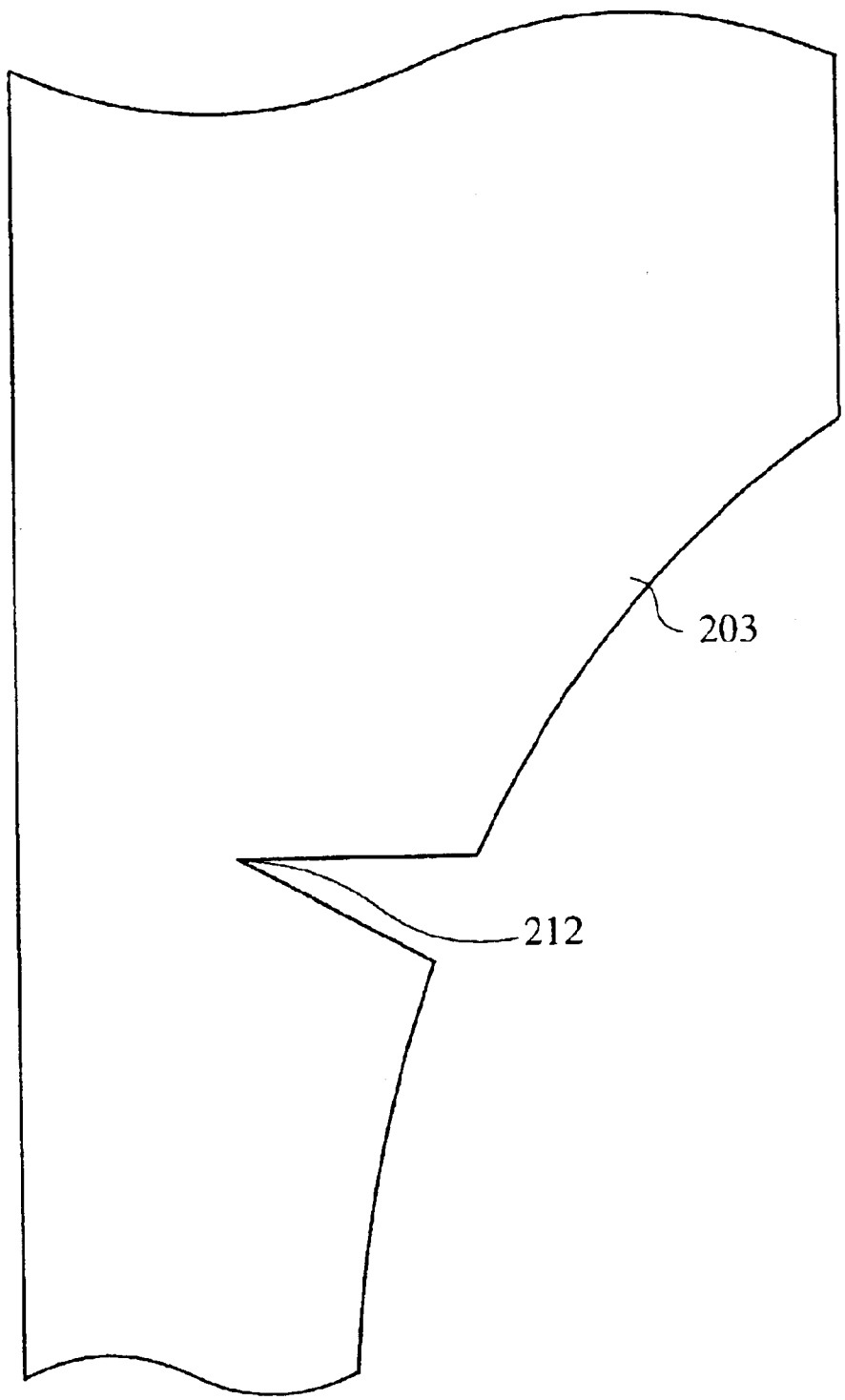
FIG. 35 is a diagrammatic plan view of the amorphous silicon film according to Modification 2 of the ninth embodiment of the present invention.

As shown in FIG. 35, the amorphous silicon film 203 is patterned in an island which has a width gradually reduced in a region where the amorphous silicon film 203 is to be the channel region, and has a neck part 212 formed by a cut. FIG. 35 corresponds to the part in the above-described circle C.

Figure 36:
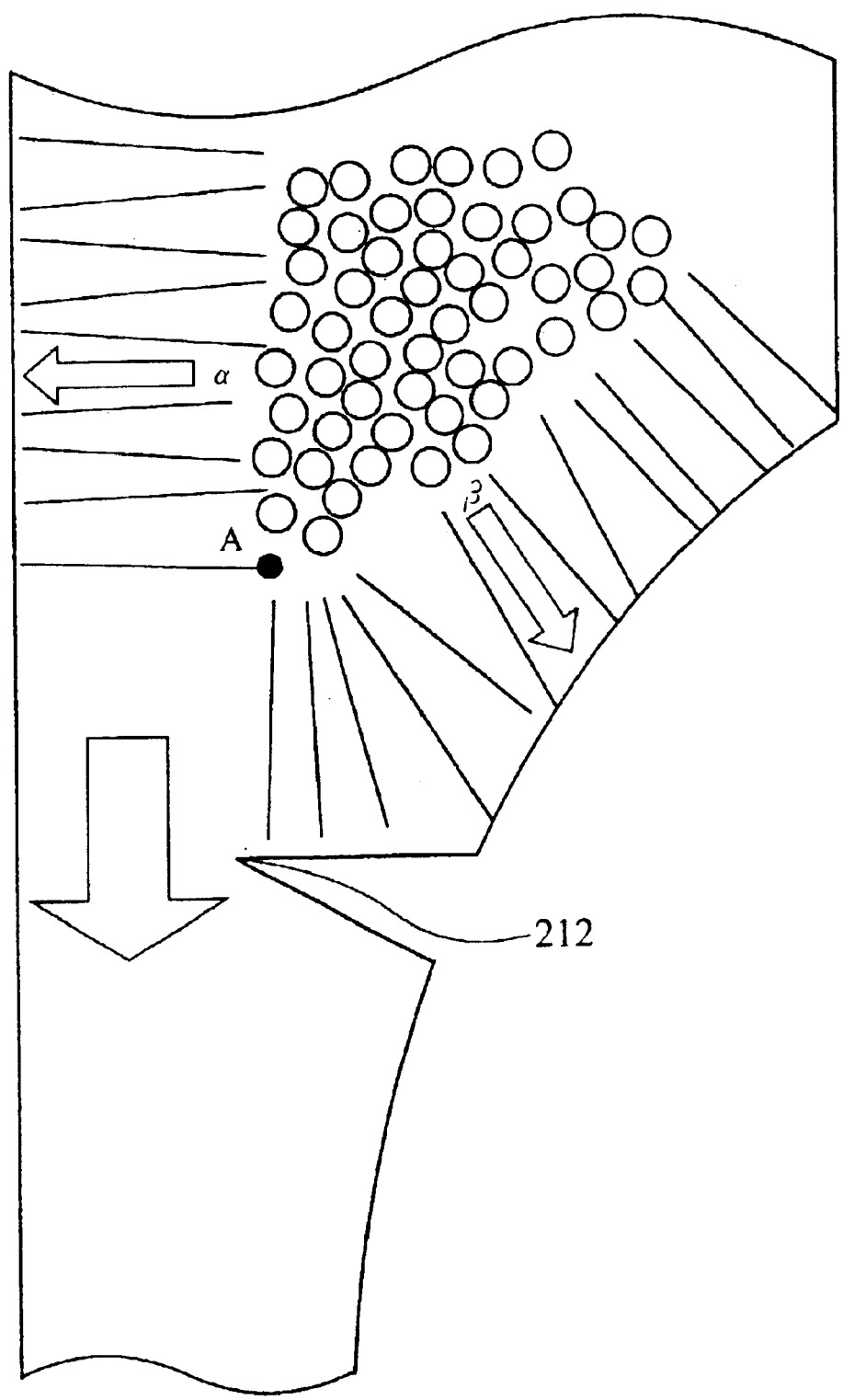
FIG. 36 is a diagrammatic plan view of the amorphous silicon film according to Modification 2 of the ninth embodiment of the present invention, which shows a mechanism of the crystal growth.

In the crystal growth mechanism, as shown in FIG. 36, one crystal grain is selected at the necked part 212, and a monocrystal grain can be formed. The one monocrystal grain formed in the necked part 212 of the width-reduced part spreads and propagates as in the mechanism of the first modification.

[A Third Modification]

Next, a third modification will be explained. The method for forming the sample is substantially the same as described above, and will not be repeated here.

Figure 37:
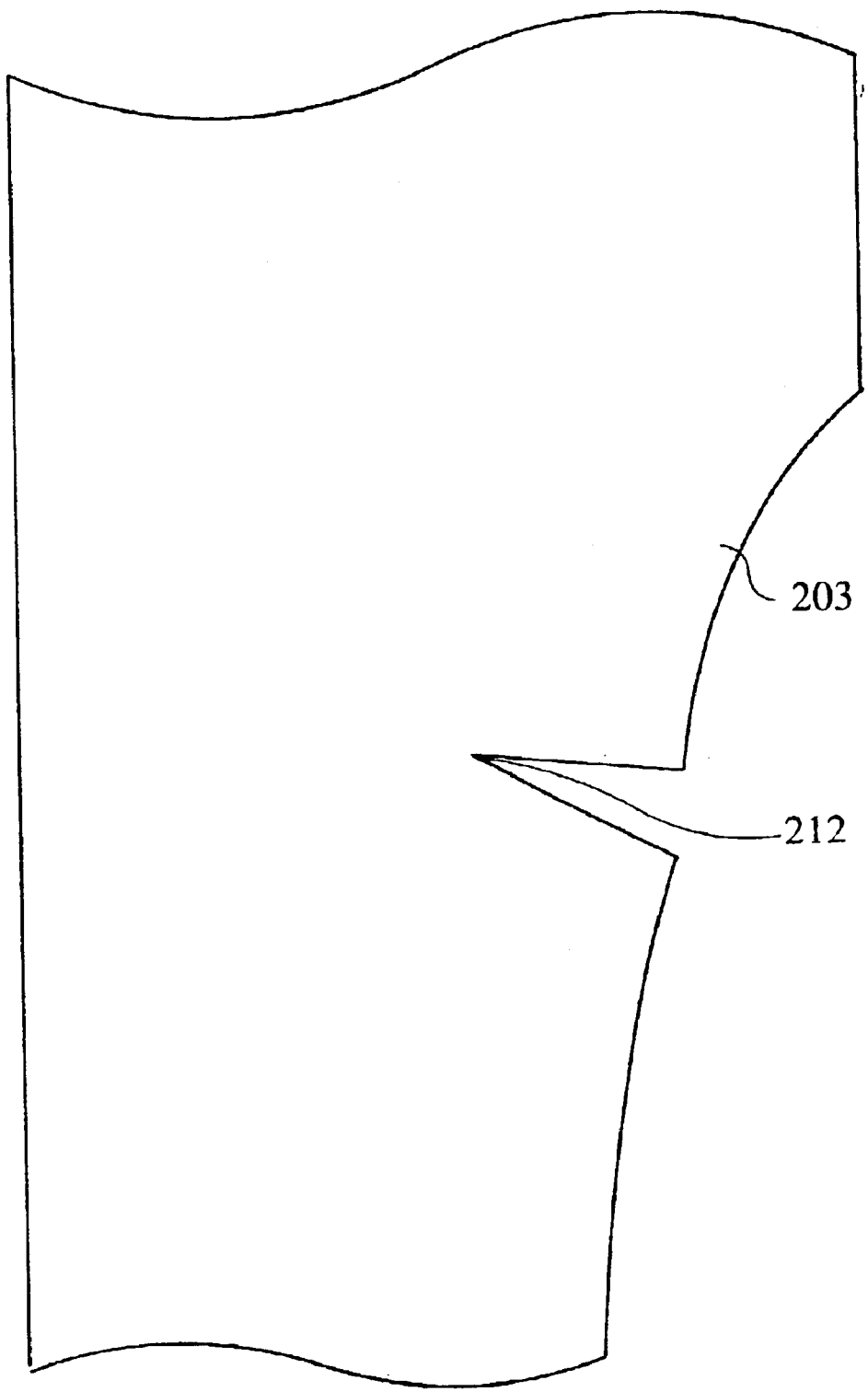
FIG. 37 is a diagrammatic plan view of the amorphous silicon film according to Modification 3 of the ninth embodiment of the present invention.

Here, as shown in FIG. 37, another example of the amorphous silicon film 203 having the necked part 212 defined will be explained. In this modification, the amorphous silicon film 203 is patterned to have the part to be the channel region which is reduced in a width at a lower width reduction rate and wider than that of the second modification. FIG. 37 corresponds to the part in the above-described circle C.

Figure 38:
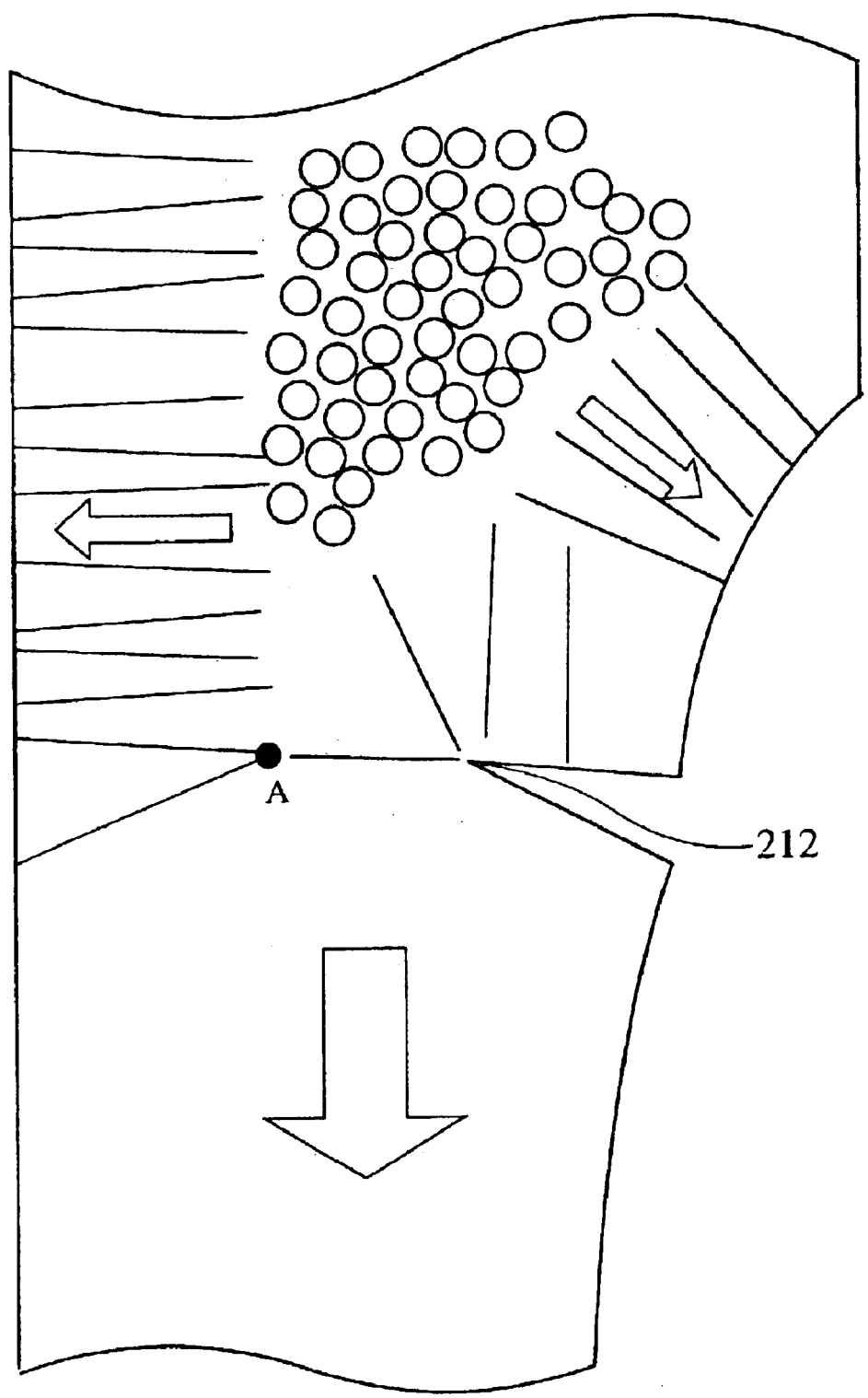
FIG. 38 is a diagrammatic plan view of the amorphous silicon film according to Modification 3 of the ninth embodiment of the present invention, which shows a mechanism of the crystal growth.

The mechanism for the crystal growth is as shown in FIG. 38. One crystal nucleus is formed at the point A at the necked part 212 and propagates, and a quasi-monocrystal region spreads large.

The thus-formed active semiconductor films 211 are used to form TFTs. Here, the fabrication of an n-channel TFT will be exemplified. FIGS. 39A to 42C are sectional views of the n-channel TFT according to the present embodiment in the steps of the method for fabricating the same, which show the method.

Figure 39A:
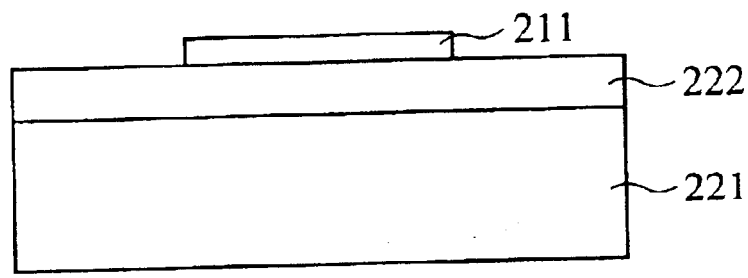
FIGS. 39A to 39C are sectional views of a TFT according to the ninth embodiment of the present invention in the steps of the method for fabricating the same, which explain the method (Part 1).

First, as shown in FIG. 39A, the active semiconductor film 211 formed by the above-described method is prepared on a glass substrate 221 through a silicon oxide film 222 to be a buffer. Here, the active semiconductor film 211 formed by the first modification is used.

Figure 39B:
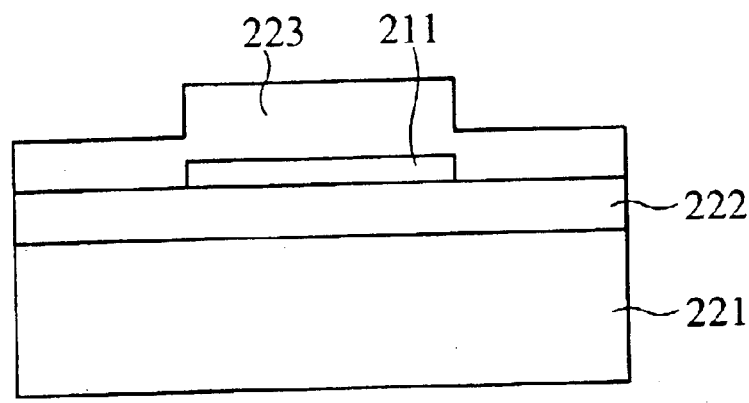

Subsequently, as shown in FIG. 39B, a silicon oxide film 223 to be a gate oxide film is formed in an about 120 nm-thickness on the active semiconductor film 211 by PECVD. In place of PECVD, LPCVD (Low Pressure Chemical Vapor Deposition) or sputtering, for example, may be used.

Figure 39C:
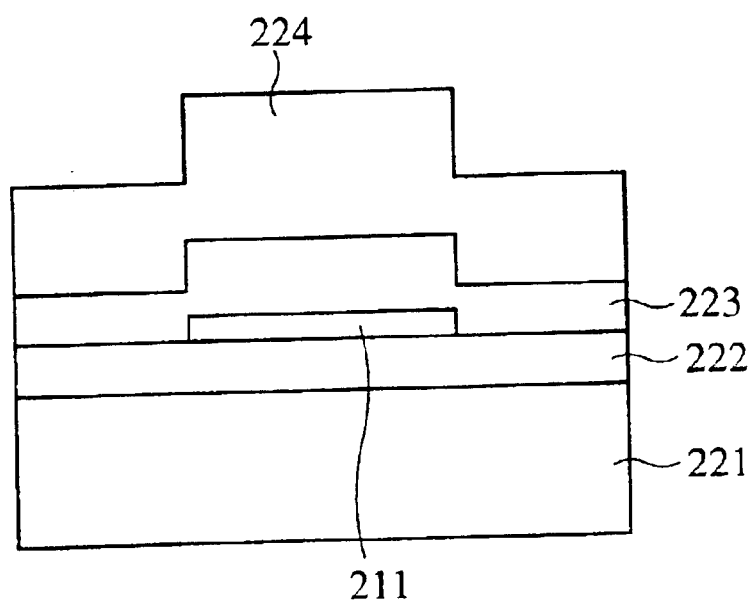

Then, as shown in FIG. 39C, an aluminum film (or an aluminum alloy film) 224 is formed in an about 300 nm-thickness by sputtering.

Figure 40A:
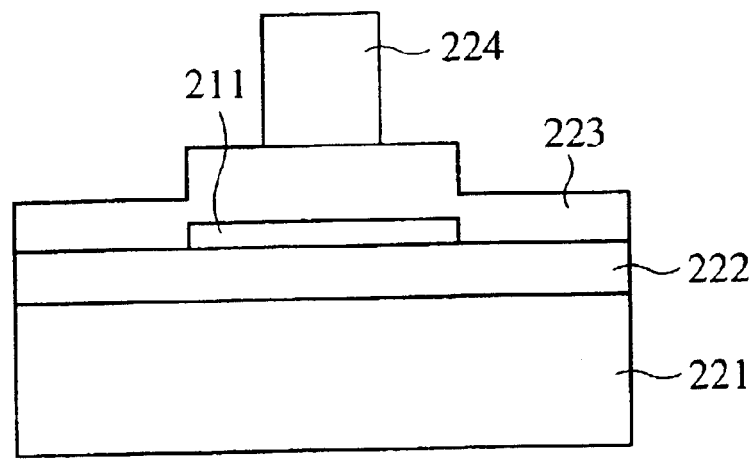
FIGS. 40A to 40C are sectional views of the TFT according to the ninth embodiment of the present invention in the steps of the method for fabricating the same, which explain the method (Part 2).

Next, as shown in FIG. 40A, the aluminum film 224 is patterned in an electrode configuration by photolithography and dry etching following the photolithography to form a gate electrode 224. At this time, the processing is performed so that the gate electrode 224 is positioned above the part shown in the circle C in FIG. 33A, i.e., the part where a quasi-monocrystal grain grows large, and monocrystallization is predominant.

Figure 40B:
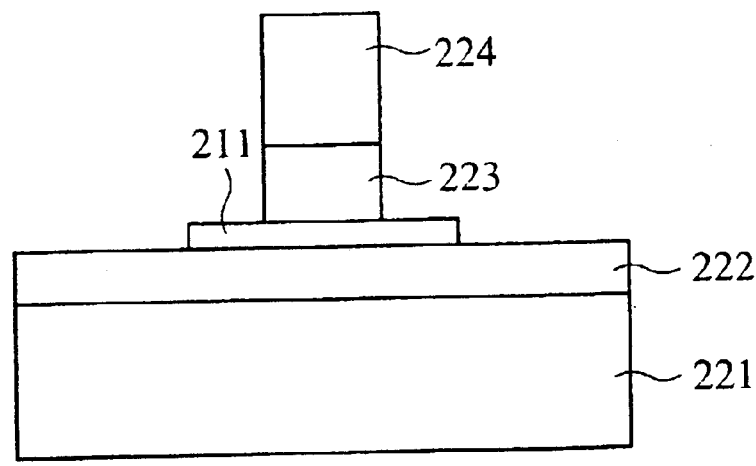

Then, as shown in FIG. 40B, with the patterned gate electrode 224 as a mask, the silicon oxide film 223 is patterned to form a gate oxide film 223 contouring a configuration of the gate electrode 224.

Figure 40C:
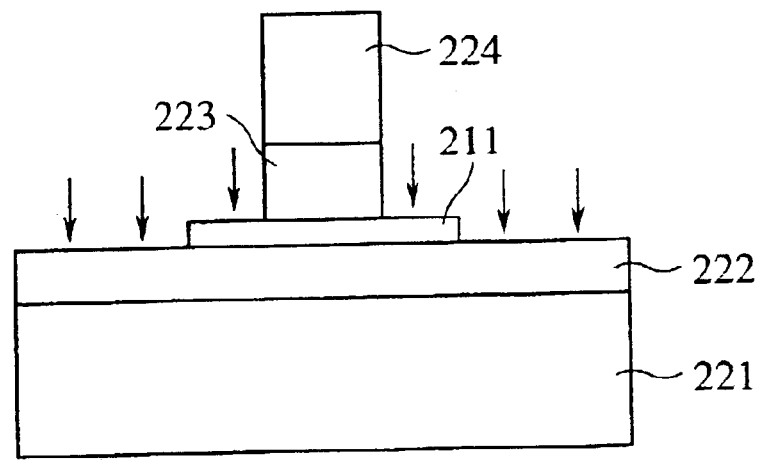

Subsequently, as shown in FIG. 40C, with the gate electrode 224 as a mask, ions are doped in parts of the active semiconductor film 211 which are on both sides of the gate electrode 224. Specifically, an n-type impurity, phosphorus (P) here, is doped under conditions of 10 keV acceleration energy, and a $5 \times 10^{15}/cm^2$ dose to form a source/drain region.

Figure 41A:
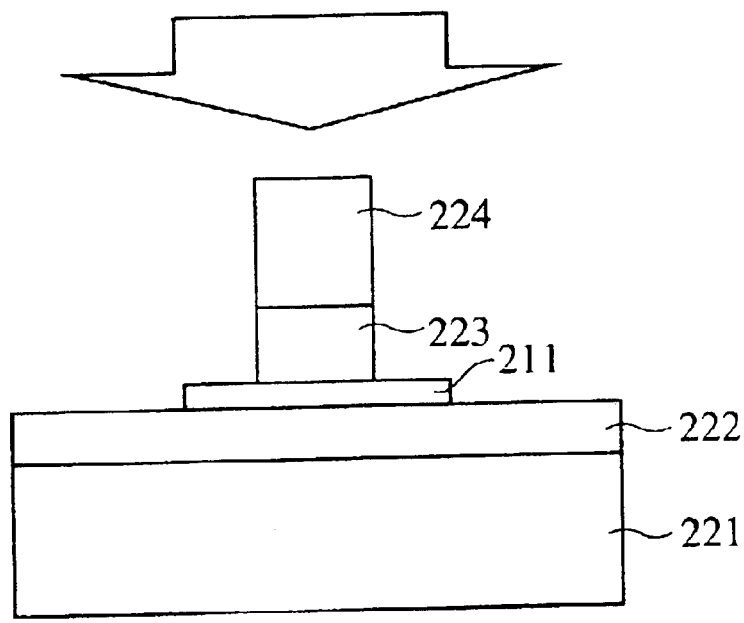
FIGS. 41A and 41B are sectional views of the TFT according to the ninth embodiment of the present invention in the steps of the method for fabricating the same, which explain the method (Part 3).
Figure 41B:
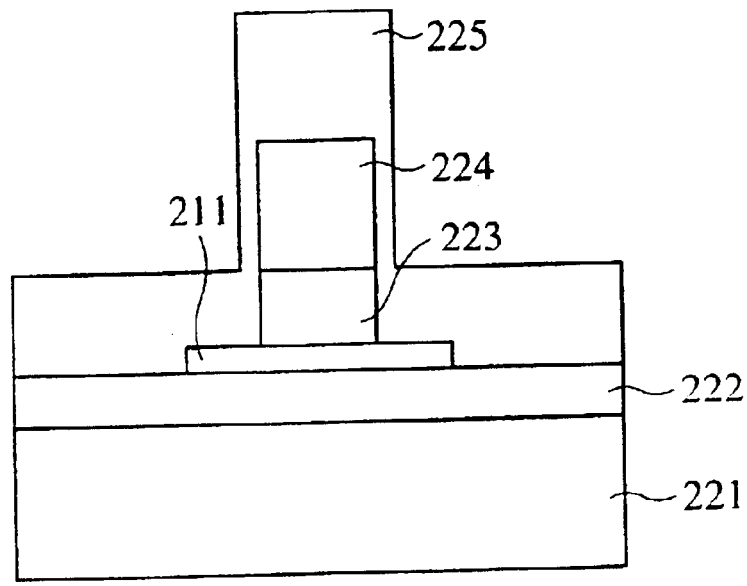

Subsequently, as shown in FIG. 41A, excimer laser beams are applied to activate the phosphorus in the source-drain region, and then, as shown in FIG. 41B, an SiN film is deposed in an about 300 nm-thickness, covering the entire surface to form an inter-layer insulation film 225.

Figure 42A:
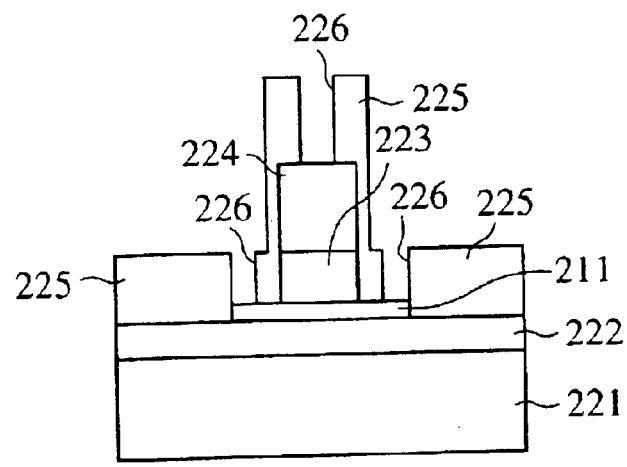
FIGS. 42A to 42C are sectional views of the TFT according to the ninth embodiment of the present invention in the steps of the method for fabricating the same, which explain the method (Part 4).

Then, as shown in FIG. 42A, contact holes 226 are opened in the inter-layer insulation film 225 to expose the gate electrode 224, and the active semiconductor film 211 in the source/drain region.

Figure 42B:
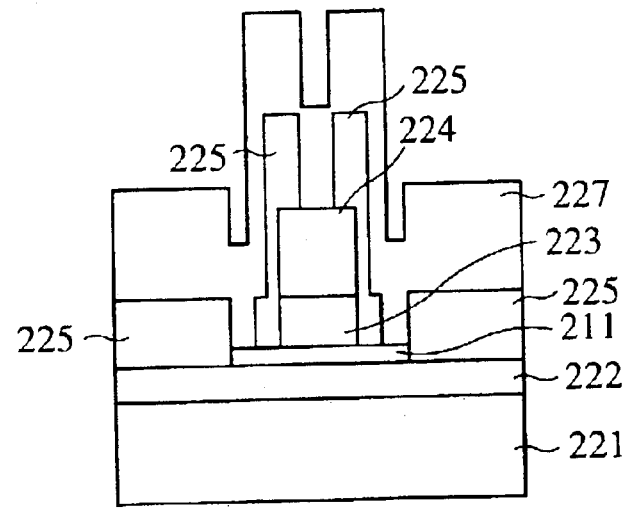
Figure 42C:
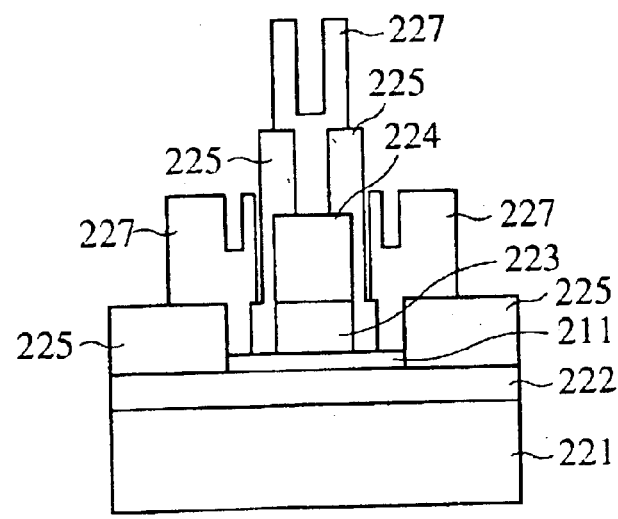

Then, as shown in FIG. 42B, a metal film 227 of aluminum or others is formed, filling the respective contact holes 226. Then, as shown in FIG. 42C, the metal film 227 is patterned to form wires 227 conductively connected to the gate electrode 224 and the active semiconductor film 211 through the respective contact holes 226.

Then, a protection film is formed, covering the entire surface, and the n-type TFT is completed. The n-type TFT was fabricated so that the active semiconductor film 211 has an about 10 $\mu$m channel length and an about 30 $\mu$m channel width. Its electron mobility was measured and a high electron mobility of 450 $cm^2/Vs$ was attained.

As described above, according to the present embodiment and its modifications, at least the channel region of the active semiconductor film 211 is formed of large-diameter crystal grains having the growth directions controlled, whereby the generation of grain boundaries which are normal to a current flow direction is prevented, and the channel region is formed of substantially monocrystal silicon, i.e., quasi-monocrystal silicon, and because of the quasi-monocrystal state, semiconductor devices of inevitably high electron mobilities can be realized.

[A Tenth Embodiment]

Then, a tenth embodiment of the present invention will be explained. In the present embodiment, a structure of a TFT and a method for fabricating the TFT will be exemplified as in the ninth embodiment but is different from the ninth embodiment in the structure of the active semiconductor film and the method for forming the active semiconductor film. The same members of the present embodiment as those of the ninth embodiment are represented by the same reference numbers not to repeat their explanation.

Figure 43:
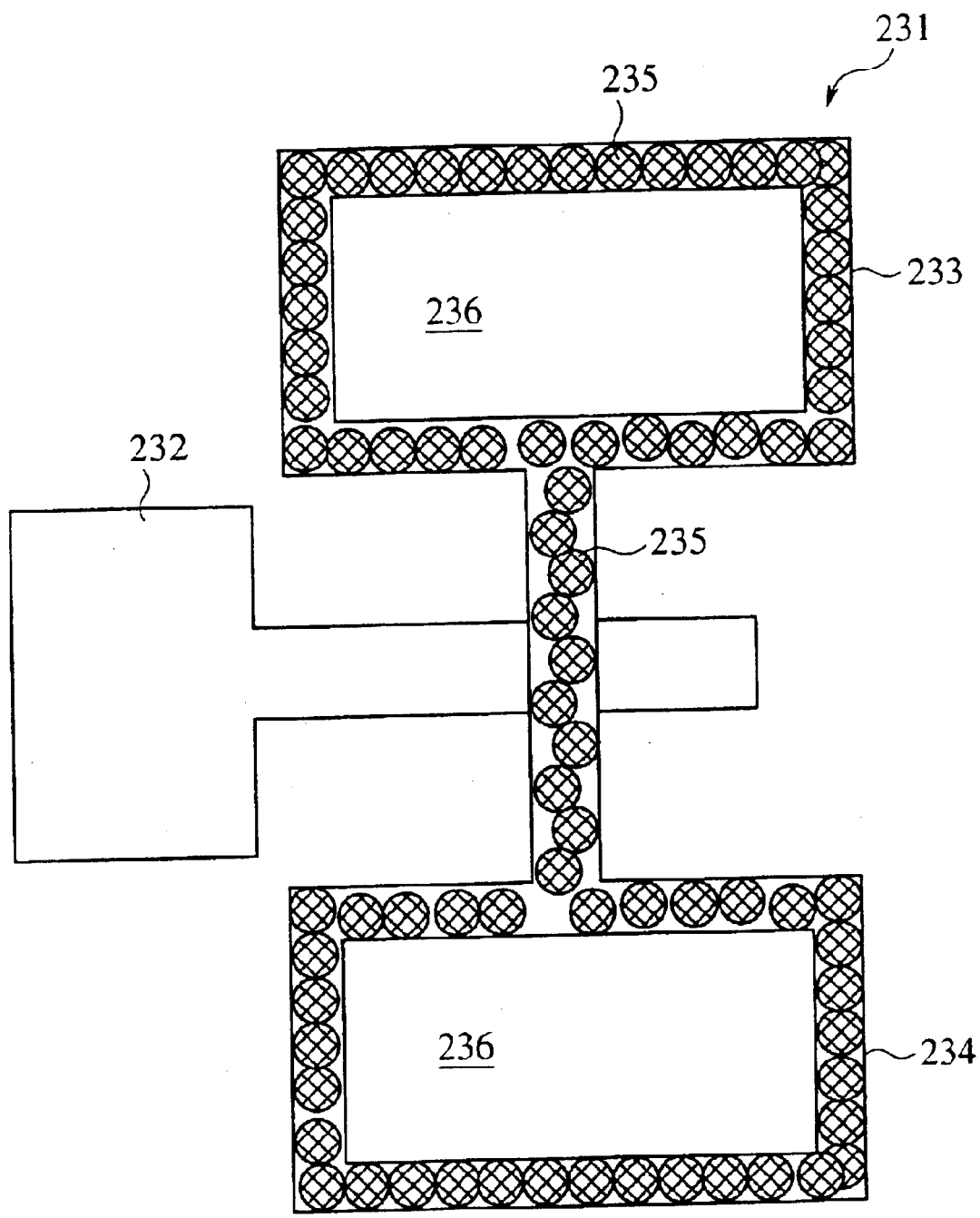
FIG. 43 is a diagrammatic plan view of an n-type TFT according to a tenth embodiment of the present invention, which shows major constitution thereof.

FIG. 43 is a diagrammatic plan view of an n-type TFT according to the present embodiment, which shows major constitution thereof.

Figure 44A:
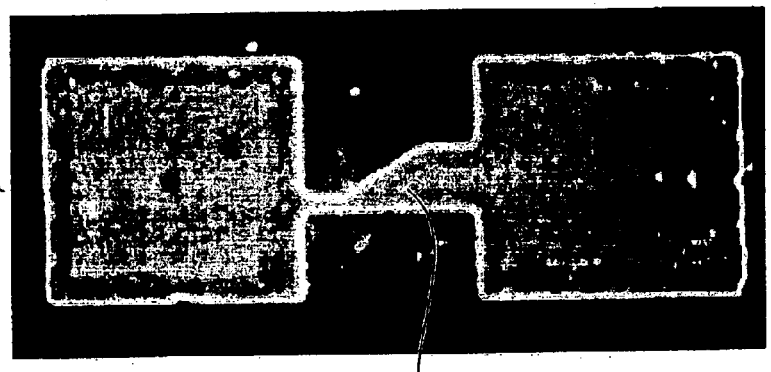
FIGS. 44A and 44B are microscopic pictures of crystal structures of the active semiconductor film.
Figure 44B:

In this n-type TFT, at least the channel region of the active semiconductor film 231 is formed of polycrystal silicon of circular large-diameter disc-shaped crystal grains 235; and disc-shaped crystal grains 235 are formed in the peripheral parts of the source/drain regions 233,234, and microcrystal silicon 236 are formed inside. The channel region has a very small width, and substantially one disc-shaped crystal grain 235 occupies width-wise the channel region. Accordingly, the channel region is formed of substantially several crystal grains. FIGS. 44A and 44B show states of the actually formed active semiconductor film 231 given by a scanning electron microscope. The structures of the disc-shaped crystal grain 235 and the microcrystal silicon 236 described above are clearly shown. A strip-shaped gate electrode 232 is provided substantially normal to the channel region above the channel region. The TFT can have high electron mobility.

In forming the active semiconductor film 231 of such structure, first the respective steps of FIGS. 27A to 27D are followed. An about 100 mm-thickness amorphous silicon film 241 is patterned through an about 100 nm-thickness silicon oxide film 202 on a substrate 201 of glass which has a strain point of 600° C.–700° C. and is transparent to visible light, and the amorphous silicon film is formed in an about 300 nm-thickness through a silicon oxide film 204 which is to be an isolation film of an about 20 nm-thickness. Then, the amorphous silicon film is transformed to polycrystal silicon film by metal induced solid-phase growth (550° C., 8 hours) using nickel (Ni) to form a heat retaining film 242.

The heat retaining film 242 is not essentially formed of polycrystal silicon film and may remain formed of amorphous silicon. The heat retaining film 242 may be formed of other materials.

Figure 45:
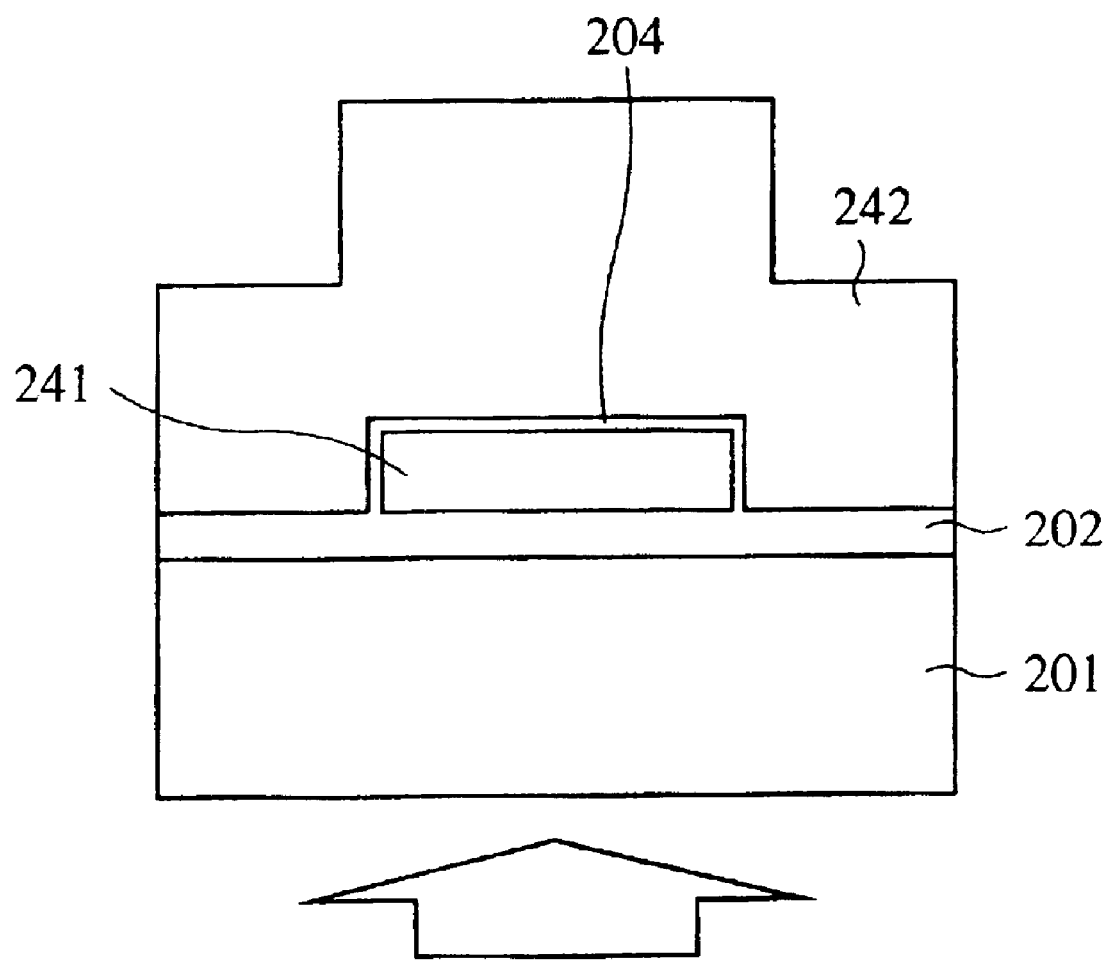
FIG. 45 is a diagrammatic sectional view for explaining the step of crystallizing the amorphous silicon film.

Subsequently, as shown in FIG. 45, excimer laser beams as energy beams are applied from below with the upper surface (the top surface and the side surfaces) of the amorphous silicon film 241 covered with the heat retaining film 242 to crystallize the amorphous silicon film 241. This excimer laser beam application gives to the heat retaining film 242 energy which melts the heat retaining film 242 to make a temperature of the amorphous silicon film 241 higher than the melting point 1410° C. of silicon crystals. The heat retaining film 242 is thick in comparison with the amorphous silicon film 241, and has a large heat capacity. Accordingly a cooling rate of the heat retaining film 242 is low, and, that is, functions as a heat bath. Thus, a region of the amorphous silicon film 241 near the heat retaining film 242 has a lower cooling rate, which allows one crystal nucleus which has been incidentally formed to grow. Resultantly, as shown in FIG. 43, the active semiconductor film 231 has the polycrystal state of the circular large-diameter disc-shaped crystal grains 235 forming at least the width-reduced part, which is to be the channel region, and of the microcrystal silicon 236 surrounded by the disc-shaped crystal grains 235 forming the source/drain. The disc-shaped crystal grain 235 is a circular crystal grain. The radius L of the circular large-diameter crystal grain is larger than 250 nm, and a width W of the channel is smaller than 4L.

Figure 32B:
Figure 32B:
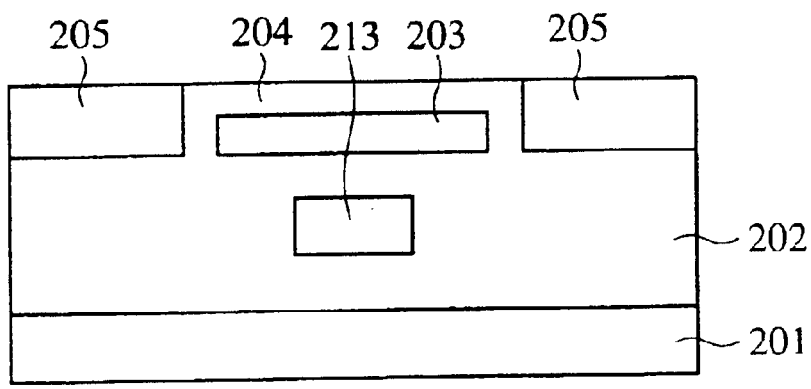

As in the ninth embodiment shown in FIGS. 32A and 32B, a heat absorbing body of an insulating material may be buried in the silicon oxide film 202 at a position below the amorphous silicon film 241 so as to control a temperature distribution of the amorphous silicon film 241. The amorphous silicon film 241 has a higher temperature decreasing rate, and a large temperature distribution is formed. Circular large-diameter crystallization can be ensured.

Then, with the silicon oxide film 204 as a stopper the protection film 242 is removed by RIE, and then the silicon oxide film 204 is removed by wet etching using HF.

Figure 46:
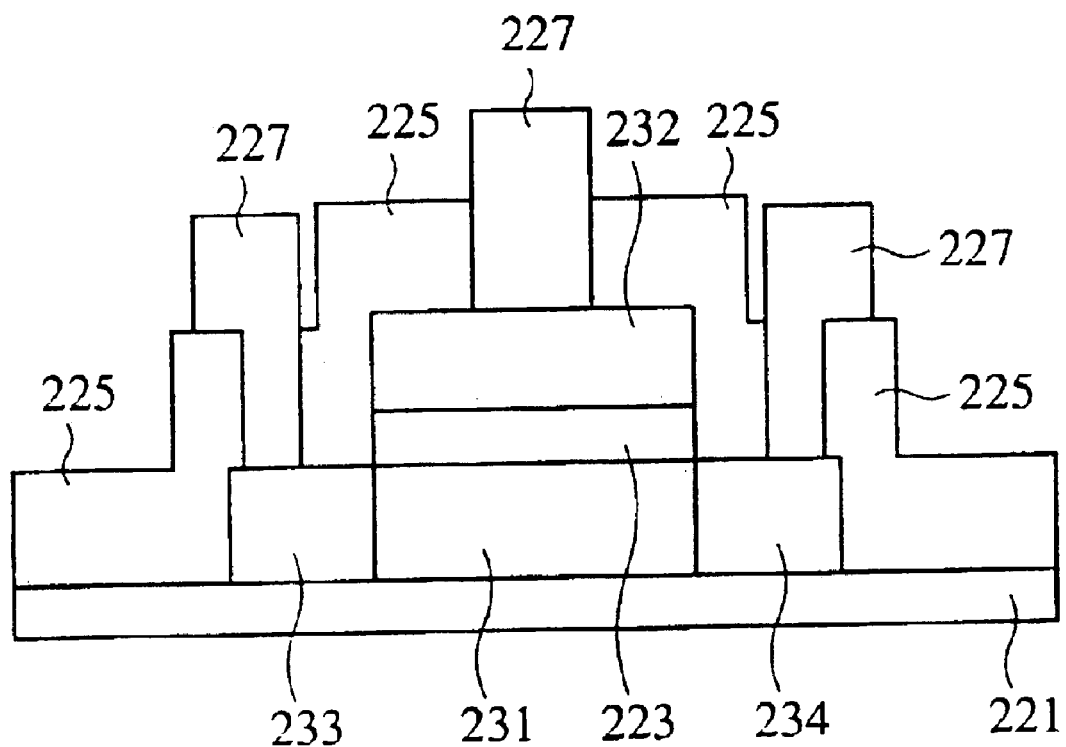
FIG. 46 is a diagrammatic sectional view of the TFT according to the tenth embodiment of the present invention, which shows the major constitution thereof.

One example of fabricating a TFT using the thus-prepared active semiconductor film 231 by the same fabrication steps as those of the ninth embodiment is shown in FIG. 46.

This TFT was fabricated by the same fabrication steps as those of the ninth embodiment shown in FIG. 42C so that the active semiconductor film 211 has an about 10 μm-channel length and an about 30 μm-channel width. The electron mobility of the TFT was measured, and a high electron mobility of 450 cm²/Vs was attained.

As described above, according to the present embodiment, at least the channel region of the active semiconductor film 231 is formed of circular large-diameter crystal grains 235, whereby semiconductor devices of high electron mobilities can be realized.

As described above, according to the present embodiment, at least the channel region of the active semiconductor film has a polycrystal state formed of circular large-diameter crystal grains which are circular crystal grains. A radius L of the circular large-diameter crystal grain is lager than 250 nm, and a width W of the channel is smaller than 4L. In other words, a width of the channel region is so small that substantially one circular large-diameter crystal grain occupies the width in the width-wise direction. Accordingly, the channel region substantially has a large-diameter crystal state, and semiconductor devices of high electron mobilities can be realized.

Furthermore, in the present embodiment, the heat retaining film is formed through the isolation film, covering the island-shaped semiconductor film, which is to be a material of the active semiconductor film, and energy beams are applied from below to decrease a cooling rate of the melt to form the active semiconductor film of the polycrystal state formed of circular large-diameter crystal grains of about some m-diameter.

[An Eleventh Embodiment]

A method for forming a silicon thin film according to an eleventh embodiment of the present invention will be explained with reference to FIGS. 47 to 57. FIGS. 47 to 50 are sectional views of the silicon thin film in the steps of the method for forming the silicon thin film according to the present embodiment. FIG. 51 is a plan view of the silicon layer, which shows a pattern shape.

First, a buffer layer 312 of a 400 nm-thickness silicon oxide film is formed on a 0.7 mm-thickness glass substrate 310 by PECVD.

Next, a silicon layer 314 of a 150 nm-thickness amorphous silicon layer is formed on the buffer layer 312 by PECVD.

Figure 47A:
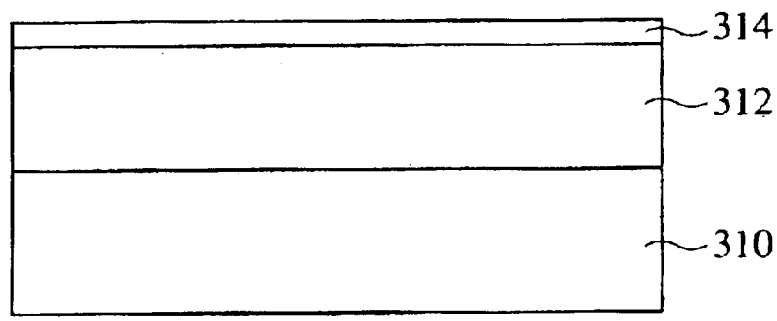
FIGS. 47A to 47C are sectional views of the silicon thin film according to a eleventh embodiment of the present invention in the steps of the method for forming the same, which explain the method (Part 1).

Then, thermal processing is performed at 450° C. for 2 hours to remove hydrogen from the silicon layer 314 (see FIG. 47A).

Figure 47B:
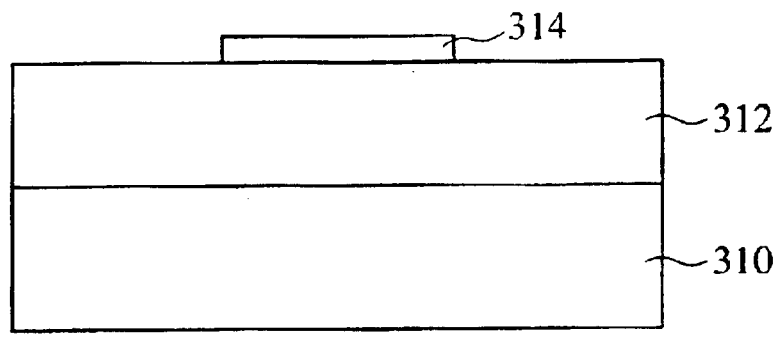

Next, the silicon layer 314 is patterned by photolithography (see FIG. 47B). At this time, the silicon layer 314 is patterned into the plan shape shown in FIG. 51.

That is, a width of the silicon layer 314 is changed in a region 315c between a region 315a and a region 315b which are to be a source/drain. Specifically, the silicon layer 314 in the region 315c has a decreased width in a region 317a which is lower as viewed in the drawing, has the width gradually increased in a middle region 317b and has an increased width in a region 317c which is upper as viewed in the drawing.

Figure 47C:
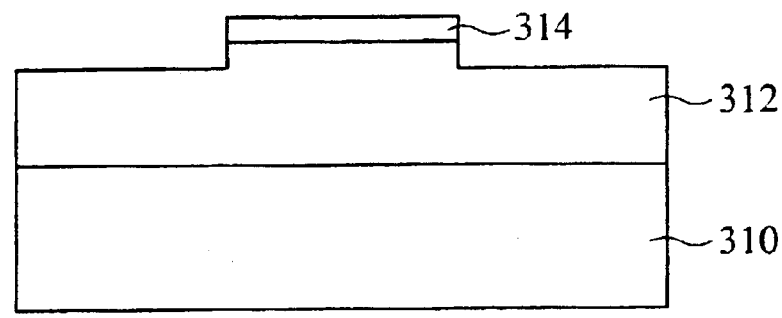

Next, the surface of the buffer layer 312 is etched, using an HF-based etchant with the silicon layer 314 as a mask to form a step in the buffer layer 312 (see FIG. 47C).

Figure 48A:
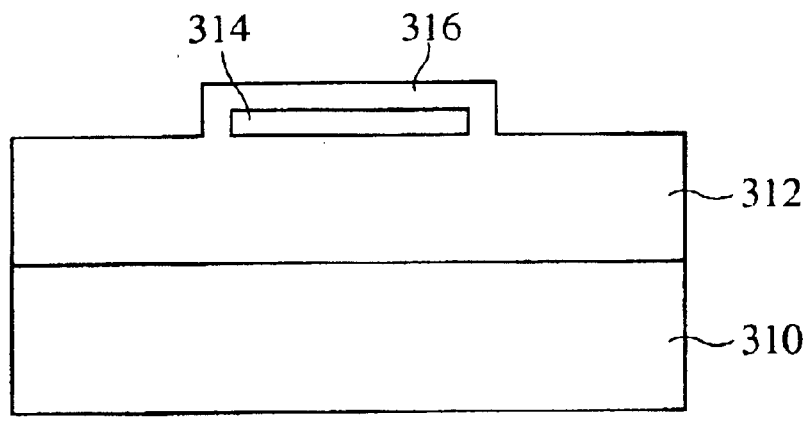
FIGS. 48A and 48B are sectional views of the silicon thin film according to a eleventh embodiment of the present invention in the steps of the method for forming the same, which explain the method (Part 2).

Then, an isolation film 316 of a 30 nm-thickness silicon oxide film is formed on the entire surface by PECVD (see FIG. 48A). The isolation film 316 is not essentially formed of silicon oxide film but is preferably formed of a material a melting point of which is higher than that of the silicon layer 314. This is because if the isolation film 316 melts upon crystallization of the silicon layer 314, the silicon layer 314 and the heat retaining layer 318a merge each other (see FIG. 49B). It is preferable that the isolation film 316 functions as an etching stopper when a heat retaining film 318a is etched.

Then, the heat retaining film 318 is formed of a 250 nm-thickness amorphous silicon film on the entire surface by PECVD. As film forming conditions, for example, a flow rate ratio between SiH₄ gas and H₂ gas is 2:98, and a temperature inside the film forming chamber is 350° C.

Figure 48B:
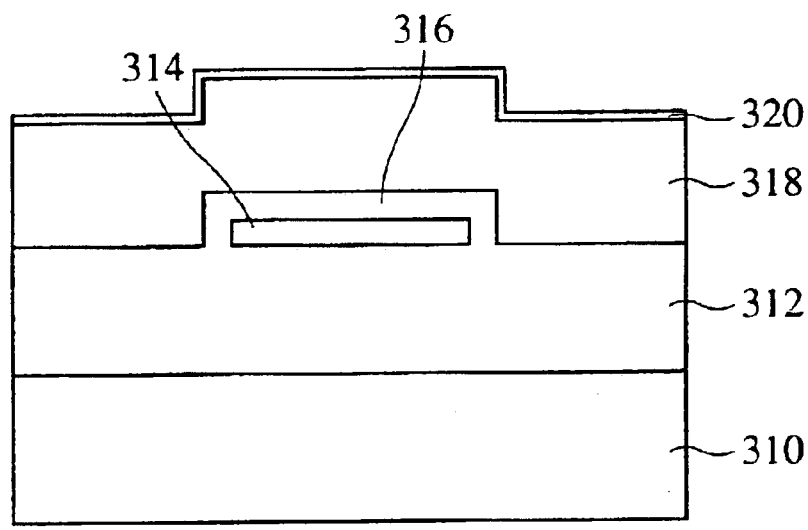

Next, a doped layer 320 formed of a 3 nm-thickness Ni film is formed on the entire surface by sputtering (FIG. 48B).

Then, the Ni in the doped layer 220 is diffused in the solid phase in the heat retaining layer 318 by thermal processing at 550° C. for 8 hours. Thus, the solid phase growth of the amorphous silicon using the Ni forms the heat retaining layer 318a of a polycrystal silicon layer (see FIG. 49A).

The heat retaining film 318a is made polycrystal silicon state by the thermal processing, but the silicon layer 314 covered with the isolation film 316 is kept from the Ni diffusion by the isolation film 316, and remains amorphous silicon state.

Figure 52:
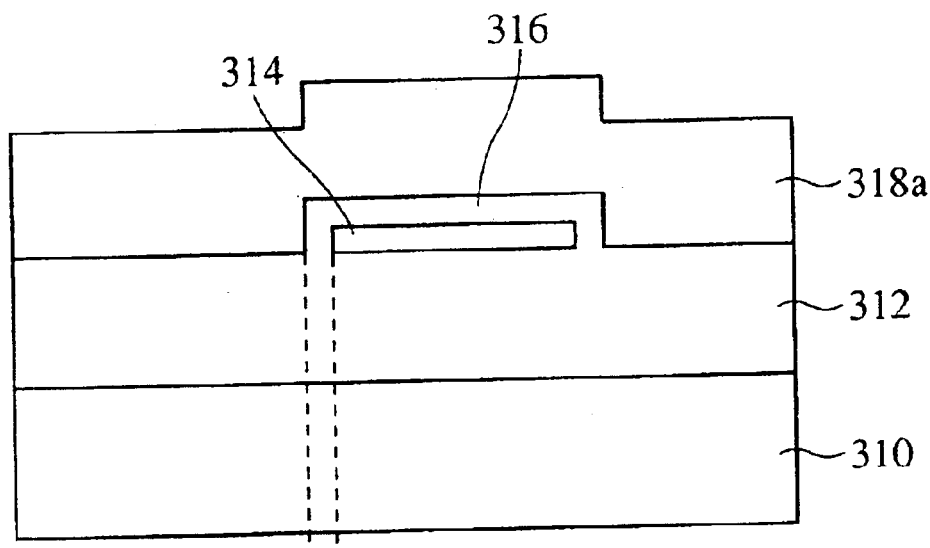
FIG. 52 is a graph of crystal states of the heat retaining layer, the isolation film and the silicon layer measured by Raman scattering spectroscopy.
Figure 52:
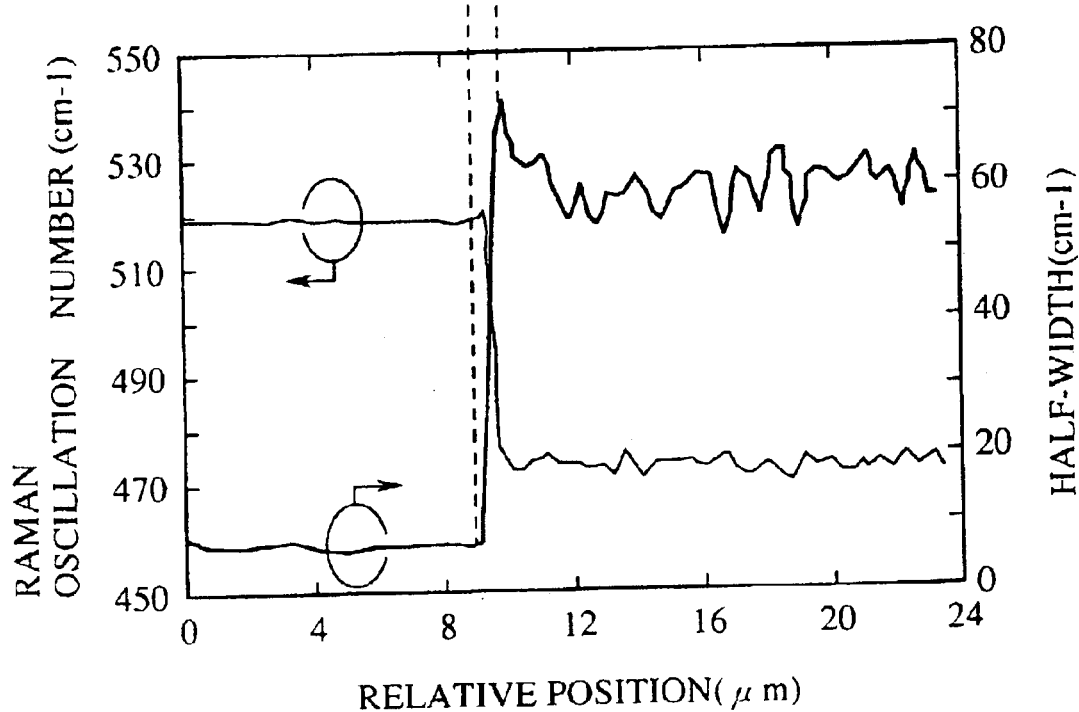

FIG. 52 is a graph of crystal states of the heat retaining layer, the isolation film and the silicon layer measured by Raman scattering spectroscopy. In FIG. 52, relative positions with respect to the glass substrate are taken on the horizontal axis, and Raman vibration number are taken on the vertical axis on the left side. Half-widths are taken on the vertical axis on the right side. The measurement of the crystal state was made on the side of the underside of the glass substrate.

As shown in FIG. 52, the heat retaining layer 318a has small half-widths, and the silicon layer 314 has large half-widths. Based on this, it is found that the above-described thermal processing makes the heat retaining layer 318a polycrystal silicon state and makes the silicon layer 314 remain amorphous silicon state.

Then, continuous-waves (CW) of laser beams are applied to the silicon layer 314 at the room temperature on the side of the underside of the glass substrate 310, i.e., the side of the surface with the buffer layer 312 formed on to crystallize the silicon layer 314 (see FIG. 49A).

In the present embodiment, continuous-waves of laser beams are used, and when the laser beams-are absorbed by the glass substrate 310, the glass substrate 310 has a high temperature and is deformed. In the present embodiment, laser beams, which have high transmittance with respect to the glass substrate 310, are used to thereby prevent the deformation of the glass substrate 310.

Figure 53:
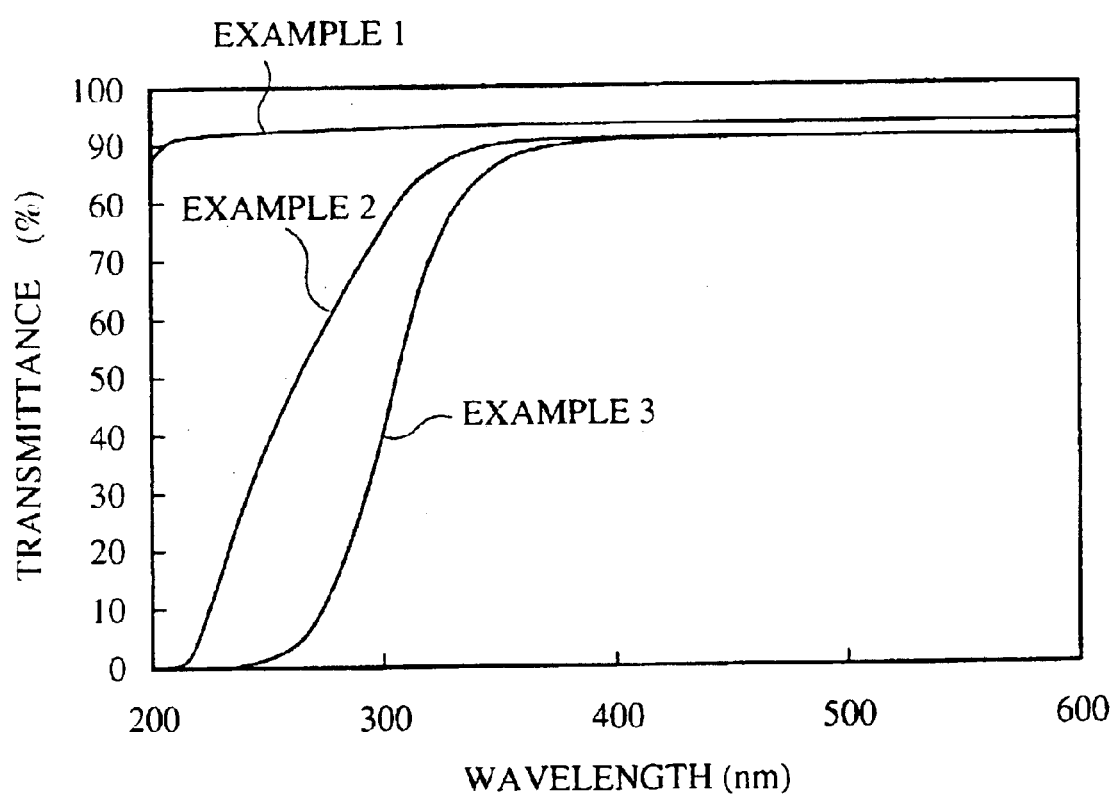
FIG. 53 is a conceptual graph of relationships between laser beam wavelengths and glass substrate transmittances thereof.

FIG. 53 is a graph of relationships between laser beam wavelengths and transmittances with respect to the glass substrate. Laser beam wavelengths are taken on the horizontal axis, and laser beam transmittances with respect to the glass substrate are taken on the vertical axis. In Examples 1, 2 and 3, glass substrates formed of materials different from each other are used for the measurement.

As shown in FIG. 53, in all the cases that the glass substrates of Examples 1, 2 and 3 are used, high transmittances are obtained at wavelengths of the laser beams which are above 400 nm. Based on this, laser beams of an above 400 nm-wavelength are not easily absorbed by the glass substrates, which prevents the glass substrates from having high temperatures. It can be considered that the deformation of the glass substrates can be prevented because laser beams are not easily absorbed by the glass substrates. A wavelength of the applied laser beams is not limited to 400 nm or more. A suitable wavelength is selected suitably in accordance with properties of a material of the glass substrate.

In view of this, the present embodiment uses a laser of, e.g., 532 nm-wavelength. As a laser of such wavelength, secondary higher harmonics of an Nd:YAG group semiconductor laser can be used.

Figure 54:
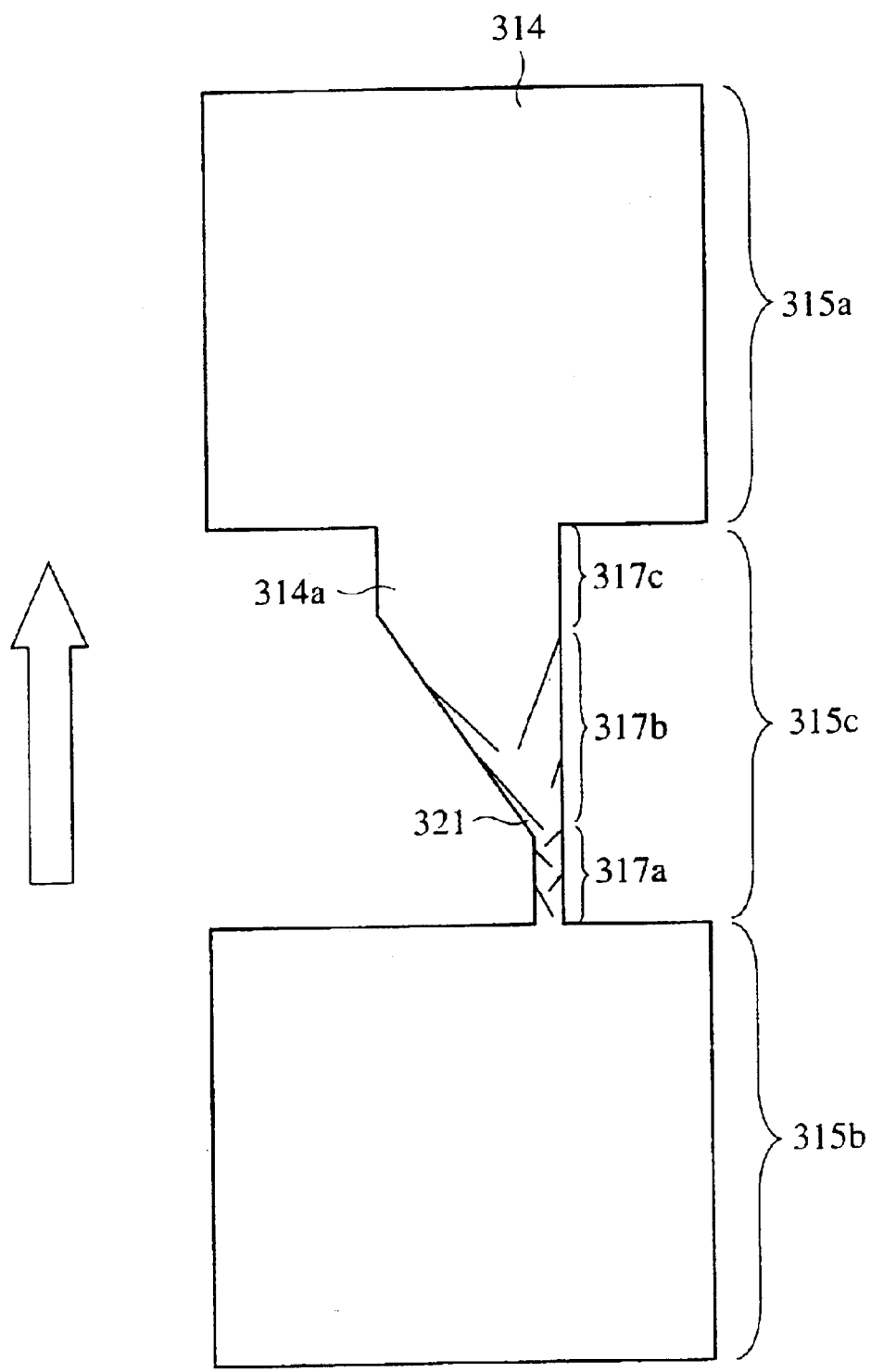
FIG. 54 is a plan view of the silicon layer, which shows a mechanism for the crystallization thereof.

Here, the mechanism of crystallization of the silicon layer of the present embodiment will be explained with reference to FIG. 54. FIG. 54 is a plan view of the silicon layer, which shows the mechanism of the crystallization of the silicon layer.

In the present embodiment, a laser scans from the lower side as viewed in FIG. 54 to the upper side as viewed in FIG. 54. The arrow in FIG. 54 indicates the direction of the scan.

Figure 55:
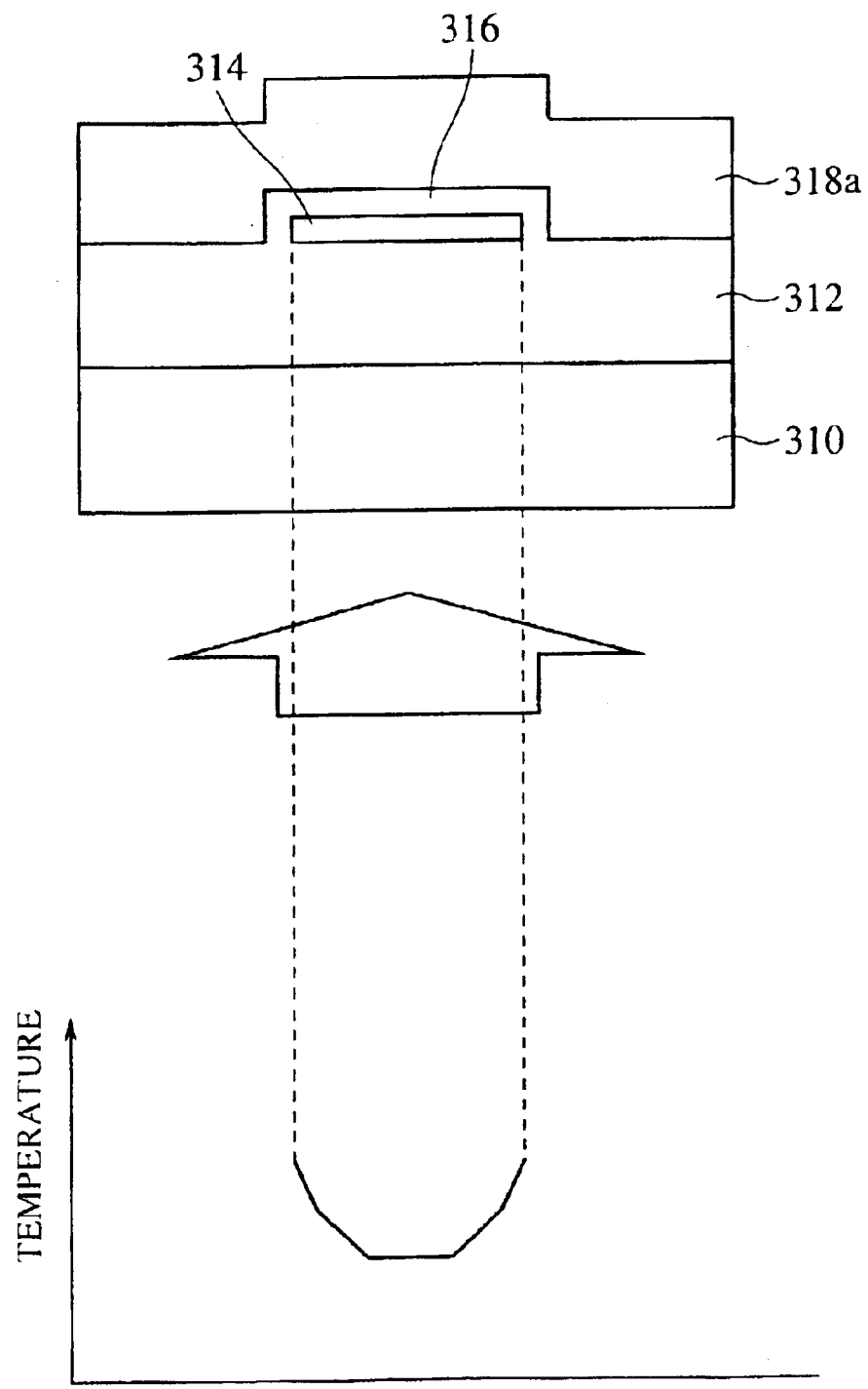
FIG. 55 is a conceptual view of temperature gradients of the silicon layer generated when laser beams are applied.

When laser beams are applied to the silicon layer 314 in the width-reduced region 317a of the region 315c, the silicon layer 314 has a temperature gradient shown in FIG. 55. FIG. 55 is a conceptual view of a temperature gradient of the silicon layer obtained when laser beams are applied.

The temperature gradient shown in FIG. 55 is formed by the following mechanism.

That is, when laser beams are applied, the silicon layer 314, which is covered with the heat retaining layer 318a through the isolation film 316 has a high temperature and melts. However, the heat retaining layer 318a in the region above the silicon layer 314 cannot increase a temperature because the silicon layer 314 hinders the laser beams from arriving at the heat retaining layer 318a.

On the other hand, the laser beams are applied to the heat retaining layer 318a on both sides of the silicon layer 314, and the heat retaining layer 318a can increase the temperature. In addition thereto, the heat retaining layer 318a which is formed thick can have a large heat capacity and a low cooling rate.

Accordingly, the heat retaining layer 318a on both sides of the silicon layer 314 functions a heat bath for the silicon layer 314 while the heat retaining layer 318a in the region above the silicon layer 314 functions to increase a cooling rate for the silicon layer 314. Thus, in the process of the silicon layer 314 cooling, the inside of the silicon layer 314 has a lower temperature while the edge of the silicon layer is kept at a high temperature.

When such temperature gradient is formed, the inside of the silicon layer 314 has a lower temperature than the edge thereof, and growth of crystals advances from the inside of the silicon layer 314 to the outer side thereof.

In some cases, such crystal growth beings when the laser scans the reduced-width region 317a, and, in other cases, begins when the laser scans up to the vicinity of the middle region 317b.

When the laser scans up to the middle region 317b, where the silicon layer 314 gradually increases a width, crystals go on further growing, and grain boundaries are expelled outside the silicon layer 314.

As the laser further scans, crystals are taken over, and monocrystal silicon 314a is formed in the width-increased region of the silicon layer 314.

Figure 50:
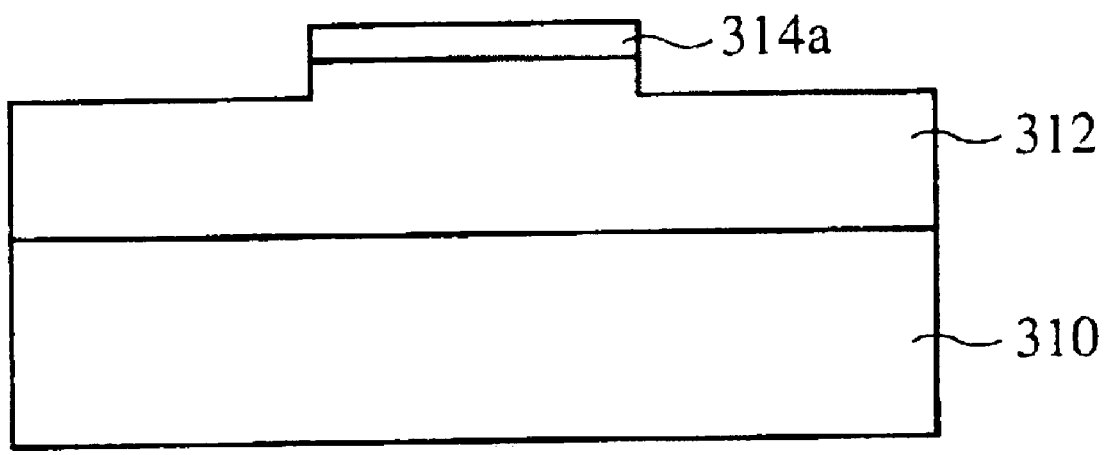
FIG. 50 is sectional view of the silicon thin film according to an eleventh embodiment of the present invention in the steps of the method for forming the same, which explain the method (Part 4).
Figure 51:
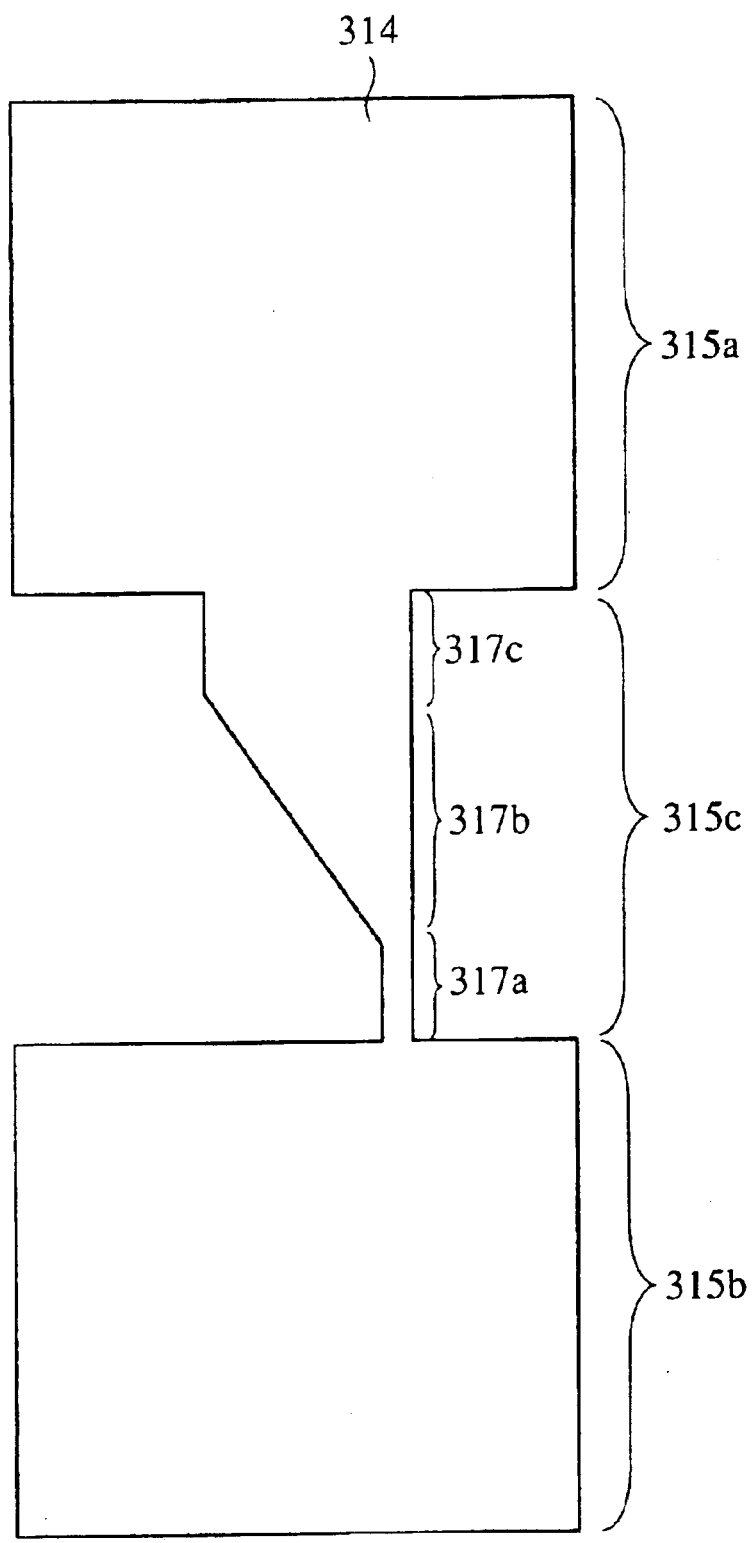
FIG. 51 is a plan view of the silicon layer, which shows a patterned shape (Part 1).

Then, as shown in FIG. 50, the heat retaining layer 318a is etched by RIE (Reactive Ion Etching) with the isolation film 316 as an etching stopper.

Next, the isolation film 316 is etched by HF-group wet etching.

Thus, the silicon thin film according to the present embodiment is formed.

The thus-formed silicon thin film can be used as the channel layer of the thin film transistor.

Figure 56:
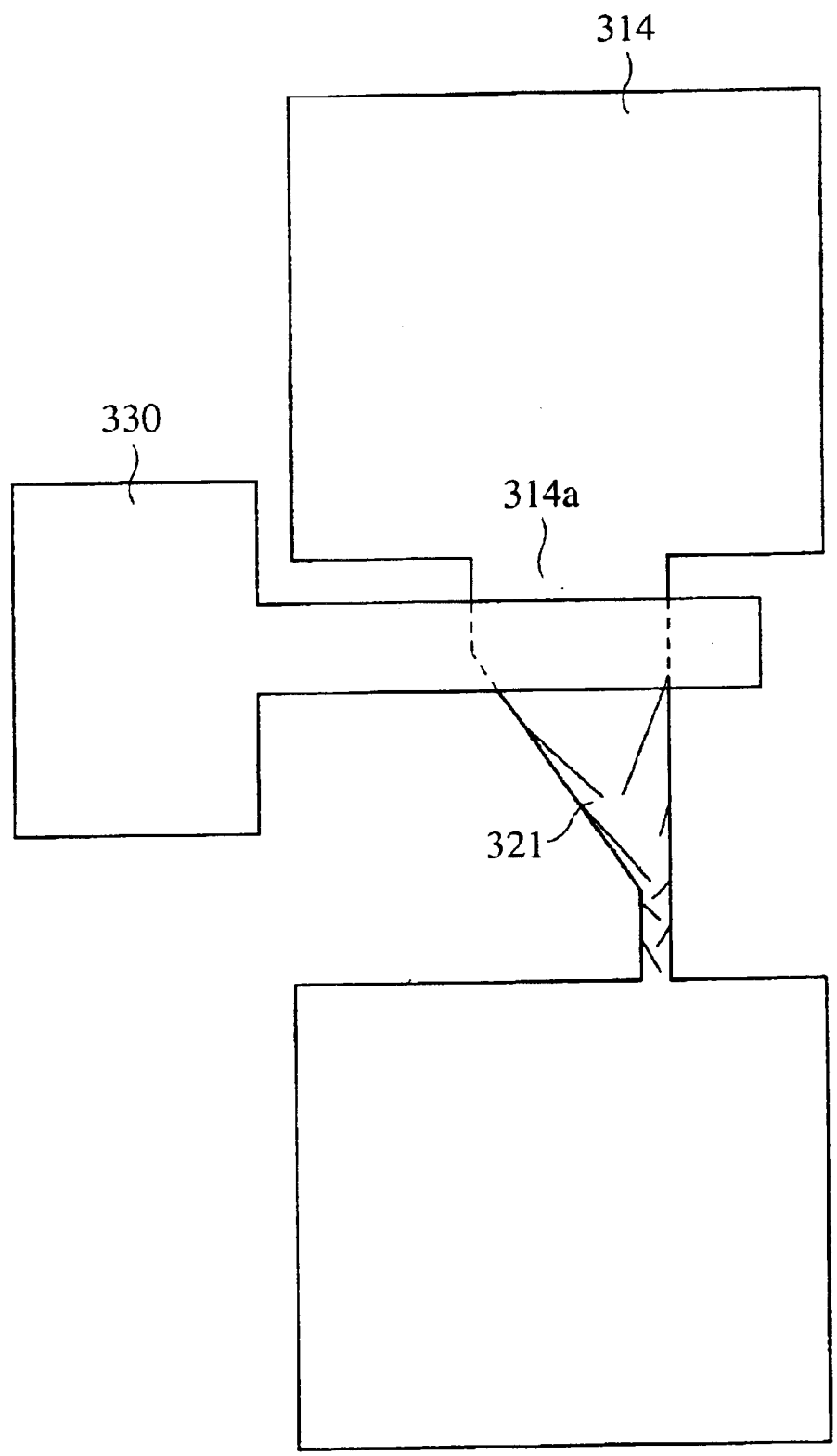
FIG. 56 is a plan view showing the silicon thin film according to the ninth embodiment, and a gate electrode.

FIG. 56 is a plan view showing positional relationships between a gate electrode and the silicon thin film formed in the present embodiment.

As shown in FIG. 56, a gate electrode 330 is formed on the monocrystal silicon 314a through a gate insulation film (not shown). In this arrangement, the monocrystal silicon 314a is the channel, whereby a TFT having high electron mobility can be provided.

A method for fabricating a TFT using the silicon thin film formed in the present embodiment will be detailed in a twelfth embodiment.

[Evaluation Result]

Figure 57:
FIG. 57 is microscopic picture of a crystal sate of the silicon thin film according to the eleventh embodiment of the present invention.

Then, crystal states of the silicon thin film formed as described above will be explained with reference to FIG. 57. FIG. 57 is a microscopic picture of a crystal state of the silicon thin film formed in the present embodiment. This microscopic picture was observed by SEM (Scanning Electron Microscopy). Secco etching was performed for the purpose of making clear a defect.

As shown in FIG. 57, crystal grow larger from the width-reduced region toward the wider region and are monocrystals.

As described above, according to the present embodiment, a laser of continuous-wave scans from the reduced-width region of the silicon layer toward the wider region so as to grow crystals, so that crystals can be taken over, and grain boundaries can be expelled outside the silicon layer. Thus, according to the present embodiment, silicon film having monocrystal silicon can be formed. It is not essential to change a width of the silicon layer, and the silicon layer may have a uniform width.

[A First Modification]

Figure 58:
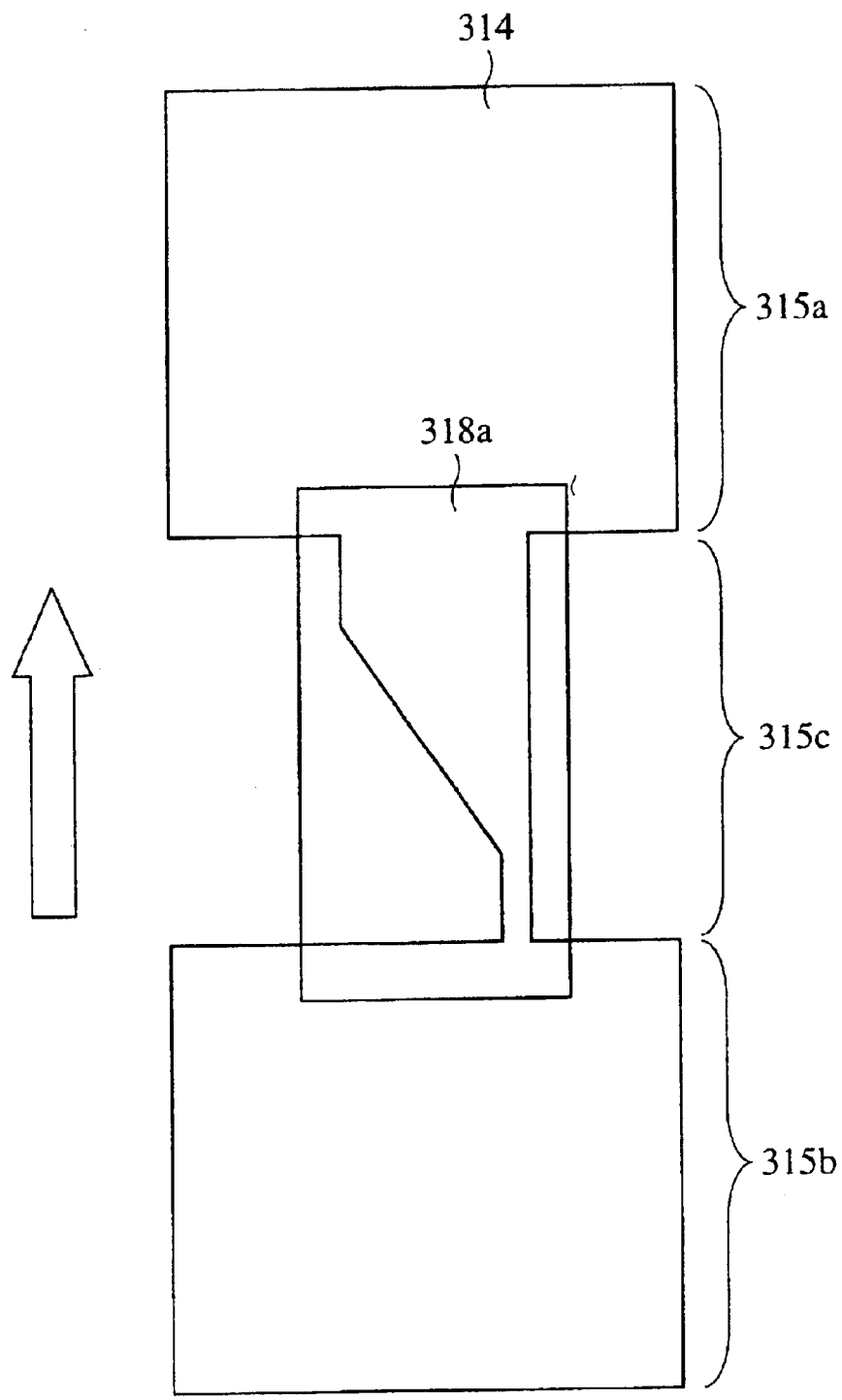
FIG. 58 is a plan view of the silicon thin film according to Modification 1 of the eleventh embodiment of the present invention, which shows the method for forming the same.

Then, a method for forming the silicon thin film according to a first modification of the present embodiment will be explained with reference to FIG. 58. FIG. 58 is a plan view of the silicon thin film according to the first modification, which explains the method for forming the same.

The method for forming the silicon thin film according to the present modification is characterized mainly in that the heat retaining film 318a is not formed on the entire surface but is formed to cover at least a region 315c.

When continuous-wave laser beams are applied, high calory is accumulated in the heat retaining layer 318a in comparison with that short pulsed laser beams are applied.

Accordingly, in a case that the heat retaining layer 318a is formed on the entire surface, a glass substrate 310 is kept at a high temperature for a long period of time, and there is a risk that the glass substrate 310 is deformed.

In the present modification, the heat retaining layer 318a is not formed on the entire surface but is formed covering at least the region 315c.

The heat retaining layer 318a is formed, covering at least the region 315c as in the present modification, whereby the silicon layer 314 in the region 315c can be heated to a high temperature and melted. The above-described crystal growth can be performed without remarkable problems.

Figure 59:
FIG. 59 is a microscopic picture of a crystal state of the silicon thin film formed by Modification 1 of the eleventh embodiment of the present invention.

Then, a crystal state of the silicon thin film formed by the present modification will be explained with reference to FIG. 59. FIG. 59 is a microscopic picture of a crystal state of the silicon thin film formed by the present embodiment.

As described above, even in the case that the heat retaining film 318a is formed covering at least the region 315c, crystals grow large from the width-reduced region toward the width-increased region as in the silicon film of the ninth embodiment shown in FIG. 57, and are monocrystals.

Thus, even in the case that the heat retaining layer 318a is formed, covering at least the region 315c, monocrystal silicon 314a can be formed.

Thus, according to the present modification, the deformation of the glass substrate can be prevented, and high-quality liquid crystal display devices can be provided.

[A Second Modification]

Figure 60:
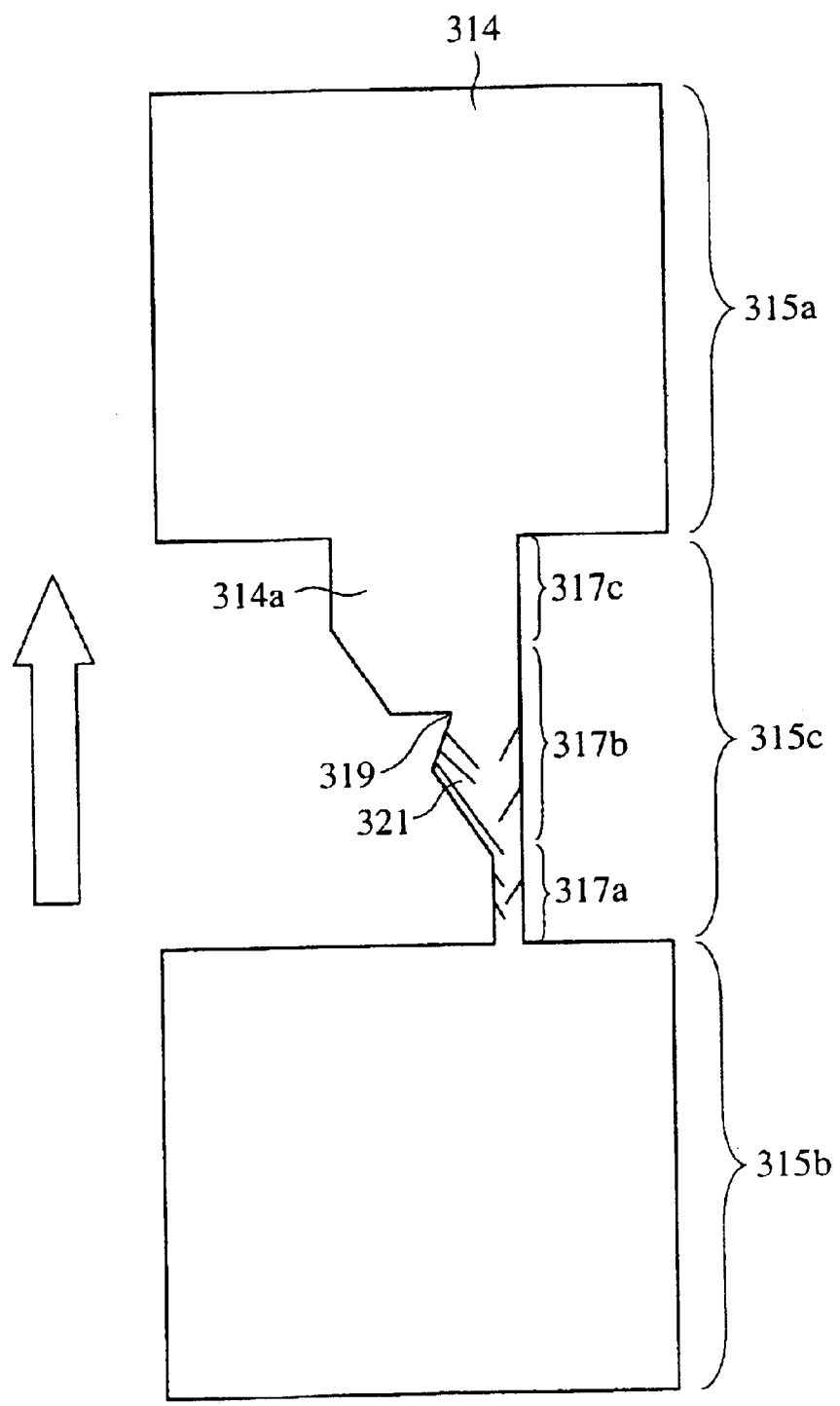
FIG. 60 is a conceptual view of the silicon thin film according to Modification 2 of the eleventh embodiment of the present invention, which shows the method for forming the silicon thin film.

Then, a method for forming a silicon thin film according to a second modification of the present embodiment will be explained with reference to FIG. 60. FIG. 60 is a plan view of the silicon thin film according to the present modification, which explains the method for forming the same.

The method for forming the silicon thin film according to the present modification is characterized mainly in that a necked part 319 is formed by a cut in a region 317b where a width of a silicon layer 314 gradually increased.

In the present modification, a width of the silicon layer 314 is partially decreased by the necked part 319, whereby grain boundaries 321 are blocked.

Resultantly, monocrystal silicon 314 can be formed without failure in the region which is upper of the necked part 319 as viewed in the drawing.

As described above, according to the present modification, the necked part is formed, and grain boundaries are blocked by the necked part, whereby monocrystal silicon 314a can formed without failure.

The thus-formed monocrystal silicon 314a is used as a channel, whereby a thin film transistor having high electron mobility can be provided.

[A Third Modification]

Figure 61:
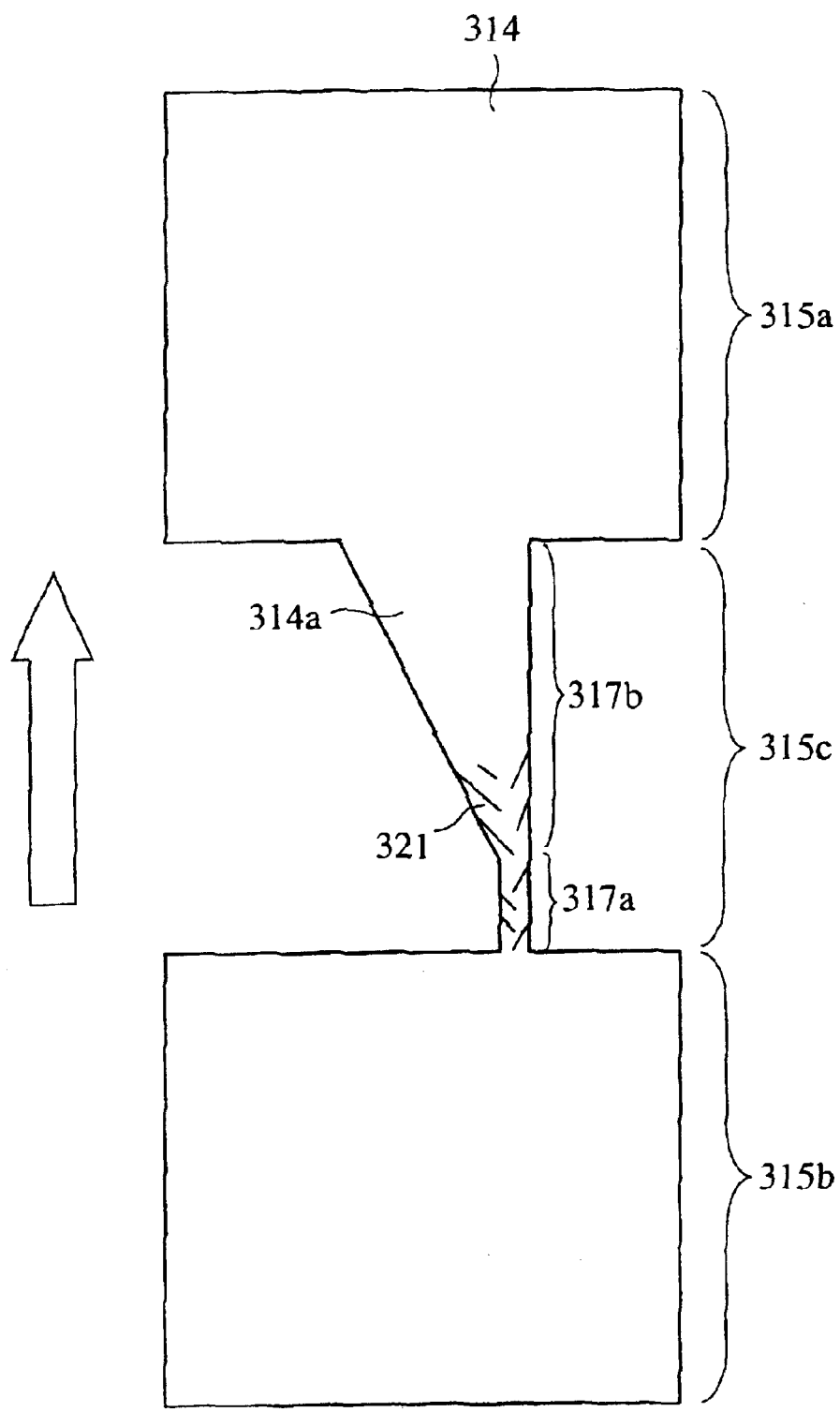
FIG. 61 is a conceptual view of the silicon thin film according to Modification 3 of the eleventh embodiment of the present invention, which shows the method for forming the silicon thin film.

Next, a method for forming a silicon thin film according to a third modification of the present embodiment will be explained with reference to FIG. 61. FIG. 61 is a conceptual view of the method for forming the silicon thin film according to the present modification.

The method for forming the silicon thin film according to the present modification is characterized mainly in that a silicon layer 314 gradually increases width in a region 315a from the middle part of the region 315a toward a region 315a to be a source/drain.

In the method for forming the silicon thin film according to the eleventh embodiment shown in FIG. 51, the region 317b in which a width of the silicon layer 314 gradually increases is the middle part alone of the region 315c. However, in the present modification, a width of the silicon layer 314 gradually increases in a wider region from the middle part of the region 315c to the region 315a.

As described above, even in a case that the silicon layer 314 is patterned, monocrystal silicon 314a can be formed.

A necked part 319 may be further formed.

[A Fourth Modification]

Figure 62:
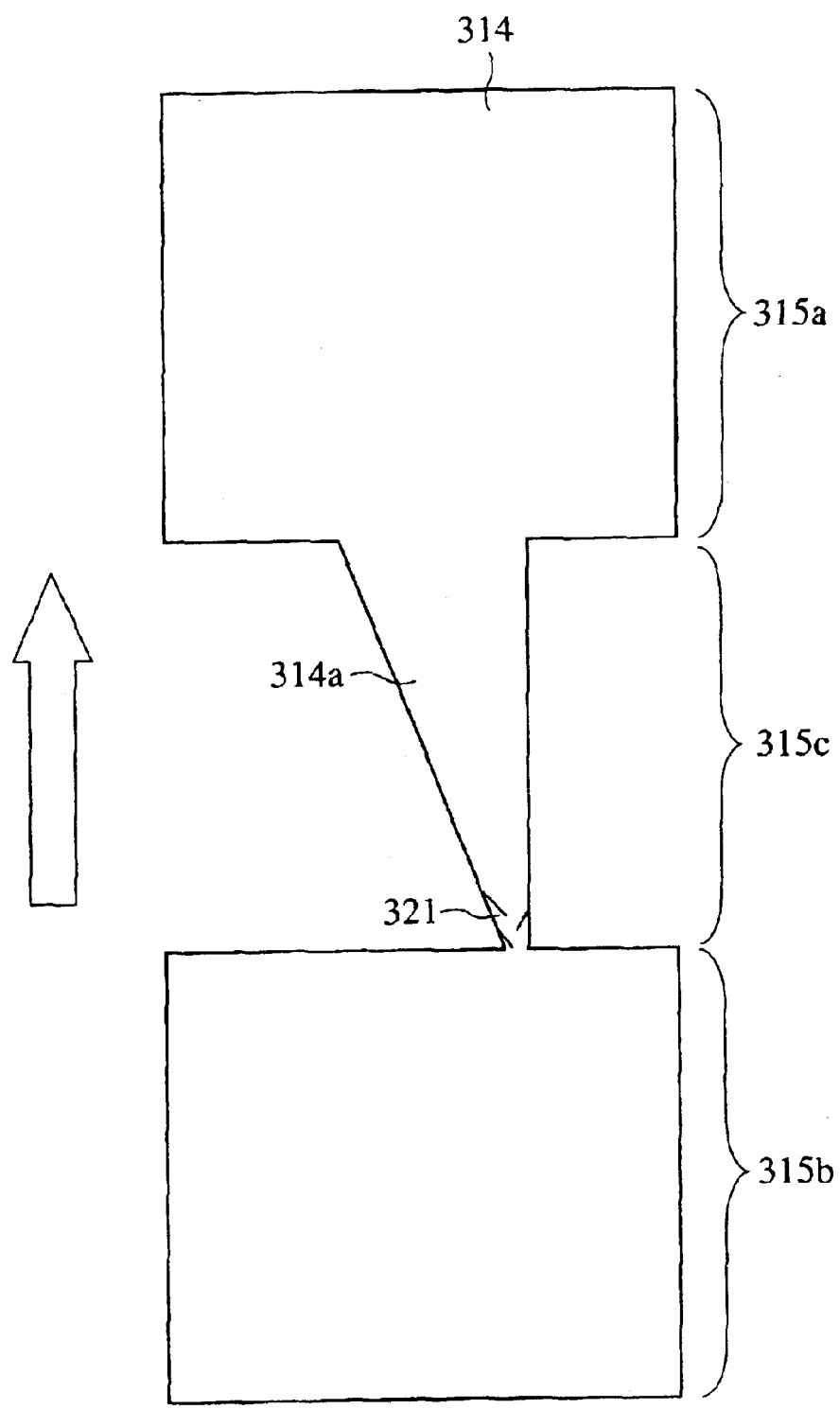
FIG. 62 is a conceptual view of the silicon thin film according to Modification 4 of the eleventh embodiment of the present invention, which shows the method for forming the silicon thin film.

Then, a method for forming a silicon thin film according to a fourth modification of the present embodiment will be explained with reference to FIG. 62. FIG. 62 is a conceptual view of the silicon thin film according to the present modification, which explains the method for forming the same.

The method for forming the silicon thin film according to the present modification is mainly characterized in that a width of a silicon layer 314 gradually increases in a region 315c from a region 315a to a region 315b.

In the method for forming the silicon thin film according to the eleventh embodiment shown in FIG. 51, the region 317b, where a width of the silicon layer 314 gradually increases, is the middle part alone of the region 315c. However, in the present modification, a width of the silicon layer 314 gradually increases in a wide region from the region 315b to the region 315a.

Even in the case that the silicon layer 314 is patterned as above, monocrystal silicon 314a can be formed.

[A Fifth Modification]

Figure 63:
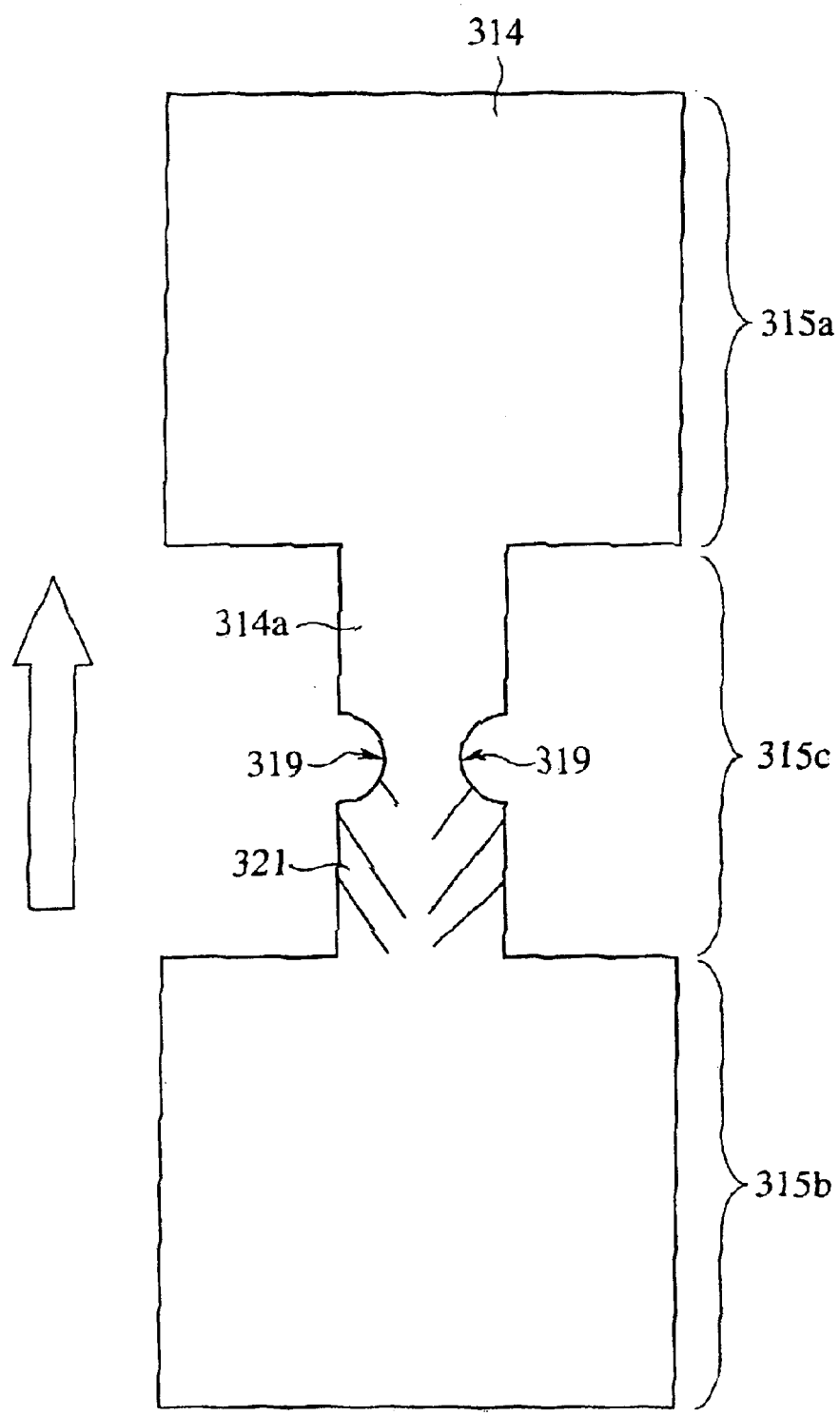
FIG. 63 is a conceptual view of the silicon thin film according to Modification 5 of the eleventh embodiment of the present invention, which shows the method for forming the silicon thin film.

Next, a method for forming a silicon thin film according a fifth modification of the present embodiment will be explained with reference to FIG. 63. FIG. 63 is a conceptual view of the silicon thin film according to the present modification, which explains the method for forming the same.

The method for forming the silicon thin film according to the present modification is characterized mainly in that a width of a silicon layer 314 is substantially uniform in a region 315c, and a necked part 319 is formed partially in the region 315c.

In the present modification, even when a width of the region 315c is substantially uniform, because of the necked part 319 formed in the silicon layer 314 in the region 315c, monocrystal silicon 314a is formed in the region which is upper of the necked part 319 as viewed in the drawing. As a laser is scanned in the direction indicated by the arrow in the drawing, grain boundaries are blocked by the necked part 319, and as the laser is further scanned, the monocrystal silicon 314a is formed in the region which is upper of the necked part 319 as viewed in the drawing.

Thus, in the present modification, even in a case that a width of the region 315c is made substantially uniform, the formation of the necked part 319 allows the monocrystal silicon 314a to be formed.

The thus-formed monocrystal silicon 314a is used as a channel, whereby a thin film transistor of high electron mobility can be provided.

Figure 64:
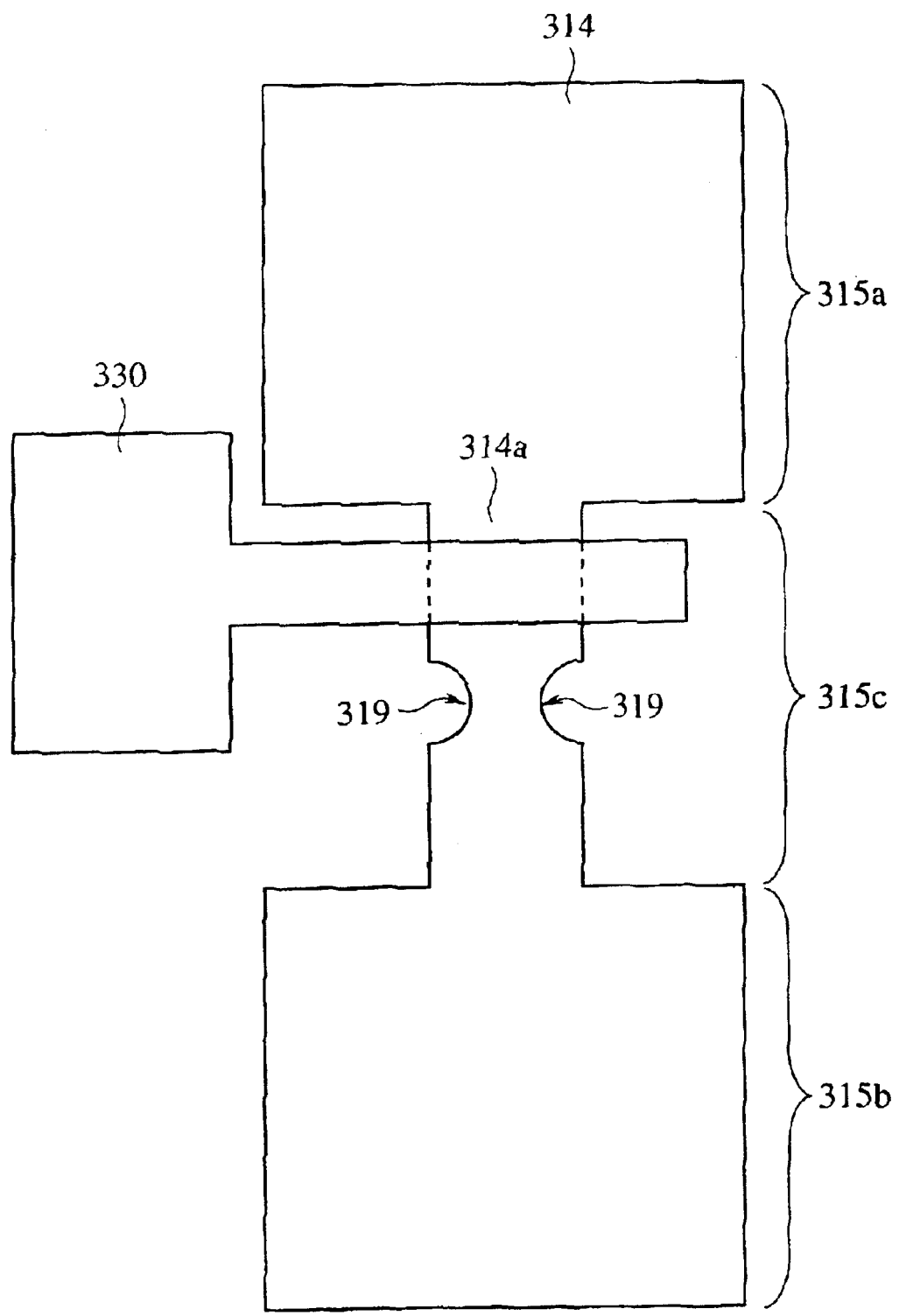
FIG. 64 is a plan view of positional relationships between a gate electrode and the silicon thin film formed by Modification 5 of the eleventh embodiment of the present invention.

FIG. 64 is a plan view showing positional relationships between a gate electrode and the silicon thin film formed in the present embodiment.

As shown in FIG. 64, a gate electrode 330 is formed on the monocrystal silicon 314a through a gate insulation film (not shown). The monocrystal silicon 314a is a channel, and a thin film transistor of high electron mobility can be provided.

When a laser is scanned downward as viewed in the drawing, the monocrystal silicon 314a is formed below the necked part 319 as viewed in the drawing. The gate electrode 330 is formed below the necked part 319 as viewed in the drawing.

[A Twelfth Embodiment]

A method for fabricating a thin film transistor according to a twelfth embodiment of the present invention will be explained with reference to FIGS. 65 to 68. FIGS. 65 to 68 are sectional views of the thin film transistor in the steps of the method for fabricating the same, which explain the method. The same members of the present embodiment as those of the ninth to the eleventh embodiments shown in FIGS. 27 to 64 are represented by the same reference numbers not to repeat or to simplify their explanation.

The method for fabricating a thin film transistor according to the present embodiment is characterized mainly in that the silicon thin film formed by the eleventh embodiment is used as the channel layer. The thin film transistor according to the present embodiment is exemplified by an n-type thin film transistor.

Figure 65A:
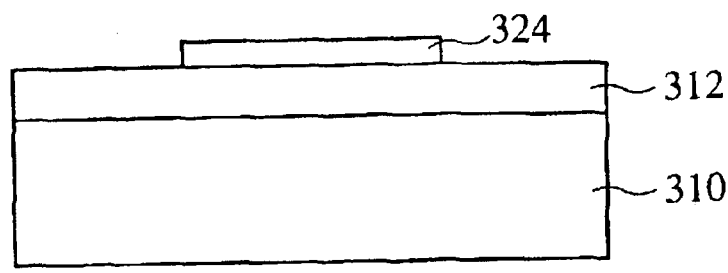
FIGS. 65A to 65C are sectional views of a thin film transistor according to a twelfth embodiment of the present invention in the steps of the method for fabricating the same, which show the method (Part 1).
Figure 65B:
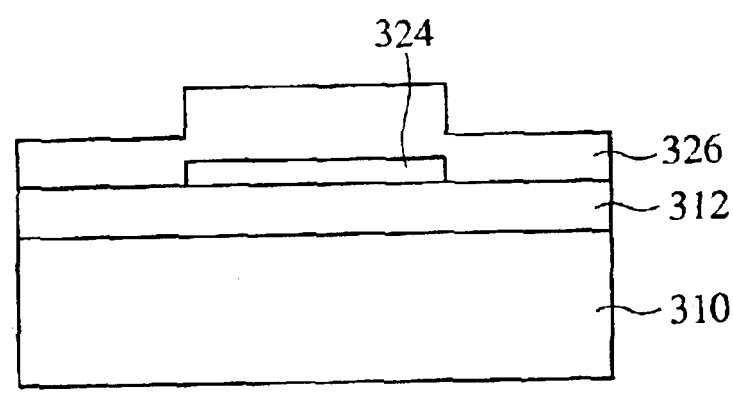

First, the silicon thin film formed by the eleventh embodiment is patterned in a required shape (see FIG. 65A). For example, a channel length is 2 μm, and a channel width is 2 μm. The right part of a semiconductor layer 324 as viewed in FIG. 65A corresponds to the region 315a in FIG. 51, and the left part of the semiconductor layer 324 as viewed in FIG. 65A correspond to the region 315b in FIG. 51. The middle part of the semiconductor layer 324 in FIG. 65A corresponds to the region 315c in FIG. 51.

Then, a gate oxide film 326 of a 120 nm-thickness silicon oxide film is formed on the entire surface by PECVD. The gate oxide film 326 may be formed by LPCVD, sputtering or others (see FIG. 65B).

Figure 65C:
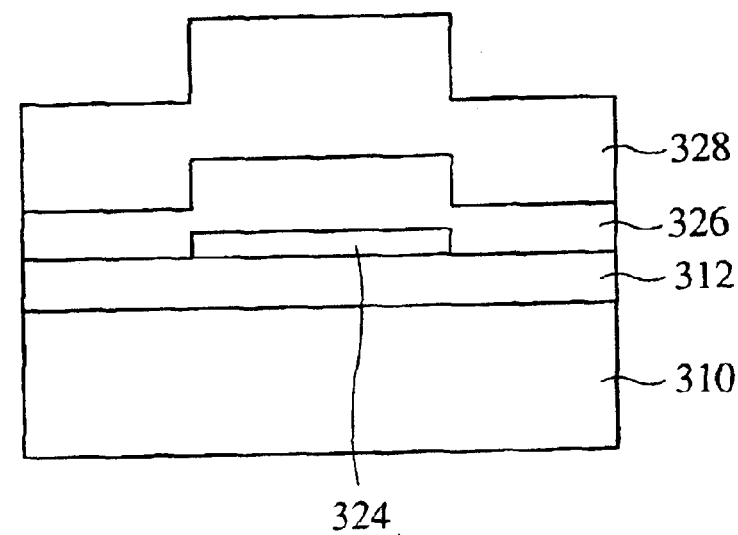

Then, a 300 nm-thickness aluminum layer 328 is formed on the entire surface by sputtering (see FIG. 65C).

Figure 66A:
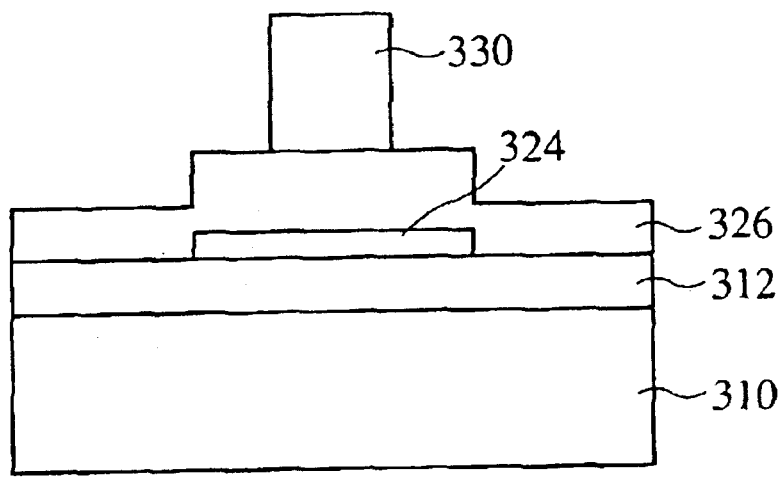
FIGS. 66A to 66C are sectional views of a thin film transistor according to a twelfth embodiment of the present invention in the steps of the method for fabricating the same, which show the method (Part 2).

Next, the aluminum layer 328 is patterned in a shape of the gate electrode 330 by photolithography (see FIG. 66A). The gate electrode 330 is formed on the monocrystal silicon 314a of the silicon thin film formed in the eleventh embodiment. Thus, the monocrystal silicon 314a can be used as the channel, whereby the thin film transistor can have high electron mobility.

Figure 66B:
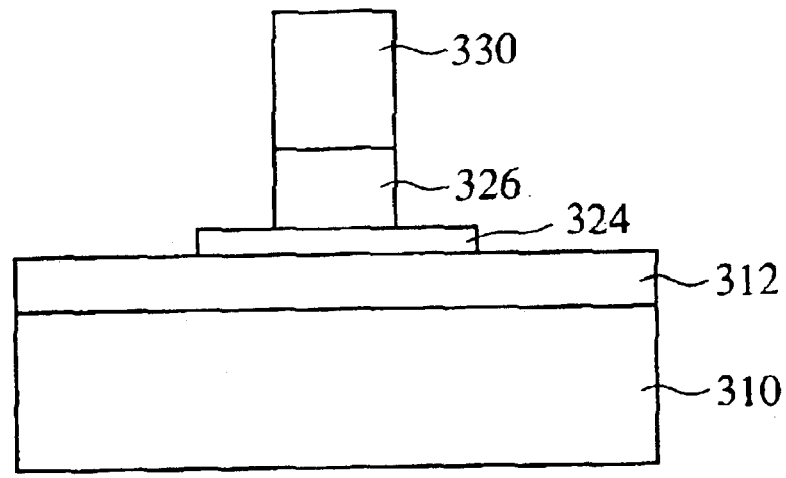
Figure 66C:
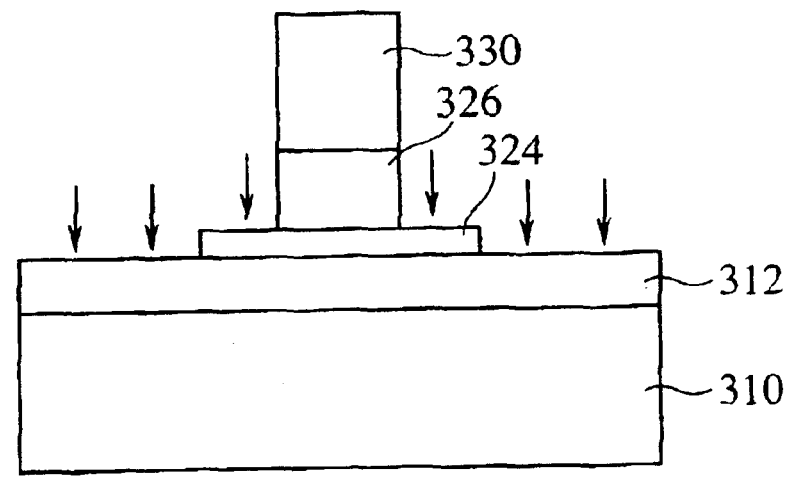

Next, the gate oxide film 326 is etched by self-alignment with the gate electrode 330 (see FIG. 66B).

Impurity ions are implanted in the semiconductor layer 324 by self-alignment with the gate electrode 330. The impurity can be, e.g., phosphorus.

Next, excimer lasers are applied through the glass substrate 310 to active the impurity implanted in the semiconductor layer 324. Thus, a source/drain diffused layer 332 is formed by self-alignment with the gate electrode 330 (see FIG. 67A).

Figure 67A:
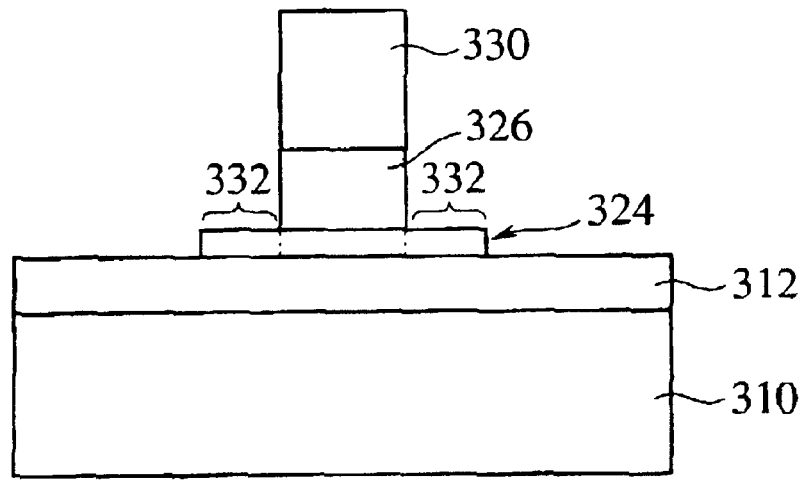
FIGS. 67A and 67B are sectional views of a thin film transistor according to a twelfth embodiment of the present invention in the steps of the method for fabricating the same, which show the method (Part 3).
Figure 67B:
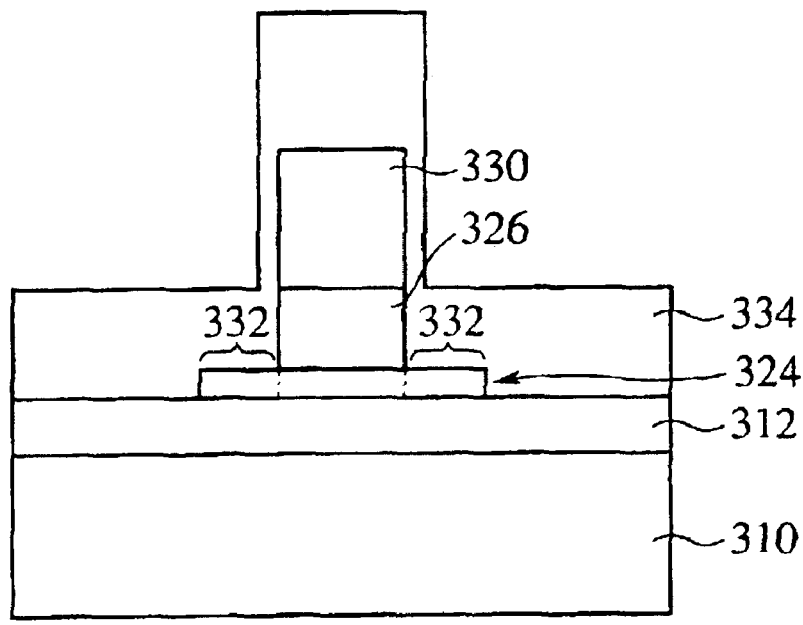

Then, an inter-layer insulation film 334 of a 300 nm-thickness SiN film is formed on the entire surface (see FIG. 67B).

Figure 68A:
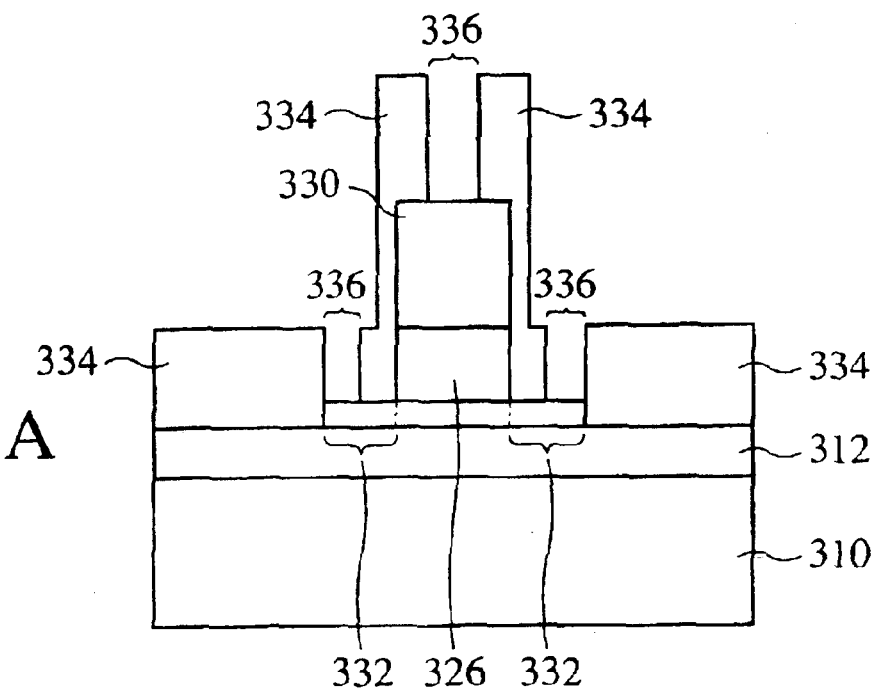
FIGS. 68A and 68B are sectional views of a thin film transistor according to a twelfth embodiment of the present invention in the steps of the method for fabricating the same, which show the method (Part 4).

Next, contact holes 336 which arrive respectively at the source/drain diffused layer 332 and at the gate electrode 330 are formed in the inter-layer insulation film 334 (see FIG. 68A).

Then, a conductor layer of a 100 nm-thickness Ti film, a 200 nm-thickness Al film and a 100 nm-thickness Ti film laid one on another is formed on the entire surface.

Figure 68B:
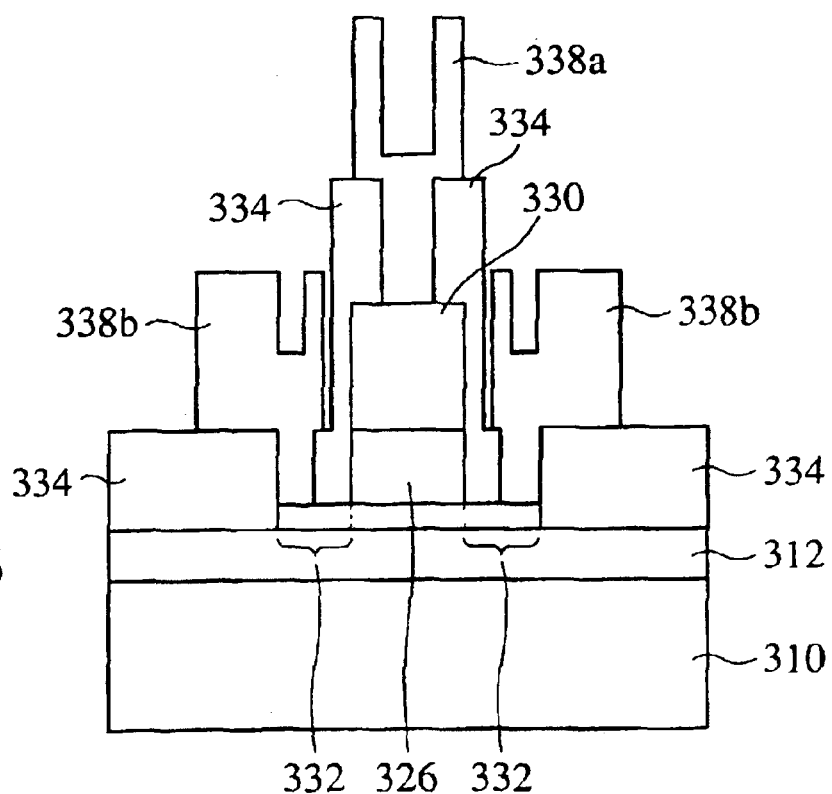

Then, the conductor layer is patterned by photolithography to form the gate electrode 338a and the source/drain electrode 338b are formed of the conductor layer (see FIG. 68B).

Thus, the thin film transistor according to the present embodiment is fabricated.

[Evaluation Result]

Next, electron mobility of the thus-fabricated thin film transistor was measured.

As a result, an electron mobility was as high as 350 cm$^2$/Vs.

As described above, according to the present embodiment, the monocrystal silicon is used as the channel, and the thin film transistor can have high electron mobility.

[Modifications]

The present invention is not limited to the above-described embodiment and can cover various modifications.

In the first embodiment a laser beam is applied in pulses while the high-temperature inert gas is being flowed, but a timing of applying a laser beam is not limited to that of the first embodiment. As long as a low solidification rate of a melted semiconductor thin film can be provided, it is possible that a laser beam is applied to in pulses, e.g., immediately after the flow of the high-temperature inert gas is finished. A low solidification rate of the semiconductor thin film can be obtained immediately after the flow of the high-temperature inert gas is finished, because the semiconductor thin film and its vicinity are kept at high temperature by the high-temperature inert gas, whereby the polycrystal thin film can have good quality.

In the first embodiment silicon thin film of an 70 nm-thickness is used, but a thickness of the silicon film thickness is not limited to 70 nm and may be set suitably in a range of, e.g., 30–100 nm.

In the first embodiment, the inert gas is heated to 600° C. and is flowed to a substrate, but a temperature of the inert gas is not limited to 600° C. and can be suitably set in a range of, e.g., 500° C.–3000° C., preferably in a range of 600° C.–2000° C.

In the first embodiment, a gas applied to the semiconductor thin film on the substrate is argon gas but is not limited to argon gas. A gas other than argon gas, e.g., nitrogen gas may be used as long as it does not deteriorate characteristics of the semiconductor thin film.

In the first embodiment, the silicon thin film formed on the substrate is amorphous silicon film but is not limited to amorphous silicon film. For example, silicon thin film, such as polycrystal silicon thin film, microcrystal or nanocrystal silicon thin film or others may be used.

In the first embodiment, it is preferable to suitably set a frequency for flowing the high-temperature inert gas in pulses, a frequency for applying a laser beam in pulses, a timing of flowing the inert gas and applying a laser beam, a period of time of flowing the high-temperature inert gas, a flow rate of the high-temperature inert gas, a kind of the high-temperature inert gas, a temperature of the high-temperature inert gas, a speed of moving the glass substrate on the X-Y stage, and a positional relationship between the port and a laser beam. These parameters are optimized to thereby form high-quality polycrystal silicon thin film.

In the first embodiment, the substrate is not heated, but the substrate is heated to thereby decrease solidification rate of the melted semiconductor thin film. The melted semiconductor thin film has further decreased solidification rate, whereby crystal grain diameter can be made larger.

In the first embodiment an area of the silicon thin film for a laser beam to be applied to is made large, whereby polycrystal silicon thin film can be formed more efficiently.

In the first embodiment, laser beams are used as an energy beam, but the energy beam is not limited to laser beams and can be, e.g., electron beams or others as long as the energy beams can melt the semiconductor thin film.

In the first embodiment, the substrate is provided by a glass substrate, but the substrate is not limited to a glass substrate and can be a transparent substrate, as of quartz, sapphire or others.

The first embodiment has been explained by means of an example of forming polycrystal silicon thin film, but the present invention is applicable to forming polycrystal germanium thin film or polycrystal silicon germanium alloy thin film. In this case, germanium thin film or silicon germanium alloy thin film is formed on a substrate in advance.

For example, in the second to the eighth embodiments, the heat reservoir layer covers the silicon layer, but the heat reservoir layer may be formed partially on the silicon layer.

In the eighth embodiment, a thin film transistor is fabricated, but polycrystal silicon thin films formed by the second to the seventh embodiments are applicable to any use.

A thin-film transistor fabricated by the eighth embodiment is applicable to any use, e.g., TFT-LCDs including integrated peripheral circuits, system-on-panels, system-on-glasses, etc.

In the second to the eighth embodiments, the short pulsed laser is provided by an excimer laser, but not only excimer lasers but also any short pulsed laser can be used.

In the second to the eighth embodiments, the silicon layer is an amorphous silicon layer, but not only amorphous silicon layer but also polycrystal silicon layer, micro-crystal silicon layer, etc., for example, may be used.

In the second to the eighth embodiments, the isolation film is provided by silicon oxide film, but not only silicon oxide film but also silicon nitride film, insulation film containing silicon, etc. may be used as long as they are not melted by laser beam application.

In the second to the eighth embodiments, the heat reservoir layer is unessentially provided by polycrystal silicon layer and may be any film as long as the film is heat-insulative.

In the second to the eighth embodiments, the heat reservoir layer is formed by PECVD, but PECVD is not essential. Any other CVD may be used. The heat reservoir layer may be formed by PVC (Physical Vapor Deposition).

In the second to the eighth embodiments, the heat reservoir layer is formed of polycrystal silicon layer formed by solid-phase growth using Ni. Metal catalysts other than Ni may be used. Other metal catalysts can be, e.g., Cu, Au, Pt, Pd, Al, etc., which are effective to crystallize amorphous silicon. A plurality of metal catalysts may be implanted in the heat reservoir layer. Group III dopants and group V dopants may be suitably implanted in the heat reservoir layer.

In the second to the eighth embodiments, the heat reservoir layer is provided by polycrystal silicon layer or others but may be provided by a metal.

In the second to the eighth embodiments, the isolation film is formed. However, the isolation film is not formed, and a first insulation layer which is not melted by short pulsed laser beams may be formed on the silicon layer. A second insulation layer may be formed on the first insulation layer. The second heat reservoir may be a silicon oxide film, silicon nitride film or others.

In the second to the eighth embodiments, the silicon layer is crystallized by applying laser beams on the side of the underside of the glass substrate, but the silicon layer may be crystallized by applying laser beams on the side of the upper surface of the glass substrate, i.e., from above the heat reservoir layer. In the case, it is preferable that the heat reservoir layer is not absorptive of laser beams.

In the second to the eighth embodiments, the silicon layer has 50 nm-thickness and 100 nm-thickness but is not limited to these thicknesses. The silicon layer may have a suitable thickness, e.g., a thickness of above 20 nm and below 300 nm.

In the sixth embodiment, the opening is formed partially in the heat reservoir layer on the silicon layer, but instead the heat reservoir layer may have a configuration suitable to form a silicon layer having required crystallization.

In the seventh embodiment, the silicon layer as shown in FIG. 21 is formed but may have any configuration. For example, the smaller-width region may have a suitable shape so that required crystals can be grown in the smaller-width region.

In the second to the eighth embodiments, the laser beam application is performed with the substrate set at the room temperature, 300° C. and 500° C., but the substrate may be heated to a temperature of a range in which the substrate is not deformed.

In the second to the eighth embodiments, preferably the glass substrate is provided by a glass substrate having a high deformation point. A glass substrate having a high deformation point of, e.g., about 600° C.–700° C. can be used.

In the second to the eighth embodiments, the glass substrate is used, but a substrate, such as quartz glass substrate or others, which is laser-beam permeable may be suitably used.

It is possible to set a thickness of the buffer layer suitably to form required crystals in the silicon layer.

In the second to the eighth embodiments, the buffer layer is provided by a silicon oxide film but is not limited to silicon oxide film. The buffer layer may be formed of, e.g., silicon nitride film or others.

A configuration of the silicon layer is not limited to the configurations of the second to the eighth embodiments. It is preferable that the silicon layer is suitably formed in a required configuration.

It is possible that a polycrystal silicon thin film is formed by crystalizing the silicon layer and is further patterned into a required configuration.

The semiconductor device explained in the above-described embodiments are applicable to peripheral circuit-incorporated type LCD's (Liquid Crystal Displays), systems on panels, systems on glass, and SOI (Silicon On Insulator) elements.

In the eleventh embodiment, the silicon layer 314 is formed of amorphous silicon. Amorphous silicon is not essential, and polycrystal silicon, for example, may be used.

In the eleventh embodiment, the impurity layer 320 is formed of Ni. However, Ni is not essential, and a metal impurity may be used in place of Ni.

In the eleventh embodiment, the heat retaining layer 318a is formed of polycrystal silicon by solid-phase growth of amorphous silicon using Ni. Such solid-phase growth is not essential, and the heat retaining layer may be formed of polycrystal silicon by gas-phase growth. The heat retaining layer 318a is not essentially formed of polycrystal silicon and may be formed of amorphous silicon. The heat retaining layer 318a may be formed of other materials.

In the eleventh embodiment, laser beams are applied from below the glass substrate. The laser beams may be applied from above the glass substrate. In the latter case, the heat retaining layer 318a above the silicon layer 314 can be removed by CMP or others. The heat retaining layer 318a above the silicon layer 314 may not be removed.

In the eleventh embodiment, the isolation film is silicon oxide film. The isolation film is not limited to silicon oxide film and may be, e.g., silicon nitride film or others.

In the eleventh embodiment, a width of the channel region is varied. However, it is not essential to vary a width of the channel region. A width of the channel region may be, e.g., uniform.

In the eleventh embodiment, the necked part is formed. However, the necked part is not essentially formed.

According to the present invention, a laser beam is applied in pulses while the high-temperature inert gas is flowed in pulses, whereby the melted semiconductor thin film can have a low solidification rate. Resultantly the polycrystal thin film having large grain diameters and having little defects in the crystal particles and little twins. Because the high-temperature inert gas is flowed in pulses, it never occurs that a temperature of the substrate is increased, deforming the substrate. Even in a case that the polycrystal thin film is formed on a substrate having a low heat-resistance temperature, the polycrystal thin film can have good quality. Even in a case that the polycrystal thin film is formed at a low temperature, the polycrystal thin film can have large crystal grains, and the polycrystal thin film can have high electron mobility.

According to the present invention, the heat insulation layer covering the silicon layer, the silicon layer after subjected to laser beam application can have low cooling speed, whereby a polycrystal silicon thin film having large grain diameters can be formed. Accordingly, a polycrystal silicon thin film having high electron mobility can be formed.

According to the present invention, short pulsed laser beams are applied on the side of the underside of the glass substrate, whereby a polycrystal silicon thin film can be formed by the simple processing.

According to the present invention, short pulsed laser beams are applied with the substrate heated, whereby the silicon layer after subjected to the short pulsed laser beam application can have low cooling speed. Accordingly, nuclei are formed inside the silicon layer, and crystals laterally grown toward the ends of the silicon layer, a polycrystal silicon thin film having silicon polycrystals having large grain diameters can be formed.

According to the present invention, a polycrystal silicon thin film having large grain diameters can be used as the channel layer, whereby a thin film transistor having high electron mobility can be provided.

According to the present invention, a thin film transistor having high electron mobility can be used, whereby a liquid crystal display device having good electric characteristics can be provided.

According to the present invention, an active semiconductor film is formed of a semiconductor film whose grain boundaries are ignorably influential, whereby thin film semiconductor devices of very high electron mobility can be realized.

According to the present invention, continuous-wave laser beams are scanned from the width-reduced region of the silicon layer toward the increased width region to grow crystals, whereby lateral growth of crystals can be taken over, and crystal defects can be expelled outside the silicon layer. Thus, according to the present invention, silicon thin film of monocrystal silicon can be formed, and semiconductor devices of high electron mobility can be provided by using this silicon thin film.

What is claimed is:

1. A semiconductor device including an active semiconductor film formed on an insulating substrate, at least a channel region of the active semiconductor film having a quasi-monocrystal state, which is a crystal state containing only grain boundaries having inclination angles of not more than 90° to a current direction, the active semiconductor film has a smaller width at the channel region that the rest part thereof.

2. A semiconductor device according to claim 1, wherein a source/drain region of the active semiconductorfilm includes one part formed of micro-diameter crystal grains and another part formed of circular large-diameter crystal grains, a radius L of the circular large-diameter crystal grain is larger than 250 nm, and the radius L is larger than W/4 when a width of the channel is represented by W.

3. A semiconductor device according to claim 1, wherein the channel region has a width-reduced part formed in.

* * * * *